United States Patent
Kumar et al.

(10) Patent No.: US 6,573,534 B1
(45) Date of Patent: Jun. 3, 2003

(54) SILICON CARBIDE SEMICONDUCTOR DEVICE

(75) Inventors: Rajesh Kumar, Kariya (JP); Tsuyoshi Yamamoto, Kariya (JP); Shoichi Onda, Toyokawa (JP); Mitsuhiro Kataoka, Kariya (JP); Kunihiko Hara, Aichi (JP); Eiichi Okuno, Gifu (JP); Jun Kojima, Oobu (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 09/265,582

(22) Filed: Mar. 10, 1999

Related U.S. Application Data

(63) Continuation-in-part of application No. 09/035,204, filed on Mar. 5, 1998, now abandoned, which is a continuation-in-part of application No. 08/938,805, filed on Sep. 26, 1997, now Pat. No. 6,020,600, which is a continuation of application No. 08/708,582, filed on Sep. 5, 1996, now abandoned.

(30) Foreign Application Priority Data

| Sep. 6, 1995 | (JP) | 7-229487 |
| Mar. 5, 1997 | (JP) | 9-50233 |
| Sep. 24, 1997 | (JP) | 9-259076 |
| Jan. 14, 1998 | (JP) | 10-6027 |
| Mar. 11, 1998 | (JP) | 10-060189 |
| Mar. 20, 1998 | (JP) | 10-072362 |
| Aug. 28, 1998 | (JP) | 10-243706 |

(51) Int. Cl.[7] .................... H01L 31/0312; H01L 29/76
(52) U.S. Cl. .................... 257/77; 257/76; 257/328; 257/329; 438/105; 438/212; 438/268; 438/931
(58) Field of Search .................... 257/76, 77, 328, 257/329, 339, 341, 342, 263, 264; 438/212, 222, 268, 269, 105, 931

(56) References Cited

U.S. PATENT DOCUMENTS 4,859,621 A   8/1989   Einthoven (List continued on next page.)

FOREIGN PATENT DOCUMENTS

EP    656661 A1    6/1995

(List continued on next page.)

OTHER PUBLICATIONS

Kimoto et al. "Two–dimensional nucleation and step dynamics in crystal growth of SiC" from Silicon Carbide and Related Materials, Inst. Phys. Conf. Ser. No. 137, Nov. 1–3, 1993, pp. 55–58.

(List continued on next page.)

*Primary Examiner*—Tom Thomas
*Assistant Examiner*—Donghee Kang
(74) *Attorney, Agent, or Firm*—Harness, Dickey & Pierce, PLC

(57) ABSTRACT

A semiconductor device, comprising: a semiconductor substrate comprising silicon carbide of a first conductivity type; a silicon carbide epitaxial layer of the first conductivity type; a first semiconductor region formed on the semiconductor substrate and comprising silicon carbide of a second conductivity type; a second semiconductor region formed on the first semiconductor region, comprising silicon carbide of the first conductivity type and separated from the semiconductor substrate of the first conductivity type by the first semiconductor region; a third semiconductor region formed on the semiconductor region, connected to the semiconductor substrate and the second semiconductor region, comprising silicon carbide of the first conductivity type, and of higher resistance than the semiconductor substrate; and a gate electrode formed on the third semiconductor region via an insulating layer; wherein the third semiconductor layer is depleted when no voltage is being applied to the gate electrode so that said semiconductor device has a normally OFF characteristic.

32 Claims, 44 Drawing Sheets

U.S. PATENT DOCUMENTS

| | | |
|---|---|---|
| 5,170,231 A | 12/1992 | Fujii |
| 5,233,215 A | 8/1993 | Baliga |
| 5,323,040 A | 6/1994 | Baliga |
| 5,389,799 A | 2/1995 | Uemoto |
| 5,396,085 A | 3/1995 | Baliga |
| 5,399,515 A | 3/1995 | Davis et al. |
| 5,451,797 A | 9/1995 | Davis |
| 5,459,107 A | 10/1995 | Palmour |
| 5,460,985 A | 10/1995 | Tokura |
| 5,506,421 A | 4/1996 | Palmour |
| 5,514,604 A | 5/1996 | Brown |
| 5,543,637 A | 8/1996 | Baliga |
| 5,574,295 A | 11/1996 | Kurtz et al. |
| 5,614,749 A | 3/1997 | Ueno |
| 5,629,531 A | 5/1997 | Palmour |
| 5,681,762 A | 10/1997 | Baliga |
| 5,723,376 A | 3/1998 | Takeuchi |
| 5,773,849 A | 6/1998 | Harris et al. |
| 5,776,837 A | 7/1998 | Palmour |
| 6,020,600 A * | 2/2000 | Miyajima et al. ............ 257/76 |

FOREIGN PATENT DOCUMENTS

| | | |
|---|---|---|
| EP | 657947 A1 | 6/1995 |
| EP | 657992 A1 | 6/1995 |
| EP | 676814 A2 | 10/1995 |
| JP | 55-121682 | 9/1980 |
| JP | 58-68979 | 4/1983 |
| JP | 60-258967 | 12/1985 |
| JP | 01192175 A | 8/1989 |
| JP | 02091976 A | 3/1990 |
| JP | 3-6060 | 3/1991 |
| JP | 4-239778 | 8/1992 |
| JP | 5-102497 | 4/1993 |
| JP | 5-259443 | 10/1993 |
| JP | 7-86199 | 3/1995 |
| JP | 7-131016 | 5/1995 |
| JP | 07131016 A | 5/1995 |
| WO | WO94/13017 | 6/1994 |

OTHER PUBLICATIONS

Electronic components and circuits, NASA Tech Briefs, Feb. 1995, pp. 30, 36.

Palmour et al, "Silicon Carbide Power Devices for Aerospace Applications" in Proceedings of the 28th Intersociety Energy Conversion Engineering Conference American Chemical Society, 1993, pp 1249–1254.

Suzuki et al, "Thermal Oxidation of SIC and Electrical Properties of AL–SiO2–SiC MOS Structure" Japanese Journal of Applied Physics, vol. 21, No. 4, Apr. 1982,pp. 579–585.

"Thermal Oxidation Characteristics of 6H–SIC and Field Effect Characteristics of Vertical SIO2/6H–SIC Interface" (Seminar an SIC and Related Wide Gap Semiconductors, Proceedings of 3rd Meeting) & "Relevancy with Present Invention" Applicant's Comments).

Patent Abstract of Japan, re JP–A 02–091976, Mar. 1990.

Jayant Baliga B, "Critical Nature of Oxide/Interface Quality for SIC Power Devices", Microelectronic engineering, vol. 28 No. 1/04 Jun. 1995 p. 182.

Electronic Components and Circuits, Power MOSFETS Formed in Silicon Carbide, Lewis Research Center, Cleveland, Ohio.

Jayant Baliga B, "The Accumulation–Mode Field–Effect Transistor: A new ultralow on–resistance MOSFET", IEEE Electron Device Letters, vol. 13, No. 8, Aug. 1992 pp 427–429.

M. Bhatnagar et al, "Comparison of 6H–SiC, 3C–SiC, and Si for Power Devices", IEEE Transactions on Electron Devices, vol. 40, No. 3, Mar. 1993 pp 645–655.

Tokura et al, Current–Voltage and Capacitance–Voltage Characteristics of Metal/Oxide/6H Silicon Carbide Structure, Jpn. J. Appl. Phys. vol. 34 Part 1, No. 10, Oct. 1995—pp 5567–5573.

Hingorani et al, "High–Power Electronics", Scientific American, Nov. 1993, pp 52–57.

S.C. Sun and James D. Plummer, "Electron Mobility in Inversion and Accumulation Layers on Thermally Oxidized Silicon Surfaces", IEEE Transactions on Electron Devices, vol. ED–27, No. 8, Aug. 1980.

Notice of Reasons For Rejection, Mailing No. 319997, Mailing Date, Oct. 01, 2002, Patent App. No. 7–229486, Dated, Sep. 20, 2002.

Notice of Reasons For Rejection, Mailing No. 319998, Mailing Date, Oct. 01, 2002, Patent App. No. 7–229485, Dated, Sep. 20, 2002.

* cited by examiner

SILICON CARBIDE SEMICONDUCTOR DEVICE

DESCRIPTION OF THE RELATED APPLICATIONS

This is a continuation-in-part application of U.S. Ser. No. 09/035,204, filed on Mar. 5, 1998, now abandoned, which is a continuation-in-part application of U.S. Ser. No. 08/938,805, filed on Sep. 26, 1997 now U.S. Pat. No. 6,020,600, which in turn is a continuation application of U.S. Ser. No. 08/708,582, filed on Sep. 5, 1996, which was abandoned.

BACKGROUND OF THE INVENTION

1. Field of the Invention

The present invention relates to a silicon carbide semiconductor device such as, for example, an insulated gate type field effect transistor and especially a high power vertical MOSFET.

2. Description of the Related Art

A wide variety of vertical MOS transistor and other devices are conventionally known which employ SiC. Examples include those described in Japanese Unexamined Patent Publication No. 4-23977, U.S. Pat. No. 5,323,040, and Shenoy et al., IEEE Electron Device letters, vol. 18, No.3, pp.93–95, March 1997. The vertical MOS transistors disclosed in these documents are designed with high quality materials for high breakdown voltage and low ON resistance compared to MOS transistors formed from silicon.

It is an object of the present invention to provide a SiC MOS transistor which makes full use of the characteristics of SiC in order to obtain even lower ON resistance and higher breakdown voltage than conventional SiC MOS transistors, and which is designed for greater ease of use.

SUMMARY OF THE INVENTION

The present invention which achieves the object stated above is a semiconductor device comprising:

a semiconductor substrate comprising silicon carbide of a first conductivity type and a silicon carbide epitaxial layer of the first conductivity type which is formed on the main side of the semiconductor substrate, a first semiconductor region formed on the main surface of the silicon carbide epitaxial layer and comprising silicon carbide of a second conductivity type, a second semiconductor region formed on the first semiconductor region, comprising silicon carbide of the first conductivity type and separated from the silicon carbide epitaxial layer of the first conductivity type by the first semiconductor region, a third semiconductor layer formed on the first semiconductor region, connected to the silicon carbide epitaxial layer and the second semiconductor region, comprising silicon carbide of the first conductivity type, and of higher resistance than the silicon carbide epitaxial layer or semiconductor substrate, and a gate electrode formed on the third semiconductor region with an insulating layer there between, wherein the third semiconductor layer is depleted when no voltage is being applied to the gate electrode so that said semiconductor device has normally OFF characteristic.

According to this construction, the third semiconductor layer (thin channel epi-layer) is depleted and exhibits a normally OFF characteristic when no voltage is applied to the gate electrode. At such times, the third semiconductor layer must have its depleted layer extending across the full width between the first semiconductor base region and the gate insulating film to exhibit a normally OFF characteristic, but it is not necessary for the depleted layer to extend completely across the entire length of the third semiconductor layer. In particular the depletion of the third semiconductor layer is not necessary where the third semiconductor layer extends to the second semiconductor source region or the region contacting the silicon carbide epitaxial layer of first conductivity type (drift region).

In the construction described above, when a voltage is applied to the gate electrode to form an electric field on the gate insulating layer, an accumulation-type channel is induced on the third semiconductor layer (thin channel epi-layer), and the carrier flows between the source electrode and drain electrode (i.e., an ON state is achieved).

This design can address the low channel mobility problem of conventional inversion mode SiC power transistor, since the device operates in an accumulation mode. It was demonstrated in Si electronic devices that, the accumulation layer channel mobility is much higher than the inversion layer channel mobility (See for example, S. C. Sun et al., IEEE. Trans. Electron Device, Vol.ED-27, pp.1497, 1980). The same can be applied to MOS based SiC power devices. A large reduction in the ON resistance can also be expected for accumulation mode SiC power devices.

The normally OFF characteristic of the third semiconductor layer is achieved by mutually connecting the depleted layer which extends between the gate electrode and the third semiconductor layer, and the depleted layer between the second semiconductor layer and the third semiconductor layer. Thus, according to the silicon carbide semiconductor device of the present invention, the impurity concentration and thickness of the third semiconductor layer, and the second semiconductor region and gate electrode allow total depletion of the third semiconductor layer even when no voltage is being applied to the gate electrode, thus allowing a normally OFF characteristic to be achieved so that it can be used like a conventional normally OFF device.

Furthermore, according to the semiconductor device of the invention, the impurity concentration of the first semiconductor base region and the impurity concentration of the third semiconductor layer in which the channel is formed are independently controlled, to give a silicon carbide semiconductor device with high breakdown voltage, low current loss and a low threshold voltage. That is, the impurity concentration of the first semiconductor region may be increased, so that while maintaining a high breakdown voltage between the source and drain, the depth of the first semiconductor base region can be shorten to reduce the junction field effect (JFET-effect). In addition, since the impurity concentration of the channel may be decreased to reduce the effect of impurity scattering during flow of the carrier, the channel mobility may be thereby increased. As a result it is possible to obtain a silicon carbide semiconductor device with high breakdown voltage and low current losses.

The silicon carbide semiconductor device of the present invention is a planar vertical field effect transistor, but it may also be applied to planar or trench-type transistors.

A planar-type semiconductor device according to the invention comprises the following:

a semiconductor substrate of a first conductivity type comprising single crystal silicon carbide and a silicon carbide epitaxial layer of the first conductivity type which is formed on the main side of the semiconductor substrate and has a lower dopant concentration than the semiconductor substrate, a first semiconductor base region of a second conductivity type formed on a predetermined region of the silicon carbide epitaxial layer to a predetermined depth, a second semiconductor source region of the first conductivity type formed on a predetermined region of the base region and having a shallower depth than the base region, a third semiconductor surface channel layer of the first conductivity-type made of silicon carbide, and situated so as to connect the source region and the silicon carbide epitaxial layer of the first conductivity type and the second semiconductor base region, a gate insulating layer formed on the surface of the surface channel layer, a gate electrode formed on the surface of the channel layer, a source electrode formed in contact with the base region and source region, and a drain electrode formed on the back side of the semiconductor substrate.

The following are preferred embodiments of the planar-type semiconductor device.

(1) The main surface of the silicon carbide semiconductor substrate is (0001) Si face, (000$\bar{1}$) C-face, (11$\bar{2}$0) a-face or (1$\bar{1}$00) prism-face. The (0001) Si face or (11$\bar{2}$0) a-face is preferred for the low interface surface state of the silicon carbide/insulator interface.

(2) The dopant concentration of the surface channel layer is no greater than the dopant concentrations of the silicon carbide epitaxial layer and the base region.

(3) The gate electrode has a first work function potential, the base region has a second work function potential, the surface channel layer has a third workfunction potential, and the first, second and third workfunction potentials are set so that the carrier of the first conductivity type is depleted in the surface channel layer.

(4) The first, second and third work function potentials are set so that the carrier of the first conductivity type is depleted in the surface channel layer when the gate electrode is at zero potential with respect to the drain region.

(5) The surface channel layer is formed by epitaxial growth or ion implantation.

(6) The surface channel layer is formed by epitaxial growth, and the crystal system/polymorph of the silicon carbide constituting the semiconductor substrate, silicon carbide epitaxial layer, base region and source region is different from that of the silicon carbide of the surface channel layer. For example, the silicon carbide constituting the semiconductor substrate, silicon carbide epitaxial layer, base region and source region is a hexagonal system, while the silicon carbide of the surface channel layer is a cubic system.

(7) The surface channel layer is formed by epitaxial growth, and the silicon carbide constituting the semiconductor substrate, silicon carbide epitaxial layer, base region and source region is 6H-SiC while the silicon carbide of the surface channel layer is 3C-SiC. By using a surface channel layer formed by epitaxial growth where the silicon carbide crystal system/polymorph differs from that of the base as in (5) and (6), it is possible to realize a device with high characteristics and high reliability.

(8) A portion of the first semiconductor base region is made thicker. This allows breakdown to occur more readily.

(9) In the silicon carbide semiconductor device according to (8) above, the impurity concentration of the thickened section of the first semiconductor base region is made higher than the impurity concentration of the thinner sections. This further facilitates breakdown.

(10) In the silicon carbide semiconductor device according to (8) above, the thickened section of the base region may be formed under the source region. This allows common use of the deep base region forming mask and the source region forming mask for production.

(11) A silicon carbide epitaxial layer of a first conductivity type having a lower dopant concentration than the semiconductor substrate is formed on the main surface of the semiconductor substrate of the first conductivity type which is made of single crystal silicon carbide, and a first base region of a second conductivity type having a predetermined depth is formed on a predetermined region of the surface section of the silicon carbide epitaxial layer. In addition, a surface channel layer of the first conductivity type and made of silicon carbide is situated on the silicon carbide epitaxial layer, a second base region of the second conductivity type and with a greater depth than the first base region is formed on a predetermined region with in the first base region, and then the second base region forming mask is used to form a source region of the first conductivity type which has a shallower depth than the first base region, on a predetermined region of the surface section of the first base. Afterwards, a gate electrode is formed on the surface of the surface channel layer with a gate insulating film there between, while a source electrode is formed contacting the base region and source region. Thus, it is possible to form the source region using the second base region forming mask, to allow use of the mask for both purposes.

(12) In the silicon carbide semiconductor device according to (8) above, the thickened section of the base region is formed at a location not overlapping the source region. This helps to prevent the breakdown.

(13) The surface channel layer may be overlapping a portion of the second semiconductor source region. This allows widening of the contact area from the second semiconductor source region to the surface channel layer.

(14) The third semiconductor region has a concentration distribution of said second conductivity-type impurity which is lower at the top surface of said third semiconductor region close to said gate electrode than inside of said third semiconductor region.

(15) In the silicon carbide semiconductor device according to (14), the concentration of said second conductivity-type impurity in said third semiconductor region gradually decreases in the depth direction toward said top surface.

(16) In the silicon carbide semiconductor device according to (15), the second conductivity-type impurity is boron.

(17) In the silicon carbide semiconductor device according to (16), the third semiconductor region is a surface channel layer where a first conductivity-type impurity is ion implanted.

(18) The base region has a recess in a portion of the top surface thereof and has a portion deeper than the other portion thereof which portion resides below said recess and extends closer to said semiconductor substrate.

(19) In the silicon carbide semiconductor device according to (18), the recess is formed in contact with said source region and penetrating said source region.

(20) In the planar-type semiconductor device, the section of the surface channel layer which is situated on the surface section of the silicon carbide epitaxial layer may be made with lower resistance than the silicon carbide epitaxial layer to allow still further reduction in the ON resistance of the MOSFET in accumulation mode. The ON resistance of the MOSFET is determined by the contact resistance between the source electrode and source region, the internal resistance of the source region, the accumulation channel resistance in the channel region formed on the surface channel layer, the internal resistance of the accumulation drift resistance of surface channel layer, the JFET resistance of the JFET section, the internal resistance of the epitaxial layer, the internal resistance of the semiconductor substrate, and the contact resistance between the semiconductor substrate and the drain electrode, their sum constituting the ON resistance.

Consequently, by making the impurity concentration of the section of the surface channel layer situated on the surface section of the epitaxial layer to be higher than that of the epitaxial layer, it is possible to lower the resistance of the sections of the surface channel layer other than the channel region (accumulation-drift resistance of channel layer), thus lowering the ON resistance of the MOSFET. This allows an even lower ON resistance to be achieved for the MOSFET.

For example, if the surface channel layer is formed by ion implantation and ion implantation is also carried out in the sections of the surface channel layer other than the channel region, then the impurity concentration of the section of the surface channel layer situated on the surface section of the epitaxial layer may be increased above the impurity concentration of the epitaxial layer, simultaneously with formation of the surface channel layer. This allows simplification of the production process for the silicon carbide semiconductor device.

DETAILED DESCRIPTION OF THE PREFERRED EMBODIMENTS (First Embodiment of the Invention)

Embodiments of the invention will now be explained with reference to the drawings.

Figure 1:
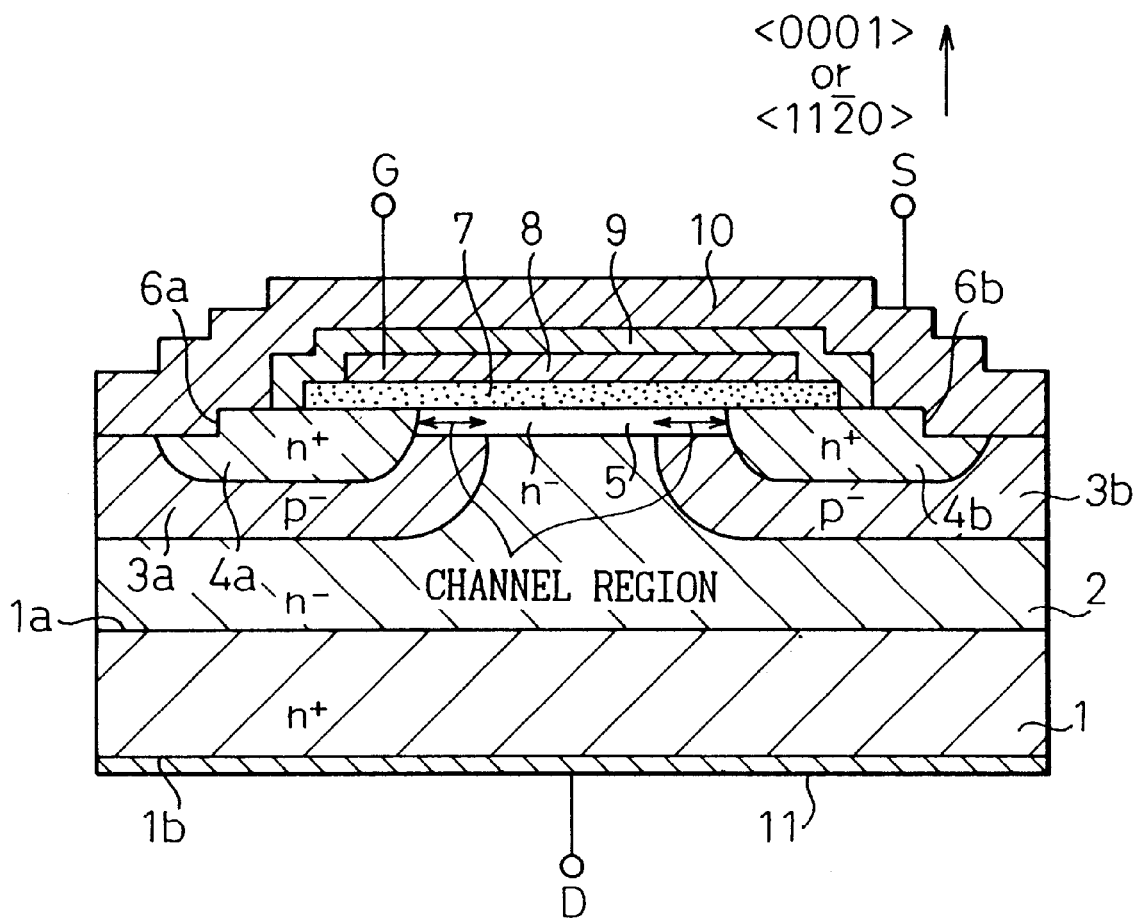
FIG. 1 is a cross-sectional schematic view of a power planar-type MOSFET according to a first embodiment of the invention.

FIG. 1 is a cross-sectional view of an n-channel type planar vertical power MOSFET according to this embodiment. This device may be suitably applied as an inverter or an alternator for a vehicle.

The $n^+$ type silicon carbide semiconductor substrate 1 used is hexagonal silicon carbide. The $n^+$ type silicon carbide semiconductor substrate 1 may be cubic crystals. Also, the $n^+$ type silicon carbide semiconductor substrate 1 has the top side as the main side 1a and the bottom side opposite the main side as the back side 1b. On the main side 1a of the $n^+$ type silicon carbide semiconductor substrate 1 there is laminated an $n^-$ type silicon carbide epitaxial layer (hereunder, "$n^-$ type silicon carbide epi-layer") 2 having a lower dopant concentration than the substrate 1.

Here, the top side of the $n^+$ type silicon carbide semiconductor substrate 1 and the $n^-$ type semiconductor epi-layer is the (0001) Si face or (000$\bar{1}$) C face. Alternatively, the top side of the $n^+$ type silicon carbide semiconductor substrate 1 and the $n^-$ type semiconductor epi-layer may be the (11$\bar{2}$0) a face or (1$\bar{1}$00) prism plane. Specifically, a low interface state density of silicon carbide/insulator can be obtained if the (0001) Si and (1$\bar{2}$00) a face are used.

On predetermined regions of the surface section of the $n^-$ type silicon carbide epi-layer there are separately formed a $p^-$ type silicon carbide base region 3a and a $p^-$ type silicon carbide base region 3b, to a predetermined depth. Also, on a predetermined region of the surface section of the p type silicon carbide base region 3a there is formed an $n^+$ type source region 4a which is shallower than the base region 3a, and on a predetermined region of the surface section of the $p^-$ type silicon carbide base region 3b there is formed an $n^+$ type source region 4b which is shallower than the base region 3b. In addition, an n type SiC layer 5 is provided on the $n^-$ type silicon carbide epi-layer 2 between the $n^+$ source region 4a and the $n^+$ type source region 4b and on surface sections of the $p^-$ type silicon carbide base regions 3a, 3b. That is, the $n^-$ type SiC layer 5 is situated so as to connect the source regions 4a, 4b on the surface sections of the base regions 3a, 3b, and the $n^-$ type silicon carbide epi-layer 2. This $n^-$ type SiC layer 5 is formed by epitaxial growth, and the crystals of the epitaxial film are 4H, 6H or 3C. The epitaxial layer can form different types of crystals irrelevant of the underlying substrate if the different epitaxial growth conditions are used. During operation of the device it functions as a channel forming layer on the device surface. The $n^-$ type SiC layer 5 will hereunder be referred to as the surface channel epi-layer.

Here, the dopant concentration of the surface channel epi-layer 5 is a low concentration of about $1.0E14$ cm$^{-3}$ to $1.0E16$ cm$^{-3}$, which is lower than the dopant concentration of the $n^-$ type silicon carbide epi-layer 2 and $p^-$ type silicon carbide base regions 3a, 3b. This allows low ON resistance to be achieved.

In addition, grooves 6a, 6b are formed on the surface of the $p^-$ type silicon carbide base regions 3a, 3b and $n^+$ type source regions 4a, 4b.

A gate insulating film (silicon oxide film) 7 is formed on the top of the surface channel epi-layer 5 and the $n^+$ type source regions 4a, 4b. Also, a poly silicon gate electrode 8 is formed on the gate insulating film 7. The poly silicon gate electrode 8 is covered by an insulating film 9. An oxide film is used as the insulating film 9. A source electrode 10 is formed there over, and the source electrode 10 contacts with the $n^+$ type source regions 4a, 4b and $p^-$ type silicon carbide base regions 3a, 3b. Also, a drain silicon carbide layer 11 is formed on the back side 1b of the $n^+$ type silicon carbide semiconductor substrate 1.

A production process for a power planar-type MOSFET is illustrated in FIGS. 2–9.

Figure 2:
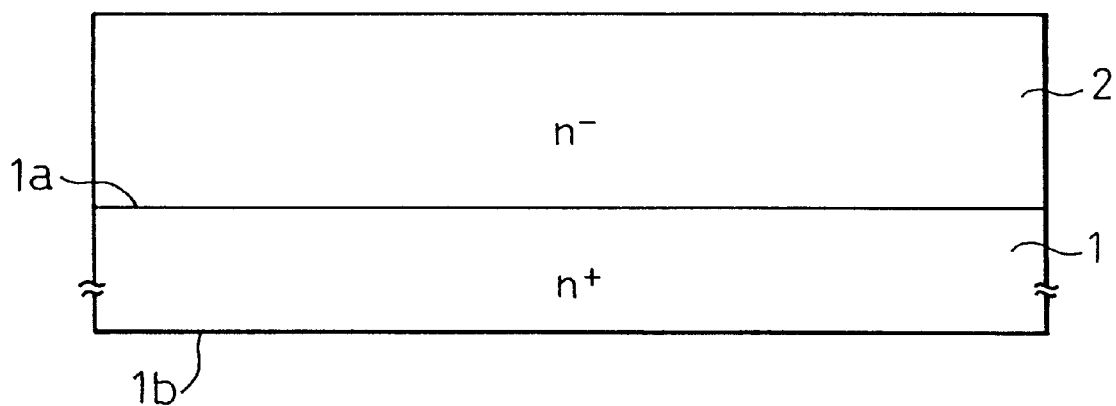
FIGS. 2 to 9 are cross-sectional views illustrating a production process for a power planar-type MOSFET.

First, as shown in FIG. 2, an n-type 4H, 6H or 3C-SiC substrate, i.e. an $n^+$ type silicon carbide semiconductor substrate, is prepared. Here, the thickness of the $n^+$ type silicon carbide semiconductor substrate is 400 micron, and the main surface 1a is the (0001) Si face, (000$\bar{1}$) C face, (11$\bar{2}$0) a face or (1$\bar{1}$00) prism plane. An $n^-$ type silicon carbide epi-layer 2 is epitaxially grown to a thickness of 5–10 micron on the main surface 1a of the substrate 1. In this embodiment, the $n^-$ type silicon carbide epi-layer 2 gives the same crystals as the underlying substrate (1), for an n type 4H, 6H or 3C-SiC layer.

Figure 3:
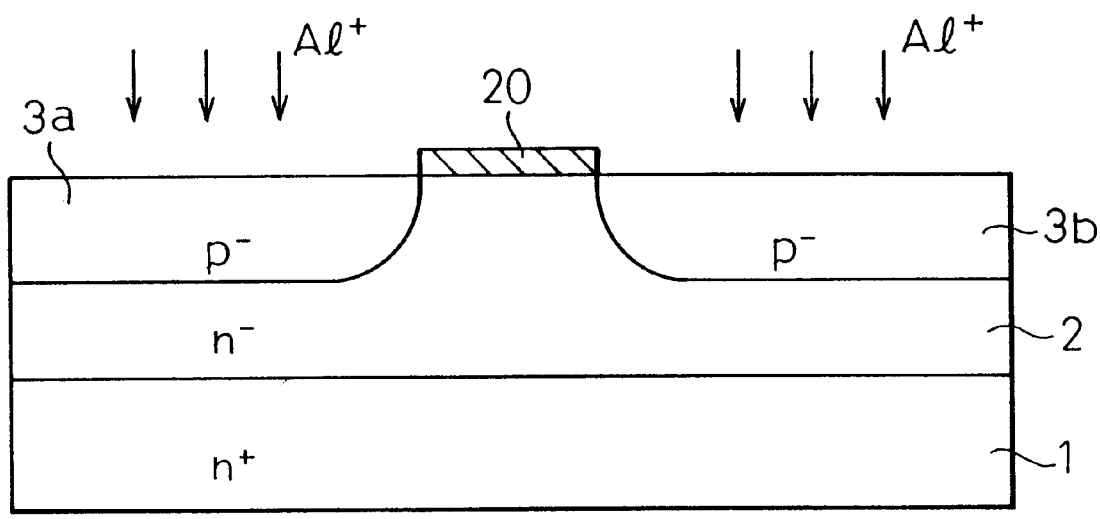

Also, as shown in FIG. 3, an insulating film 20 is situated on a predetermined region of the $n^-$ type silicon carbide epi-layer 2, and this is used as the mask for ion implantation of group IIIA impurities i.e., B+ (Boron ions), Al+ (Aluminum ions) or Ga+ (Gallium ions) to form the $p^-$ type silicon carbide base regions 3a, 3b. The ion implantation conditions are a temperature of 700° C. and a dose of 1E14 cm$^{-2}$.

Figure 4:
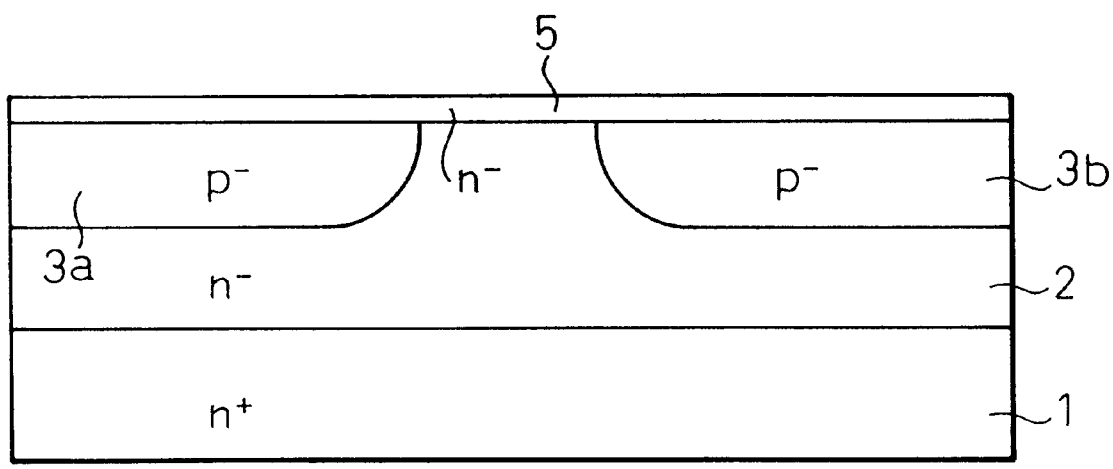

After removal of the insulating film 20, as shown in FIG. 4, an $n^-$ type surface channel epi-layer 5 is epitaxially grown on the $n^-$ type silicon carbide epi-layer 2. As the growing conditions here, SiH$_4$, C$_3$H$_8$ and H$_2$ are used as the sources gases, and the growing temperature is 1600° C.

Figure 5:
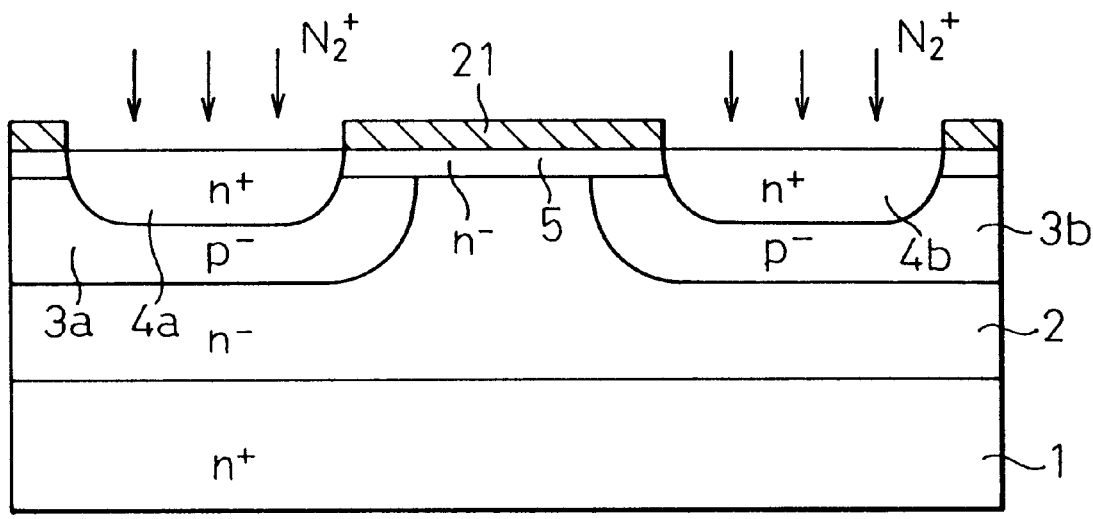

Next, as shown in FIG. 5, an insulating film is situated on a predetermined region of the surface channel epi-layer 5, and this is used as the mask for ion implantation of N+ (Nitrogen ions) to form $n^+$ type source regions 4a, 4b. The ion implantation conditions are a temperature of 700° C. and a dose of 1E15 cm$^{-2}$.

Figure 6:
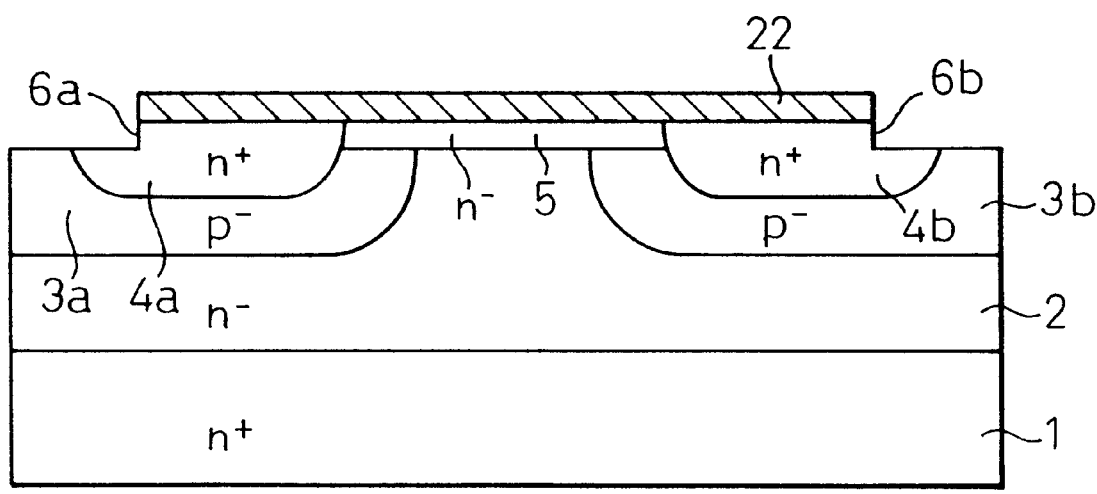

Also, after removal of the insulating film 21, as shown in FIG. 6, the photo resist method is used to place an insulating film 22 on a predetermined region of the surface channel epi-layer 5, and this is used as a mask for etching of a portion of the $n^+$ type source regions 4a, 4b and the $p^-$ type silicon carbide base regions 3a, 3b by RIE to form grooves 6a, 6b. The RIE source gases used here are CF$_4$ and O$_2$.

Figure 7:
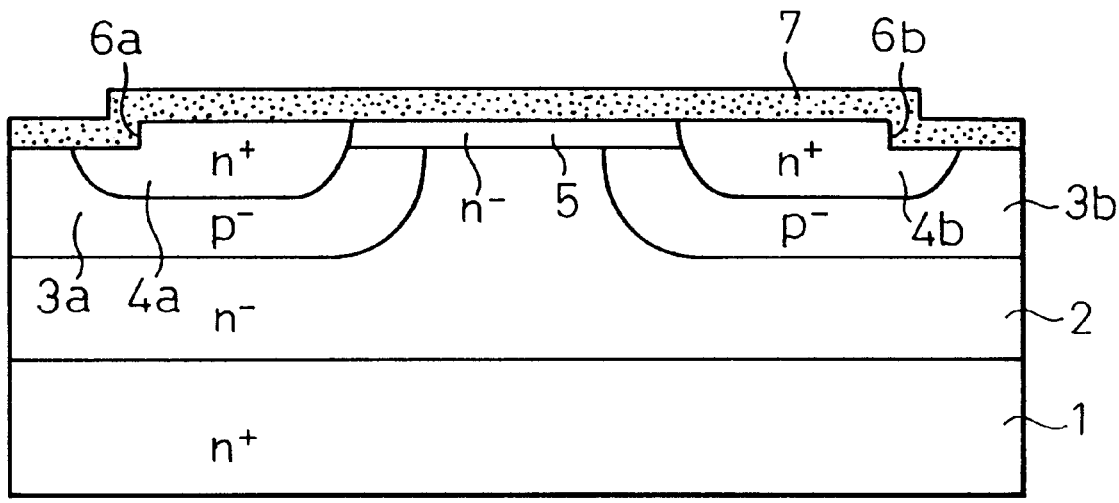

After subsequent removal of the insulating film 22, as shown in FIG. 7, a gate insulating film (gate oxide film) 7 is formed by wet oxidation on the substrate. Here, the atmosphere temperature is 1080° C.

Figure 8:
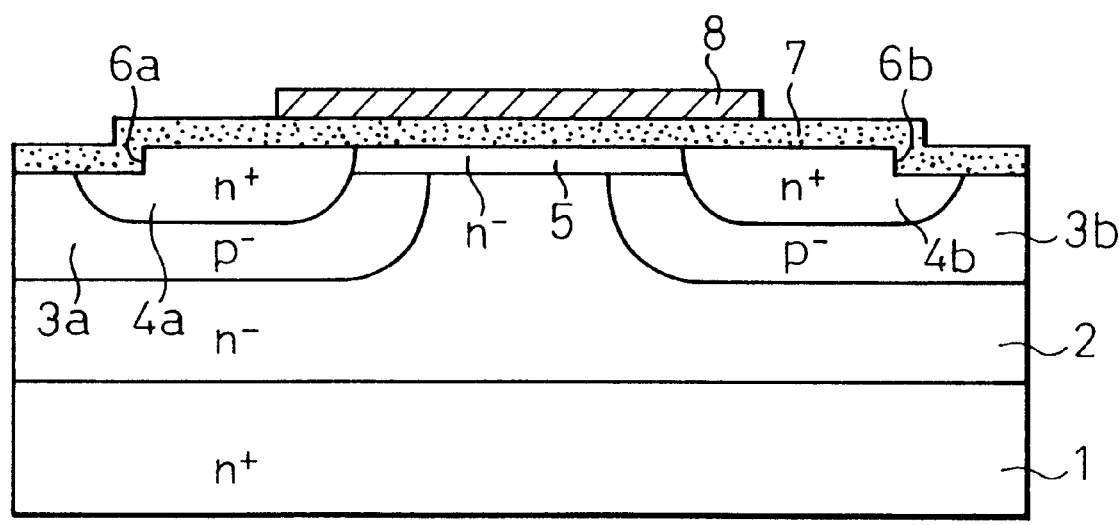

Then, as shown in FIG. 8, a poly silicon gate electrode 8 is deposited on the gate insulating film 7 by LPCVD. The film forming temperature here is 600° C.

Figure 9:
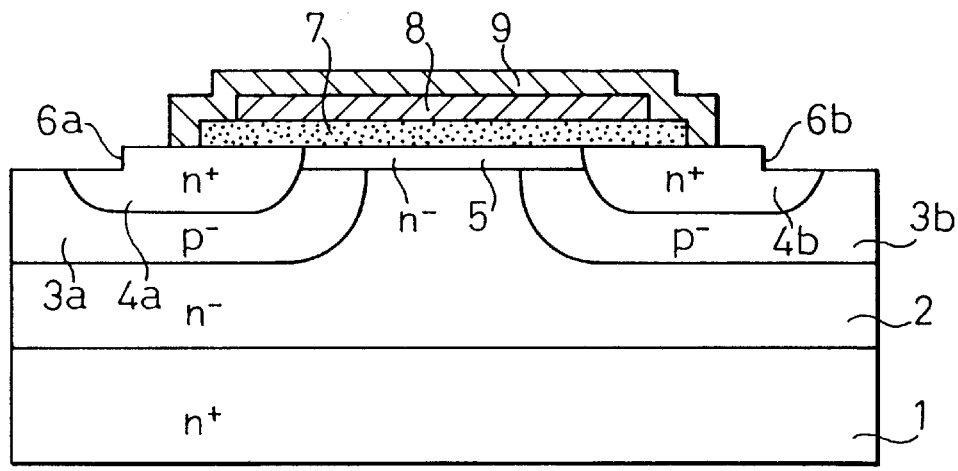

Next, as shown in FIG. 9, after removal of the undesired portions of the gate insulating film 7, an insulating film 9 is formed to cover the gate insulating film 7. More specifically, the film-forming temperature is 425° C. and annealing is performed at 1000° C. after film formation.

Also, as shown in FIG. 1, the source electrode 10 and drain electrode 11 are created by metal sputtering at room temperature. Annealing is then performed at 1000° C. after the film formation.

This completes the power planar-type MOSFET.

The function (operation) of the vertical planar power MOSFET will now be explained.

This MOSFET operates in normally OFF accumulation mode, so that when no voltage is being applied to the polysilicon gate electrode, the carrier of the surface channel layer 5 is totally depleted by the potential created by the difference in the static potentials of the p⁻ type silicon carbide base regions 3a, 3b and surface channel layer 5, and the difference in the work functions of the surface channel layer 5 and the polysilicon gate electrode 8. Applying a voltage to the polysilicon gate electrode 8 changes the potential difference produced by the sum of the difference in the work functions of the surface channel epi-layer 5 and the polysilicon gate electrode 8, and the externally applied voltage. This allows control of the channel state.

In other words, if the work function potential of the poly silicon gate electrode 8 is defined as the first work function potential, the work function potential of the p⁻ type silicon carbide base regions 3a, 3b is defined as the second work function potential, and the work function potential of the surface channel layer 5 is defined as the third work function potential, then the first to third work function potentials may be adjusted so that the n-type carrier is contained in the surface channel epi-layer 5. That is, the first to third work-function potentials are set so that the n-type carrier (electrons) in the surface channel epi-layer 5 is depleted when the poly silicon gate potential 8 is at zero potential with respect to the drain region.

To continue explanation of the operation, a depleted region is formed in the surface channel epi-layer 5 by the electric field generated by the p⁻ type silicon carbide base regions 3a, 3b and the poly silicon gate electrode 8. When a positive bias is supplied to the poly silicon gate electrode 8 in this state, an accumulation mode channel region is formed in the surface channel epi-layer 5, extending from the n type source regions 4a, 4b in the direction of the n⁻ type drift region 2 so that switching is effected to the ON state, causing the carrier to flow between the source electrode 10 and the drain electrode 11.

Here, the electrons flow from the n⁺ type source regions 4a, 4b through the surface channel epi-layer 5 and from the surface channel epi-layer 5 to the n⁻ type silicon carbide epi-layer 2. Also, upon reaching the n⁻ type silicon carbide epi-layer 2 (drift region), the electrons flow vertically to the n⁺ type silicon carbide semiconductor substrate 1.

However, the voltage applied to the gate electrode 8 must be at least as high as the predetermined threshold voltage $V_{th}$. This threshold voltage $V_{th}$ will now be explained.

For reference, the threshold voltage $V_{th}$ for an inversion mode MOSFET will be explained as the basis for explaining the threshold voltage $V_{th}$ for an accumulation mode power MOSFET according to this embodiment.

Threshold voltages $V_{th}$ for inversion mode MOSFETs are generally represented by the following equation (1).

$$V_{th} = V_{FB} + 2\phi_B \tag{1}$$

where $$V_{FB} = \phi_{ms} - (Q_s + Q_{fc} + Q_i + Q_{ss})/C_{oxide}$$

and substitution gives the following equation (2).

$$V_{th} = \phi_{ms} - (Q_s + Q_{fc} + Q_i + Q_{ss})/C_{oxide} + 2\phi_B \tag{2}$$

In general, the energy band is curved based on the effect of the work function difference (electron energy difference) $\phi_{ms}$ between the metal and the semiconductor, the fixed charge $Q_{fc}$ at the interface between the gate oxide film ($SiO_2$) and the n⁻ type layer (hereunder referred to as the $SiO_2$/SiC interface), the mobile ions $Q_i$ in the oxide film and the surface charge $Q_{ss}$ at the $SiO_2$/SiC interface. Consequently, the threshold voltage $V_{th}$ is the sum of the voltage which offsets this energy band curvature and the voltage $2\phi_B$ which begins to form an inversion state, and it is represented by equations (1) and (2). $Q_s$ represents the spatial charge in the gate insulating film (oxide film) 7, and $C_{oxide}$ represents the capacity of the gate insulating film (oxide film) 7.

Considering this as the basis for the accumulation-type vertical power MOSFET according to this embodiment, since the energy band of the surface channel layer 5 is curved by the degree of the work function difference $V_{built}$ at the PN junction (PN junction built-in voltage) for the p⁻ type base regions 3a, 3b and the surface channel layer 5 as compared to an inversion mode MOSFET, and no voltage $2\phi_B$ is necessary for an inversion state, the threshold voltage $V_{th}$ is therefore represented by the following equation (3).

$$V_{th} = V_{built} + \phi_{ms} - (Q_s + Q_{fc} + Q_i + Q_{ss})/C_{oxide} \tag{3}$$

In other words, because the energy band curves due to the work function difference $V_{built}$ at the PN junction side of the surface channel layer 5, the work function difference $\phi_{ms}$ between the poly silicon (metal) and semiconductor at the gate insulating film 7 side, and the degree of curvature of the energy band caused by the oxide film $(Q_s + Q_{fc} + Q_i + Q_{ss})/C_{ox}$, application of an offsetting voltage will flatten the energy band and cause current to flow. Therefore, the threshold voltage $V_{th}$ of the accumulation-type MOSFET of this embodiment is represented by equation (3).

Consequently, according to this embodiment, a voltage greater than the threshold voltage $V_{th}$ represented by equation (3) is used as the gate application voltage.

Incidentally, the operating principle of this device is similar to that of a vertical channel JFET (see B. J. Baliga, "Modem Power Devices", Kreiger Press, Malabar, Fla., 1992).

This normally OFF accumulation mode device can even withstand an avalanche breakdown state. In order to obtain a normally OFF-type vertical power MOSFET, it is necessary for it to have a sufficient barrier height so that the extended depletion layer in the n⁻ type layer does not impede the electrical conductance when no gate voltage is being applied. The maximum thickness of the epitaxial growth layer 5 used in the normally OFF planar-type MOSFET design will depend on the impurity concentration, the $SiO_2$ film thickness and the poly silicon conductivity type used for the gate electrode.

In this construction, to obtain a sufficient barrier height to prevent conduction between the source and drain, the surface channel epi-layer 5 thickness can be determined using the equation given below (4). The conditions are represented by the expression;

$$T_{epi} = \sqrt{2\varepsilon_s/q \cdot \{(N_D + N_A)/N_D N_A\} \cdot V_{built}} + \sqrt{2\varepsilon_s/q \cdot N_D \cdot \{\phi_{ms} - (Q_s + Q_{fc} + Q_i + Q_{ss})/C_{oxide}\}} \quad (4)$$

Here, Tepi is the height of the depleted layer diffusing in the n⁻ type layer, $N_D$ is the donor concentrations in the n⁻ channel region, $N_A$ is the acceptor concentration of the p⁻ base region, $V_{built}$ is the built in voltage of the pn junction, $\phi_{ms}$ is the difference in the work function of gate poly-Si (metal) and the semiconductor, $Q_s$ is the the spatial charge in the gate insulating film, $Q_{fc}$ is the fixed surface charge at the $SiO_2$/SiC interface, $Q_i$ is the mobile ions in the oxide with charge, $Q_{ss}$ is the charged surface states at the $SiO_2$/SiC interface and $C_{oxide}$ is the the capacity of the gate insulating film.

The first expression on the right side of equation (4) is the degree of extension of the depleted layer due to built-in voltage $V_{built}$ at the PN junction between the surface channel layer 5 and the p⁻ type silicon carbide base regions 3a, 3b, i.e. the degree of extension of the depletion layer from the p⁻ type silicon carbide base regions 3a, 3b to the surface channel layer 5, and the second expression is the degree of extension of the depletion layer due to the charge and $\phi_{ms}$, the is the difference in the work function of gate poly silicon (metal) and the silicon carbide channel layer 5 which represent the the degree of extension of the depletion layer from the gate insulating film 7 to the surface channel layer 5.

Consequently, if the sum of the extension of the depletion layer from the p⁻ type silicon carbide base regions 3a, 3b and the extension of the depletion layer from the gate insulating film 7 is made greater than the thickness of the surface channel layer 5, the vertical power MOSFET can be made as a normally OFF type.

Therefore, the surface channel epi-layer 5 must have a low thickness (on the sub-micron order), or it must have a low concentration. That is, when considering ease of formation, the thickness is preferably greater from the standpoint of uniformity, and the concentration is preferably higher so as to ensure impurity inclusion in the apparatus.

Since this normally OFF type vertical power MOSFET can be made so that current does not flow even when no voltage can be applied to the gate electrode due to a device failure or the like, it is possible to ensure greater safety than with a normally ON type.

Also, the two-dimensional numerical simulations were carried out to achieve optimization of the element structure parameters, i.e. the thickness and impurity concentration of the n⁻ type surface channel epi-layer 5, and the impurity concentration of the p⁻ type silicon carbide base regions 3a, 3b and n⁻ type silicon carbide epi-layer 2, for a device breakdown voltage of 1000V.

Figure 10:
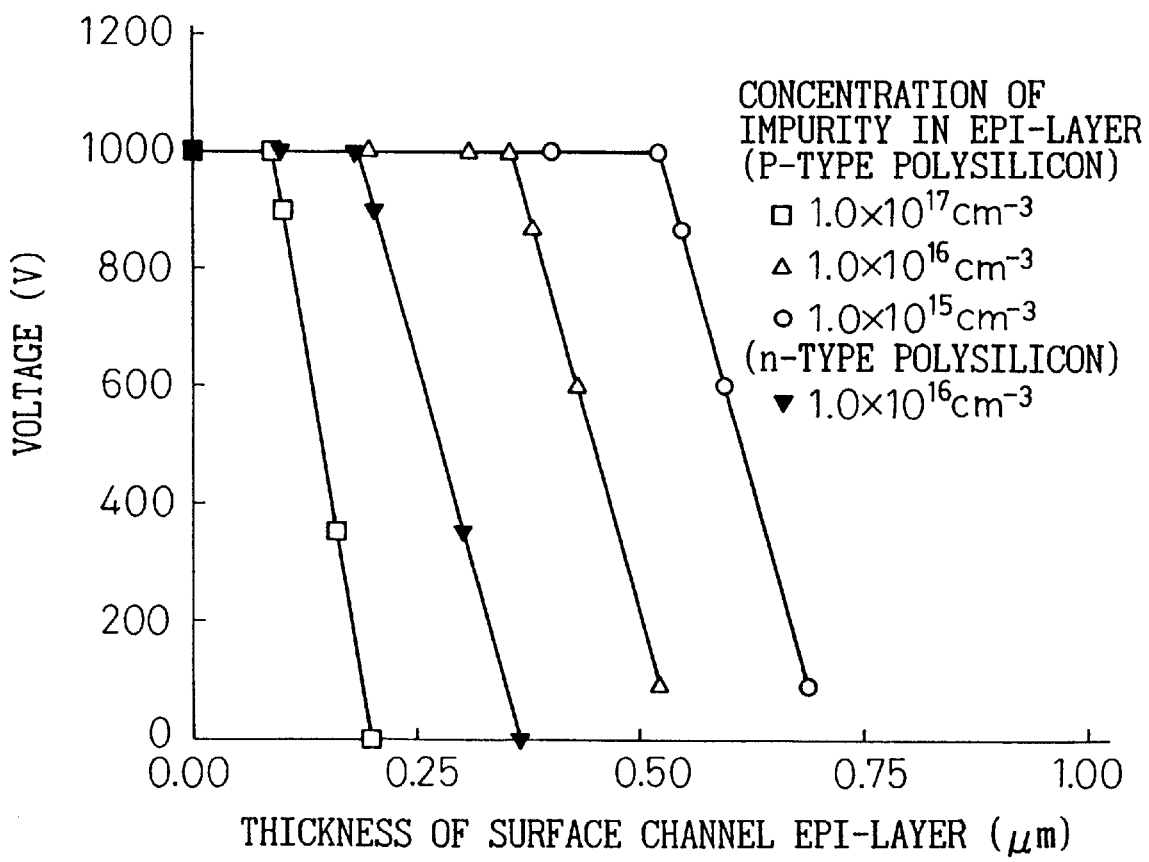
FIG. 10 is a graph showing the relationship between surface channel epitaxial layer thickness, impurity concentration and breakdown voltage.

FIG. 10 is a graph showing the relationship between breakdown voltage, impurity concentration and the thickness of the n⁻ type surface channel epi-layer 5.

Two different doping types were considered for the gate poly silicon electrode 8 in the calculations i.e., one in which a p-type impurity is doped and the other one in which an n-type impurity is doped. When a p-type impurity is doped as the poly silicon gate electrode 8, the impurity concentrations of the surface epitaxial layer 5 are 1E17 cm⁻³, 1E16 cm⁻³ and 1E15 cm⁻³, and when an n-type impurity is doped as the poly silicon gate electrode 8, the impurity concentration of the surface channel epi-layer 5 is 1E16 cm⁻. It can be seen clearly in FIG. 10 that the breakdown voltage depends on the thickness of the surface channel epi-layer 5. The breakdown voltage thereof also depends on the conductivity type of the poly silicon used for the gate electrode 8, and it is understood that if the surface channel epi-layer 5 has the same impurity concentration, the p-type poly silicon gate electrode 8 is superior to the n-type poly silicon gate electrode 8 (for example, the surface channel epi-layer 5 may be made thicker with the same breakdown voltage and impurity concentration). In other words, the breakdown voltage is superior if it is of the opposite conductivity type from the surface channel epi-layer 5.

Furthermore, according to this invention by using the n⁻ type surface channel epi-layer 5, it is possible to separately control the impurity concentration of the channel region and the impurity concentration of the p⁻ type silicon carbide base regions 3a, 3b. Consequently, by separately controlling the impurity concentrations of different regions, a power MOSFET is obtained with high breakdown voltage, low ON resistance and a low threshold voltage. In other words, according to the conventional planar MOSFET as shown in FIG. 30, it is impossible to separately control the impurity concentrations of the channel and the base region of second conductivity type in order to obtain higher breakdown voltage, low ON resistance and a low threshold voltage, but this is possible with the device according to this present invention.

Figure 30:
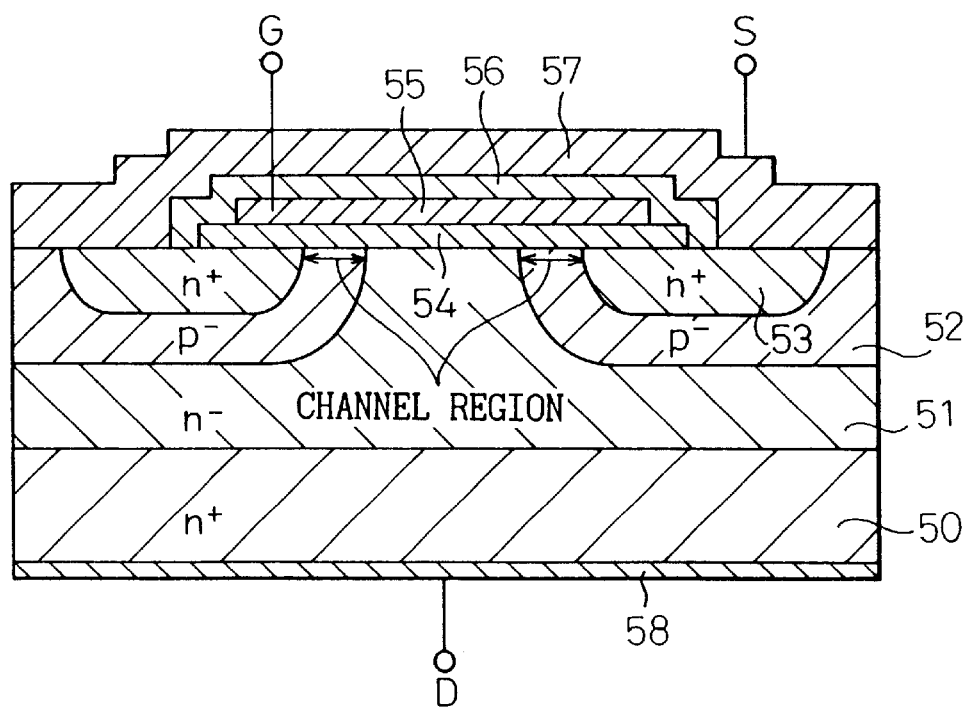
FIG. 30 is a cross-sectional structural illustration of a conventional inversion mode MOSFET for explanation of the prior art.

FIG. 30 is a cross-sectional view of a silicon carbide planar-type MOSFET according to the prior art. In FIG. 30, on an n type silicon carbide semiconductor substrate 70 there is laminated an n⁻ type silicon carbide epitaxial layer 71, and on the surface section of the n⁻ type silicon carbide epitaxial layer 71 there are formed a p⁻ type silicon carbide base region 72 and n⁺ type source region 73 by double ion implantation. Also, on the n⁻ type epitaxial layer 71 there is situated a gate electrode 75 via a gate insulating film 74, and the gate electrode 75 is covered with an insulating film 76. A source electrode 77 is situated so as to contact the p⁻ type silicon carbide base region 72 and n⁺ type source region 73, while a drain electrode 78 is situated on the back side of the n⁺ type silicon carbide semiconductor substrate 70.

Regarding the problems of prior art, as the conventional MOSFET employs the base region 72 and source region 73 formed by double ion implantation because the diffusion process cannot be applied in SiC. Therefore the $SiC/SiO_2$ interface of channel region formed by oxidation retains the crystal damage due to ion implantation, resulting in a high interface state density. Also, because of the low quality of the ion implantation p⁻ type base region 72 which forms the inversion mode channel layer, apparently no improvement in channel mobility can be expected. In contrast, in the embodiment shown in FIG. 1, a pure interface can be obtained by forming the channel layer with a high quality epitaxial layer 5.

Figure 11:
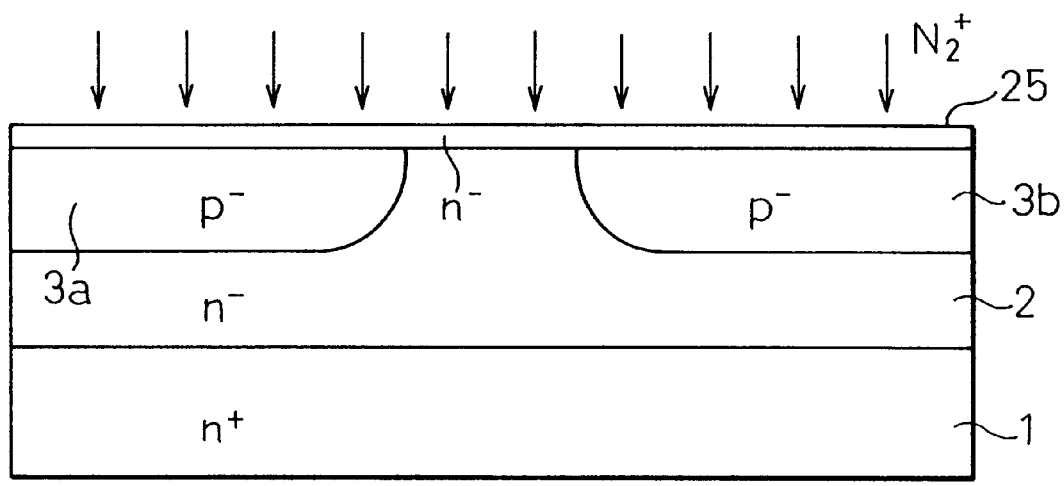
FIG. 11 is a cross-sectional view illustrating another production process for a power planar-type MOSFET according to the first embodiment of the invention.

Also, an SiC layer by ion implantation may also be used in place of the surface channel epi-layer 5. That is, while the epitaxial layer 5 was formed on the substrate in FIG. 4, alternatively as shown in FIG. 11, N+ may be implanted in a SiC substrate to form an n- type channel forming SiC layer 25 in the substrate surface section.

In addition to the construction for the embodiment described above, which was explained for application to an n-channel vertical MOSFET, the same effect may be achieved for p-channel vertical MOSFETs, by switching the p-type and n-type in FIG. 1.

(Second Embodiment of the Invention)

A second embodiment will now be explained, with emphasis on the differences as compared with the first embodiment.

Figure 12:
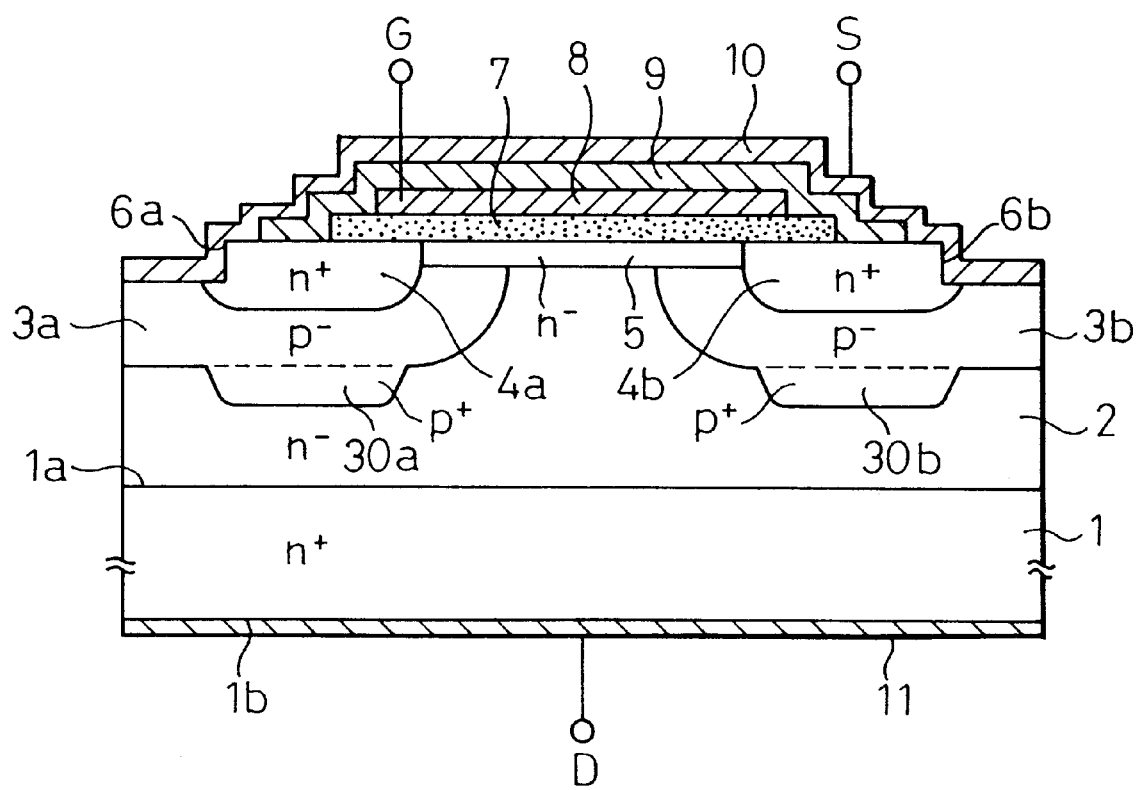
FIG. 12 is a cross-sectional schematic view of a power planar-type MOSFET according to a second embodiment of the invention.

FIG. 12 is a cross-sectional view of an n-channel type planar-type MOSFET (vertical power MOSFET) according to this embodiment.

In FIG. 12, an n type silicon carbide epi-layer 2 with a lower dopant concentration than the substrate 1 is laminated on the main surface of an $n^+$ type silicon carbide semiconductor substrate 1. On predetermined regions of the surface section of this $n^-$ type silicon carbide epi-layer 2 there are separately formed a p-type silicon carbide base region 3a and $p^-$ type silicon carbide base region 3b having a predetermined thickness. Also, on a predetermined region of the surface section of the $p^-$ type silicon carbide base region 3a there is formed an $n^+$ type source region 4a which is shallower than the base region 3a, and on a predetermined region of the surface section of the $p^-$ type silicon carbide base region 3b there is formed an $n^+$ type source region 4b which is shallower than the base region 3b.

Here, a portion of each of the base regions 3a, 3b is made thicker. That is, deep base regions 30a, 30b are formed. The impurity concentration at the thickened sections of the base regions 3a, 3b (the deep base regions 30a, 30b) is higher than the impurity concentration at the thinner sections. Also, the deep base regions 30a, 30b are formed under the source regions 4a, 4b.

In addition, an $n^-$ type SiC layer (surface channel epi-layer) 5 is provided on the surface section of the $n^-$ type silicon carbide epi-layer 2 and the surface sections of the p-type silicon carbide base regions 3a, 3b between the $n^+$ type source region 4a and n type source region 4b. The $n^-$ type SiC layer (surface channel epi-layer) 5 is formed by epitaxial growth, and it functions as the channel-forming layer on the device surface during operation of the device.

Here, the silicon carbide constituting the semiconductor substrate 1, $n^-$ type silicon carbide epi-layer 2, base region 3a and source regions 4a, 4b is 6H-SiC while that of the surface channel epi-layer 5 is 3C-SiC.

Also, grooves 6a, 6b are formed on the surface sections of the $p^-$ type silicon carbide base regions 3a, 3b and n- type source regions 4a, 4b.

A gate insulating film (silicon oxide film) 7 is formed on top of the surface channel epi-layer 5 and the $n^+$ type source regions 4a, 4b. A poly silicon gate electrode 8 is also formed on the gate insulating film 7, which poly silicon gate electrode 8 is covered with an insulating film 9. A source electrode 10 is formed there over, and the source electrode 10 contacts with the $n^+$ type source regions 4a, 4b and $p^-$ type silicon carbide base regions 3a, 3b. A drain electrode layer 11 is also formed on the back side 1b of the $n^+$ type silicon carbide semiconductor substrate 1.

A production process for this power planar-type MOSFET will now be explained with reference to FIGS. 13 to 20.

Figure 13:
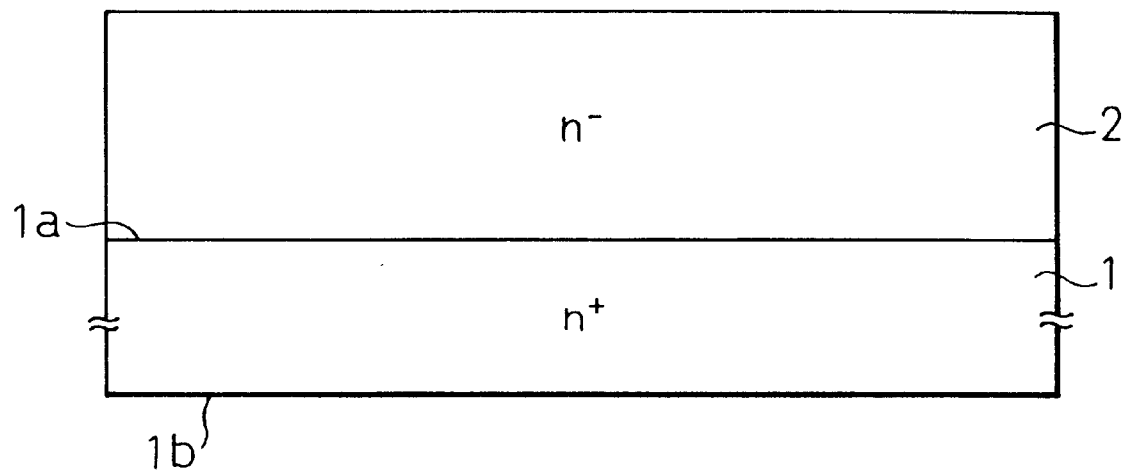
FIGS. 13–20 are cross-sectional views illustrating a production process for a power planar-type MOSFET.

First, as shown in FIG. 13, an n type 6H-SiC substrate, i.e. an $n^+$ type silicon carbide semiconductor substrate is prepared, and an $n^-$ type silicon carbide epi-layer 2 is epitaxially grown to a thickness of 5–10 micron on the main surface 1a of the substrate 1. In this embodiment, the $n^-$ type silicon carbide epi-layer 2 gives the same crystals as the underlying substrate (1), for an n-type 6H-SiC layer.

Figure 14:
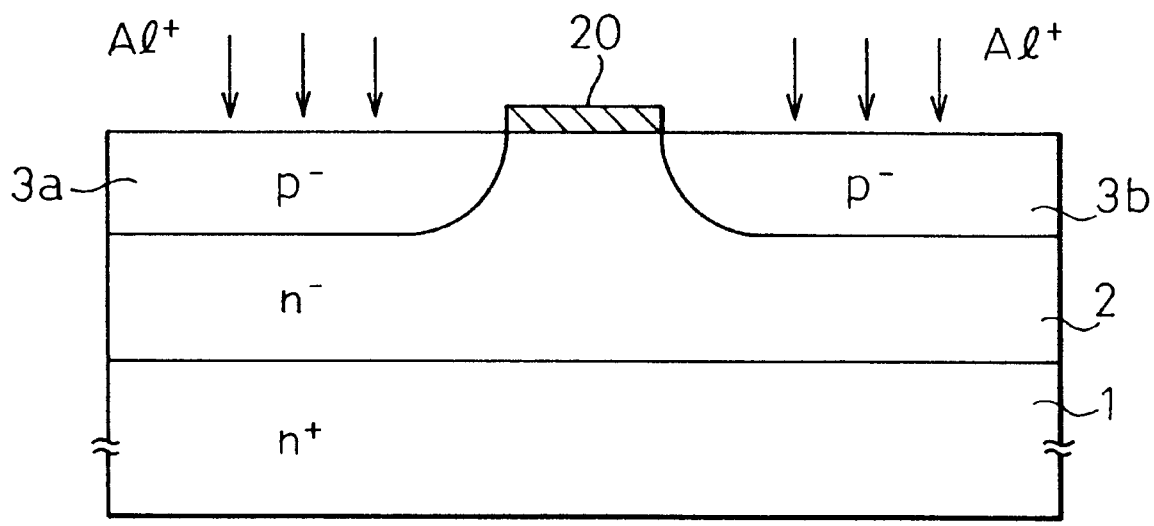

Also, as shown in FIG. 14, an insulating film 20 is situated on a predetermined region of the $n^-$ type silicon carbide epi-layer 2, and this is used as the mask for ion implantation of group IIIA impurities i.e., B+, Al+ or Ga+ to form the $p^-$ type silicon carbide base regions 3a, 3b.

Figure 15:
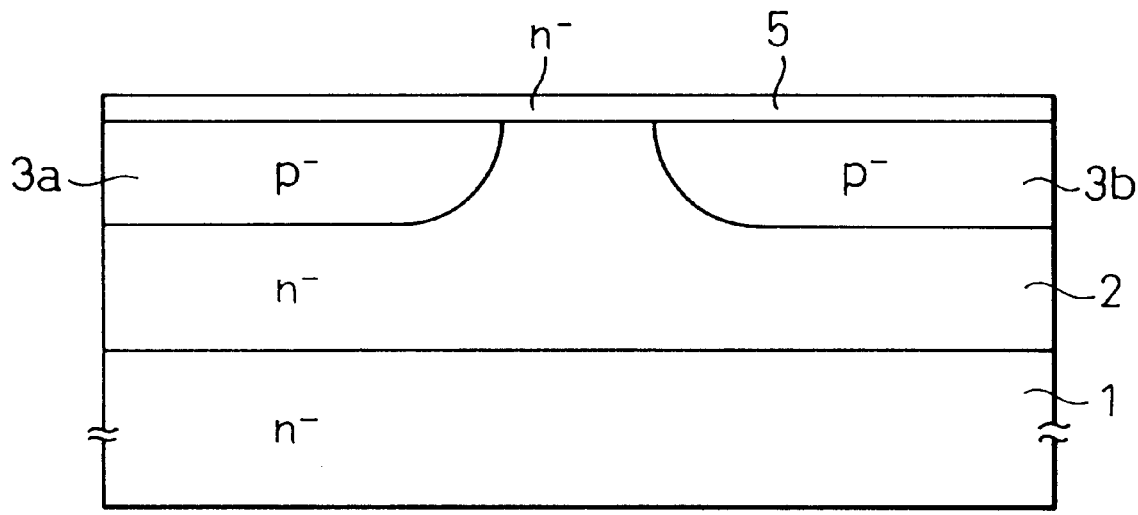

After removal of the insulating film 20, as shown in FIG. 15, an $n^-$ type surface channel epi-layer 5 is epitaxially grown on the $n^-$ type silicon carbide epi-layer 2 using a LPCVD apparatus. As the growing conditions here, $SiH_4$, $C_3H_8$ and $H_2$ are used as the sources gases, and the $SiH_4/C_3H_8$ flow ratio is [0.5]. The growing temperature is 1300° C. This procedure gives a 3C-SiC surface channel epi-layer 5. That is, a 3C-SiC surface channel epi-layer 5 is obtained by reducing the temperature to 1200–1300° C. compared to the usual 1600° C., and by forming the film with a higher Si/C ratio to enhances the 2-D nucleation instead of layer by layer growth. In other words, a 3C-SiC {111} face is formed on the {0001} face of the 6H-SiC.

Figure 16:
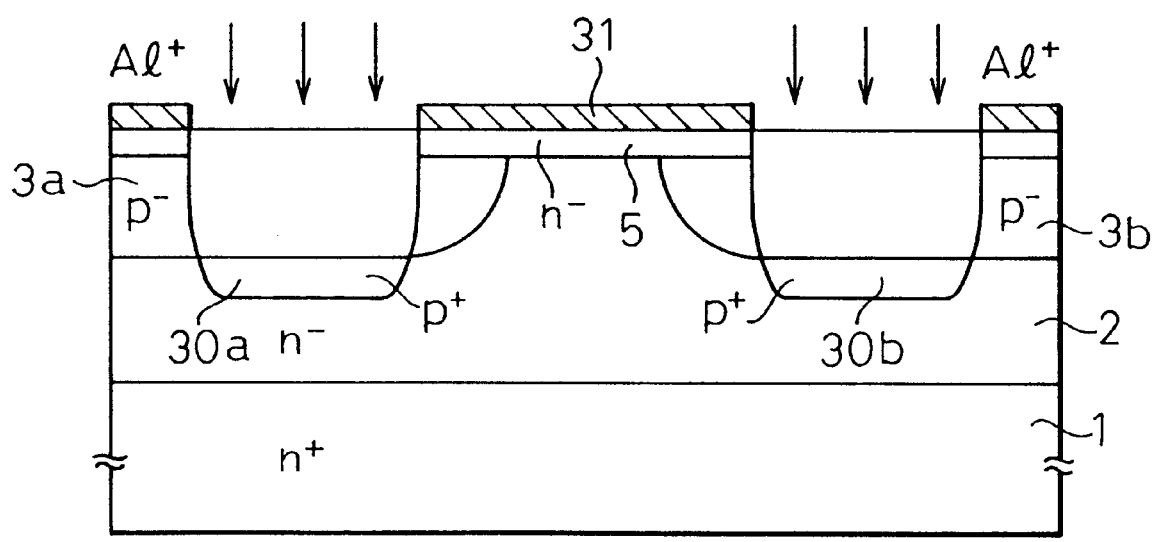

Next, as shown in FIG. 16, group IIIA impurities i.e., B+, Al+ or Ga+ are ion implanted with a mask (insulating film, etc.) 31 placed over the surface channel epi-layer 5, to form deep base regions 30a, 30b.

Figure 17:
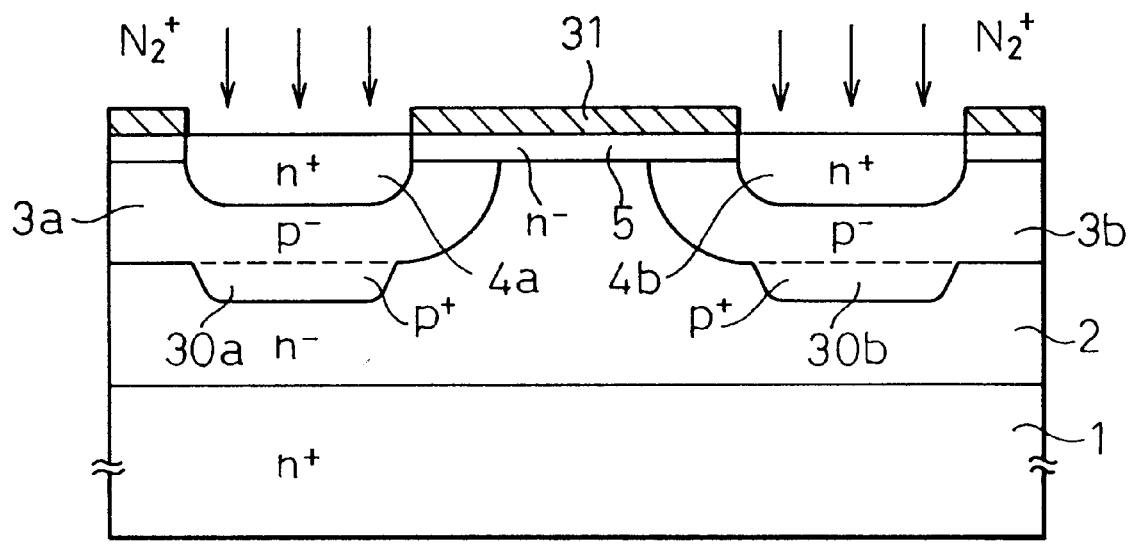

Also, as shown in FIG. 17, the above mentioned mask 31 is used for implantation of N+ to form $n^+$ type source regions 4a, 4b.

Figure 18:
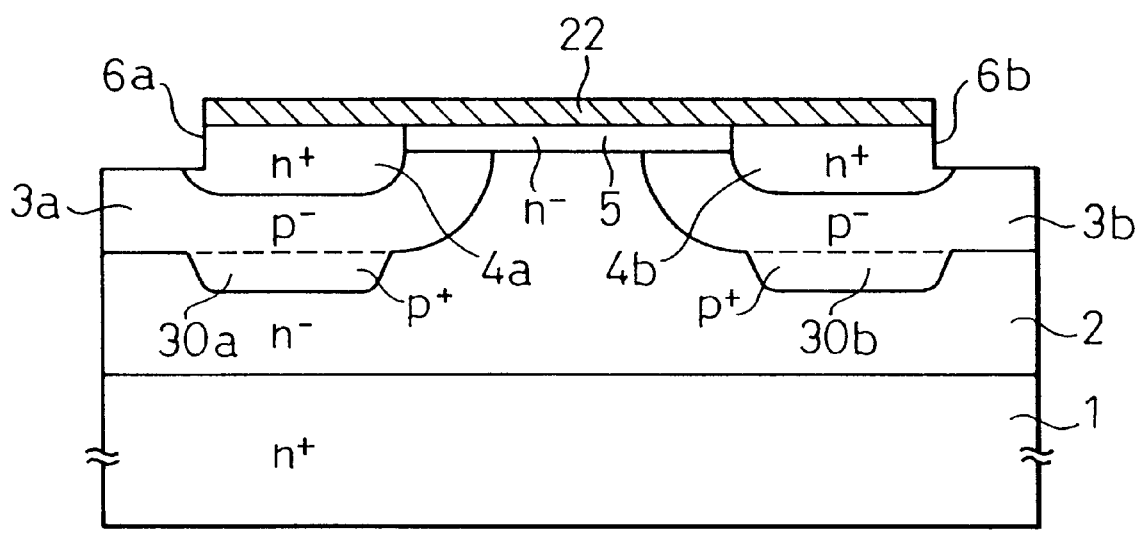

After removal of the mask 31, as shown in FIG. 18, the photo resist method is used to place an insulating film 22 on a predetermined region of the surface channel epi-layer 5, and this is used as a mask for etching of portions of the $n^+$ type source regions 4a, 4b and the $p^-$ type silicon carbide base regions 3a, 3b by RIE to form grooves 6a, 6b.

Figure 19:
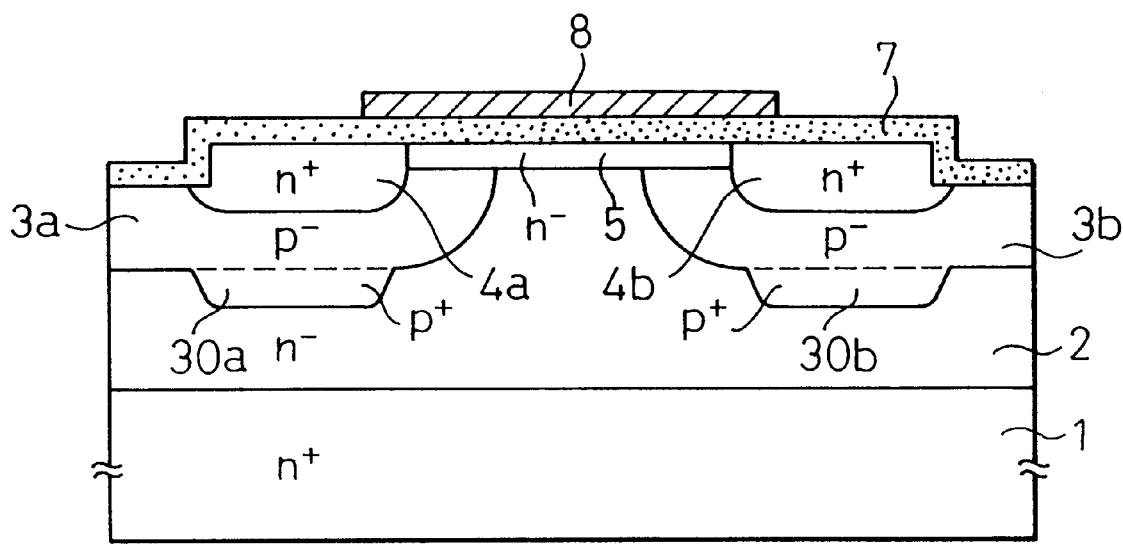

After subsequent removal of the insulating film 22, as shown in FIG. 19, a gate insulating film (gate oxide film) 7 is formed by wet oxidation on the substrate. A poly silicon gate electrode 8 is then deposited on the gate insulating film 7 by LPCVD.

Figure 20:
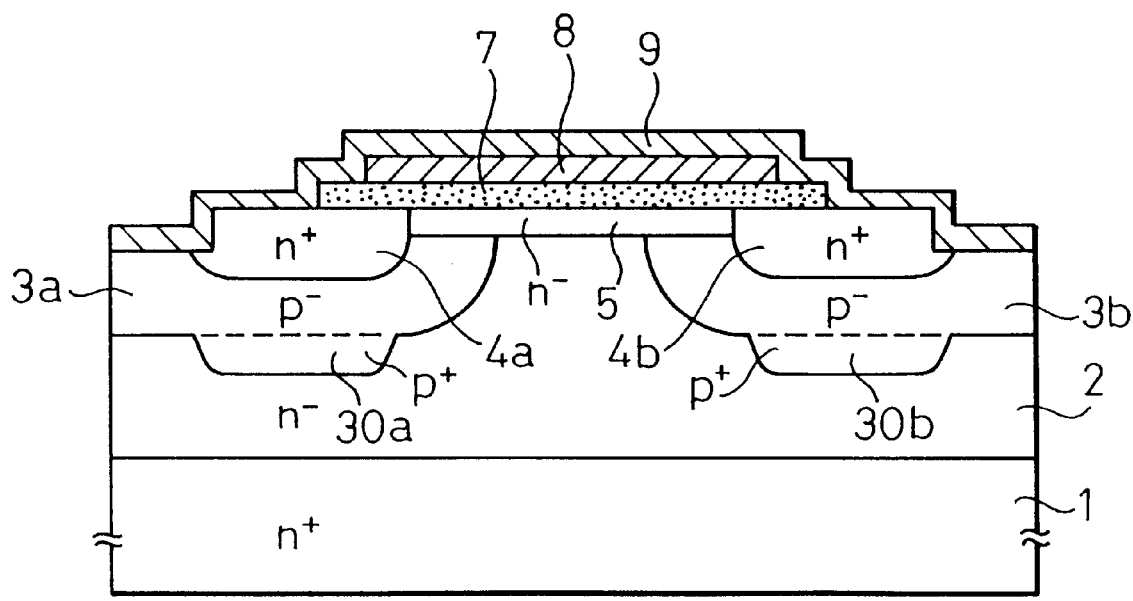

Next, as shown in FIG. 20, after removal of the undesired portions of the gate insulating film 7, an insulating film 9 is formed to cover the poly silicon gate electrode 8. Also, as shown in FIG. 12, the source electrode 10 and drain electrode 11 are created by metal sputtering at room temperature. Annealing is then performed at 1000° C. after the film formation.

This completes the power planar-type MOSFET.

When the power planar-type MOSFET is off, it is in a pinch-off state due to depletion by the difference in the work functions of the poly silicon gate electrode 8 and the surface channel epi-layer 5, and the pn junction between the $p^-$ type silicon carbide base regions 3a, 3b and the surface channel epi-layer 5.

On the other hand, by application of a voltage to the poly silicon gate electrode 8, it is switched ON in accumulation mode wherein the carrier accumulates on the surface channel epi-layer 5. In the ON state, the electrons flow from the $n^+$ type source regions 4a, 4b through the surface channel epi-layer 5 and from the surface channel epi-layer 5 to the $n^-$ type silicon carbide epi-layer 2, and upon reaching the $n^-$ type silicon carbide epi-layer 2 (drift region), the electrons flow vertically to the $n^+$ type silicon carbide semiconductor substrate 1 ($n^+$ drain).

According to this embodiment, since 3C-SiC which has high mobility as a surface channel epi-layer 5 is used separately from the substrate side SiC, it is possible to vastly improve the transistor characteristics (ON resistance) of the FET, and particularly to greatly reduce loss when used as a module, due to this reduction in ON resistance.

In other words, when a surface channel epi-layer 5 is grown on the substrate side SiC with the same crystal system/polymorph (for example, when a 6H-SiC epitaxial layer is formed on the 6H-SiC substrate and a 4H-SiC epitaxial layer is formed on the 4H-SiC substrate), 4H-SiC giving favorable characteristics is usually used, but with a poor quality 4H-SiC substrate the quality of the epitaxial layer will also be impaired. In contrast, by using a surface channel epi-layer 5 with a different crystal system/polymorph than the substrate side, it is possible to obtain a SiC semiconductor substrate with high characteristics and high reliability.

The combination of different crystal system/polymorph of the SiC substrates (1, 2, 3a, 3b, 4a, 4b) and the surface channel epi-layer 5 may be a 6H-SiC substrate and 3C-SiC epitaxial layer 5 or other various combinations, for example,- a 6H-SiC substrate and 4H-SiC epitaxial layer 5, or a 4H-SiC substrate and 3C-SiC epitaxial layer 5.

Also, since deep base regions 30a, 30b are formed on the base regions 3a, 3b to thicken a portion of the base regions 3a, 3b, the thickness is lower at the n⁻ type silicon carbide epi-layer 2 under the deep base regions 30a, 30b (the distance is shortened between the n⁺ type silicon carbide semiconductor substrate 1 and the deep base regions 30a, 30b), thus promoting breakdown. In addition, since the impurity concentration at the deep base regions 30a, 30b is higher than the impurity concentration at the thinner sections, breakdown is further promoted. Furthermore, since the deep base regions 30a, 30b are formed under the source regions 4a, 4b, it is possible to make common use of the mask 31 as shown in FIGS. 16 and 17.

Thus, this embodiment has the following features.

(a) the silicon carbide constituting the semiconductor substrate 1, the n⁻ silicon carbide epi-layer 2, the base regions 3a, 3b and the source regions 4a, 4b is 6H, while the silicon carbide of the surface channel epi-layer 5 is 3C. That is, the silicon carbide constituting the semiconductor substrate 1, the n⁻ silicon carbide epi-layer 2, the base regions 3a, 3b and the source regions 4a, 4b is hexagonal, while the silicon carbide of the surface channel epi-layer 5 is cubic. In other words, the silicon carbide constituting the semiconductor substrate 1, the n⁻ silicon carbide epi-layer 2, the base regions 3a, 3b and the source regions 4a, 4b and the silicon carbide of the surface channel epi-layer 5 have different crystal system/polymorph. By thus using a surface channel epi-layer 5 with a different crystal system/polymorph than the substrate side, it is possible to obtain a SiC semiconductor device with high characteristics and high reliability.

(b) Since deep base regions 30a, 30b are provided as thickened portions of the base regions 3a, 3b, breakdown is facilitated.

(c) Since the impurity concentration of the deep base regions 30a, 30b is higher than the impurity concentration of the thinner sections, breakdown is further facilitated.

(d) Since the deep base regions 30a, 30b (thickened sections of the base regions) are formed under the source regions 4a, 4b, during production the mask 31 may be used as both the deep base-forming mask and the source region forming mask as shown in FIGS. 16 and 17, and the planar-type MOSFET of FIG. 12 may thus be produced without leading to increased production costs.

That is, as shown in FIG. 13, an n⁻ type silicon carbide epi-layer 2 is formed on the main surface 1a of the semiconductor substrate 1, and as shown in FIG. 14, base regions 3a, 3b of a predetermined depth are formed on predetermined regions of the surface section of the n⁻ type silicon carbide epi-layer 2. Also, as shown in FIG. 15, a surface channel epi-layer 5 is placed on the n⁻ type silicon carbide epi-layer 2, as shown in FIG. 16, deep base regions 30a, 30b which are deeper than the base regions 3a, 3b are formed on predetermined regions of the base regions 3a, 3b, and as shown in FIG. 17, the deep base region forming mask 31 is used to form source regions 4a, 4b on predetermined regions of the surface sections of the base regions 3a, 3b, to a shallower depth than the base regions 3a, 3b. Then, a gate electrode 8 is formed on the surface of the surface channel epi-layer 5 via a gate electrode film 7, and a source electrode 10 is formed in contact with the base regions 3a, 3b and source regions 4a, 4b.

Thus, the deep base region-forming mask 31 is used to form the source regions 4a, 4b, so that it may be used for both masks.

(Third Embodiment of the Invention)

A third embodiment of the invention will now be explained, with emphasis on its differences with the second embodiment.

Figure 21:
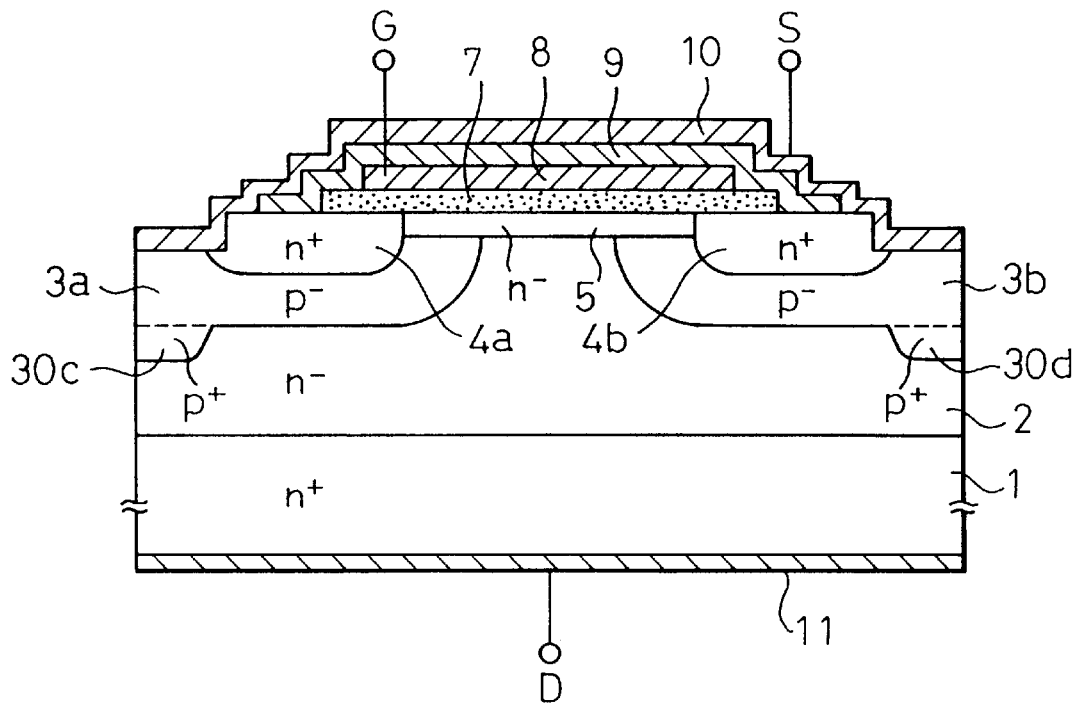
FIG. 21 is a cross-sectional schematic view of a power planar-type MOSFET according to a third embodiment of the invention.

FIG. 21 is a cross-sectional view of an n-channel type planar vertical power MOSFET according to this embodiment.

In FIG. 21, the thickened sections of the base regions 3a, 3b, i.e. the deep base regions 30c, 30d, are formed at locations not overlapping the source regions 4a, 4b. This helps to prevent the device destruction.

The reason for this will now be explained.

Breakdown occurs at the deep base regions 30c, 30d, and a breakdown current flows between the source electrode 10 and drain electrode 11. At such time, if a source region is present in the path of breakdown current flow, a voltage drop occurs in the source region, the pn junction with the p⁻ type base regions 3a, 3b are order biased, and therefore the npn transistor consisting of the n⁻ type silicon carbide epi-layer 2, the base region 3a (3b) and the source region 4a (4b) begins to operate, producing a large current and heating the element, which may be undesirable in terms of reliability. Consequently, this condition may be avoided by removing the source regions 4a, 4b from the main path of breakdown current flow, as according to this embodiment.

Thus, this embodiment has the following feature.

Since the thickened sections of the base regions 3a, 3b (deep base regions 30c, 30d) are provided at locations not overlapping the source regions 4a, 4b, it is possible to avoid destruction.

(Fourth Embodiment of the Invention)

A fourth embodiment of the invention will now be explained with emphasis on its differences with the first embodiment.

Figure 22:
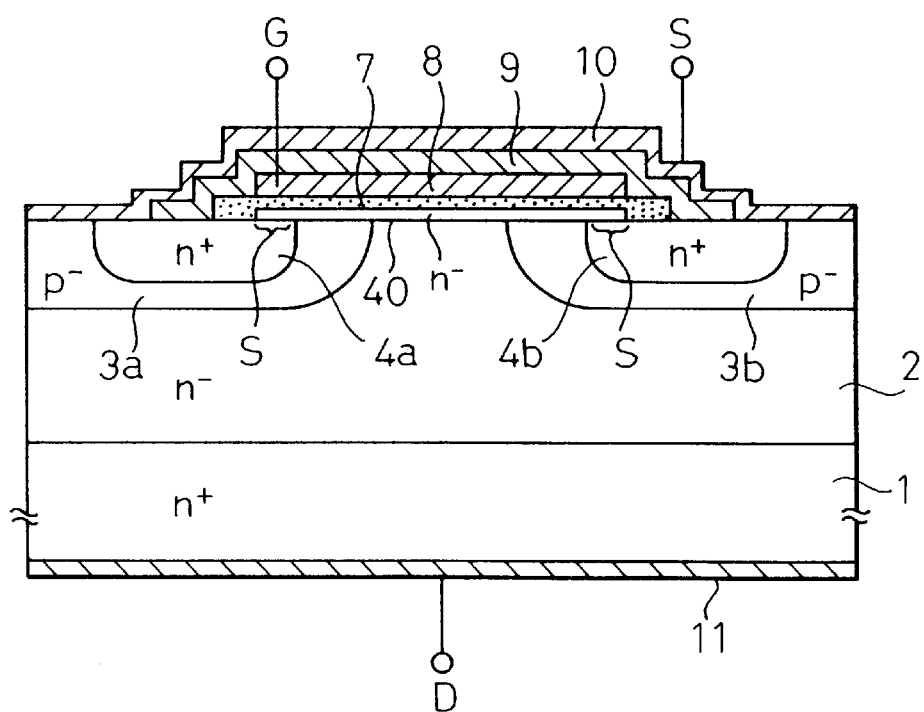
FIG. 22 is a cross-sectional schematic view of a power planar-type MOSFET according to a fourth embodiment of the invention.

FIG. 22 is a cross-sectional view of an n-channel-type planar MOSFET (vertical power MOSFET) according to this embodiment.

In FIG. 22, an n⁻ type SiC layer 40 extends on the surface of the n⁻ type silicon carbide epi-layer 2. That is, the n⁻ type SiC layer 40 is situated so as to connect the source regions 4a, 4b on the surface sections of the base regions 3a, 3b, and the n⁻ type silicon carbide epi-layer 2. This n type SiC layer 40 is formed by epitaxial growth, and the crystals of the epitaxial film are 3C. Also, the n⁻ type SiC layer 40 functions as the channel forming layer on the device surface during operation of the device. The n⁻ type SiC layer 40 will here under be referred to as the surface channel epi-layer.

Thus, the surface channel epi-layer 40 overlaps a portion S of each of the source regions 4a, 4b. More accurately, the surface channel epi-layer 40 does not cover the entirety of the source regions 4a, 4b.

The rest of the construction is the same as FIG. 1 and indicated with like reference numerals, and its explanation will be omitted.

A production process for this power planar-type MOSFET will now be explained with reference to FIGS. 23 to 27.

Figure 23:
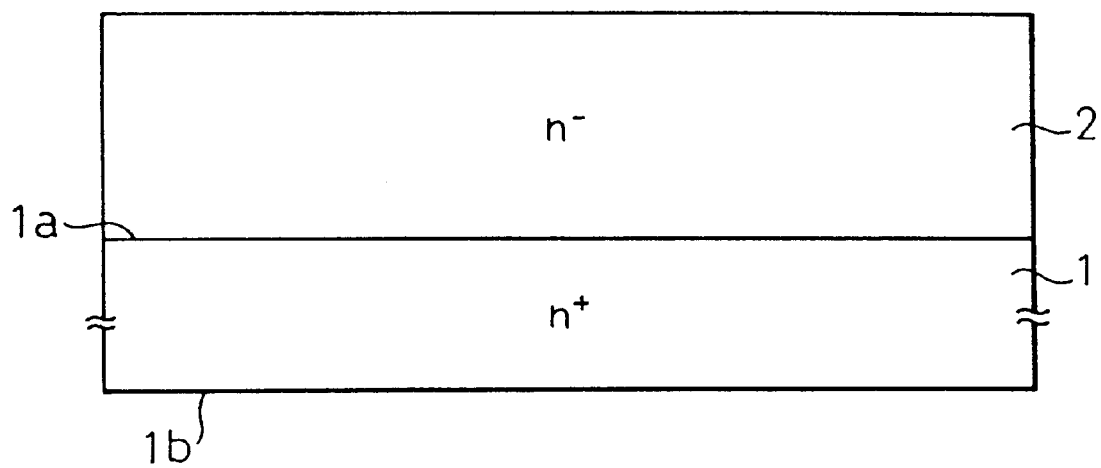
FIGS. 23 to 27 are cross-sectional views illustrating a production process for a power planar-type MOSFET.

First, as shown in FIG. 23, an n⁻ type 6H-SiC substrate, i.e. an n⁺ type silicon carbide semiconductor substrate is prepared, and an n⁻ type silicon carbide epi-layer 2 is epitaxially grown to a thickness of 5–10 micron on the main surface 1*a* of the substrate 1. In this embodiment, the n⁻ type silicon carbide epi-layer 2 gives the same crystals as the underlying substrate 1, for an n⁻ type 6H-SiC layer.

Figure 24:
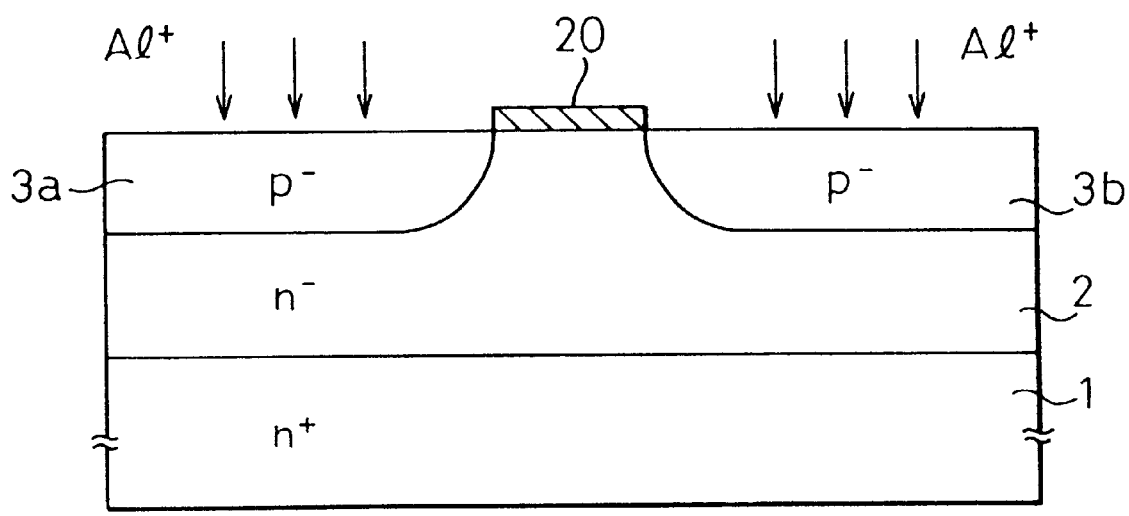

Also, as shown in FIG. 24, an insulating film 20 is situated on a predetermined region of the n⁻ type silicon carbide epi-layer 2, and this is used as the mask for ion implantation of group IIIA impurities i.e., B+, Al+ or Ga+ to form the p⁻ type silicon carbide base regions 3*a*, 3*b*.

Figure 25:
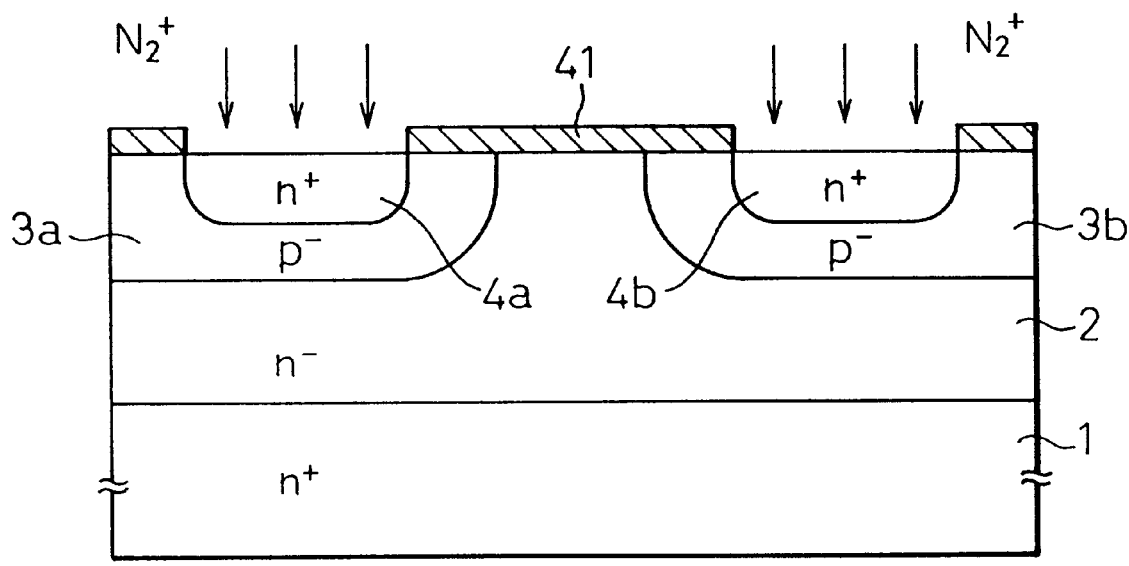

After removal of the insulating film 20, as shown in FIG. 25, an insulating film 41 is situated on a predetermined region of the n⁻ type silicon carbide epi-layer 2, and this is used as a mask for ion implantation of N+ to form the n+ type source regions 4*a*, 4*b*.

Figure 26:
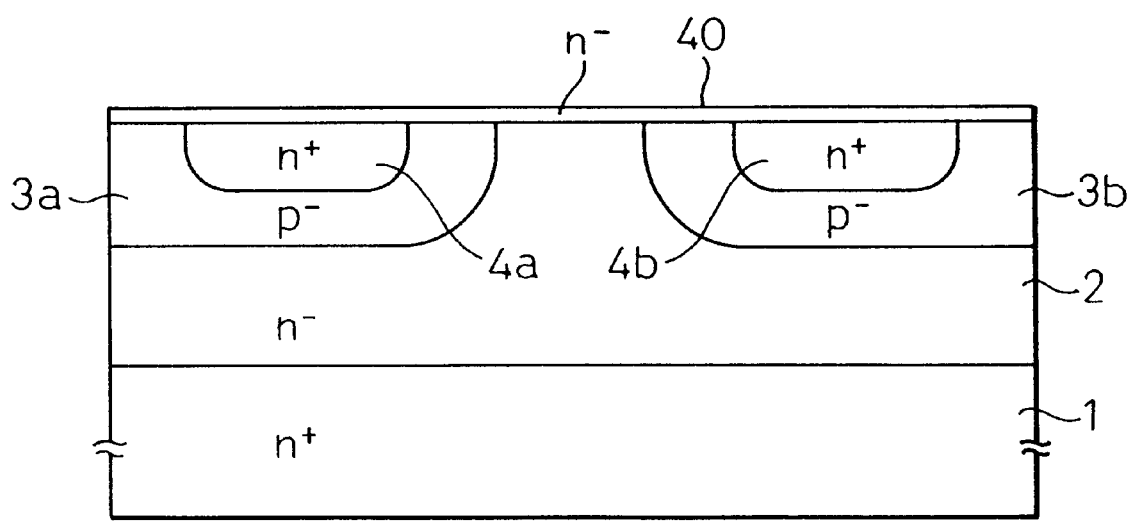

After removal of the insulating film 41, as shown in FIG. 26, an n⁻ type surface channel epi-layer 40 is epitaxially grown on the n⁻ type silicon carbide epi-layer 2. As the growing conditions here, $SiH_4$, $C_3H_8$ and $H_2$ are used as the source gases, and the Si/C ratio is [0.5]. The growing temperature is 1200° C. This procedure gives a 3C-SiC surface channel epi-layer 40.

Figure 27:
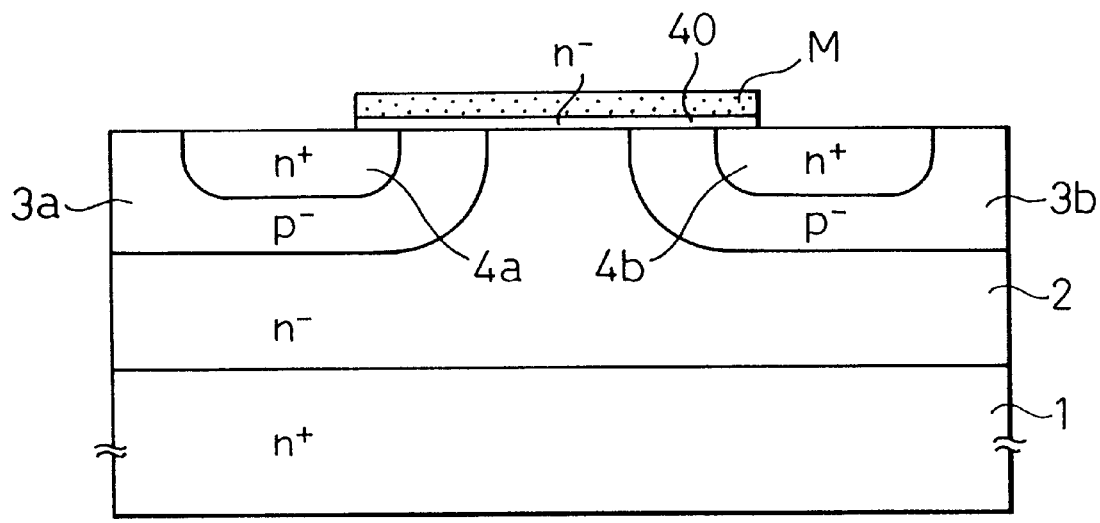

Next, as shown in FIG. 27, the unnecessary surface channel epi-layer 40 is removed. Specifically, a mask material M of a photoresist material, $SiO_2$ film, $Si_3N_4$ film or the like is formed, and the unnecessary surface channel epi-layer 40 is removed by dry etching (for example, RIE). If the mask material M is an $Si_3N_4$ film the surface channel epi-layer 40 may be thermally oxidized to convert it to an oxide film for removal. When the surface channel epi-layer 40 is removed by dry etching, the surfaces of the n⁺ source region 4*a*, 4*b* and p⁻ silicon carbide base regions 3*a*, 3*b* exposed by the etching become roughened by the dry etching, but the roughened surfaces can be removed by oxidation.

Then, as shown in FIG. 22, a gate insulating film (gate oxide film) 7 is formed. A polysilicon gate electrode 8 is then deposited on the gate insulating film 7 by LPCVD. An insulating film 9 is then formed to cover the gate insulating film 7. Also, a source electrode 10 and drain electrode 11 are created by metal sputtering at room temperature. Annealing is then performed at 1000° C. after the film formation.

This completes the power planar-type MOSFET.

When the power planar-type MOSFET is OFF, it is in a pinch-off state due to depletion by the difference in the work functions of the polysilicon gate electrode 8 and the surface channel epi-layer 40, and the pn junction between the p⁻ type silicon carbide base regions 3*a*, 3*b* and the surface channel epi-layer 40.

On the other hand, by application of a voltage to the polysilicon gate electrode 8, it is switched ON in accumulation mode wherein the carrier accumulates on the surface channel epi-layer 40. In the ON state, the electrons flow from the n⁺ type source regions 4*a*, 4*b* through the surface channel epi-layer 40 and from the surface channel epi-layer 40 to the n⁻ type silicon carbide epi-layer 2, and upon reaching the n⁻ type silicon carbide epi-layer 2 (drift region), the electrons flow vertically to the n⁺ type silicon carbide semiconductor substrate 1.

Here, the contact location S between the source regions 4*a*, 4*b* and the surface channel epi-layer 40 constitutes the contact area, so that greater contact area is achieved with the surface channel epi-layer 40, compared to the construction in FIG. 1.

Thus, this embodiment has the following features.

(a) Since the surface channel epi-layer 40 has a construction which is overlapping a portion of each of the source regions 4*a*, 4*b*, it is possible to widen the contact area from the source regions 4*a*, 4*b* to the surface channel epi-layer 40.

(b) As the production method in this case, an n⁻ type silicon carbide epi-layer 2 is formed on the main surface of the semiconductor substrate 1 as in FIG. 23, base regions 3*a*, 3*b* of predetermined depth are formed on predetermined regions of the surface section of the n-type silicon carbide epi-layer 2 as in FIG. 24, and source regions 4*a*, 4*b* of shallower depth than the base regions 3*a*, 3*b* are formed on predetermined regions of the surface sections of the base regions 3*a*, 3*b* as in FIG. 25. Also, the surface channel epi-layer 40 is epitaxially grown on the n⁻ type silicon carbide epi-layer 2 as in FIG. 26, and the unnecessary surface channel epi-layer 40 is removed from the surface channel epi-layer 40 left on the portions of the source regions 4*a*, 4*b* as in FIG. 27. In addition, the gate electrode 8 is formed on the surface of the surface channel epi-layer 40 with the gate insulating film 7 therebetween as in FIG. 22, while the source electrode 10 is formed in contact with the base regions 3*a*, 3*b* and the source regions 4*a*, 4*b*. The semiconductor device of (a) is thus produced in this manner.

This embodiment may be applied in the following way.

Figure 28:
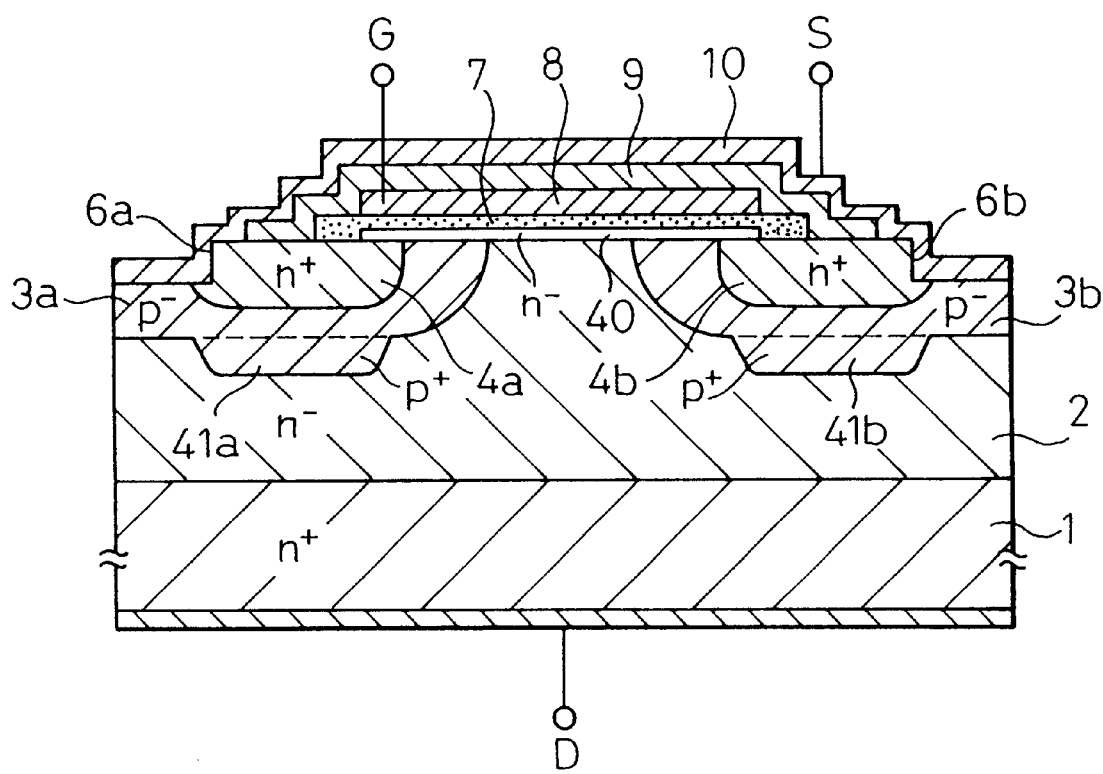
FIG. 28 is a cross-sectional view illustrating another production process for a power planar-type MOSFET according to the fourth embodiment of the invention.

As shown in FIG. 28, a section of each of the base regions 3*a*, 3*b* is thickened. That is, deep base regions 50*a*, 50*b* are formed. The impurity concentration at the thickened sections of the base regions 3*a*, 3*b* (the deep base regions 50*a*, 50*b*) is higher than the impurity concentration at the thinner sections. Also, the deep base regions 50*a*, 50*b* are formed under the source regions 4*a*, 4*b*.

The grooves 6*a*, 6*b* are also formed in the source regions 4*a*, 4*b* contacting the source electrode 10 in the same manner as with the first and second embodiments. This increases the contact region with the electrode by the degree of the grooves 6*a*, 6*b*.

Figure 29:
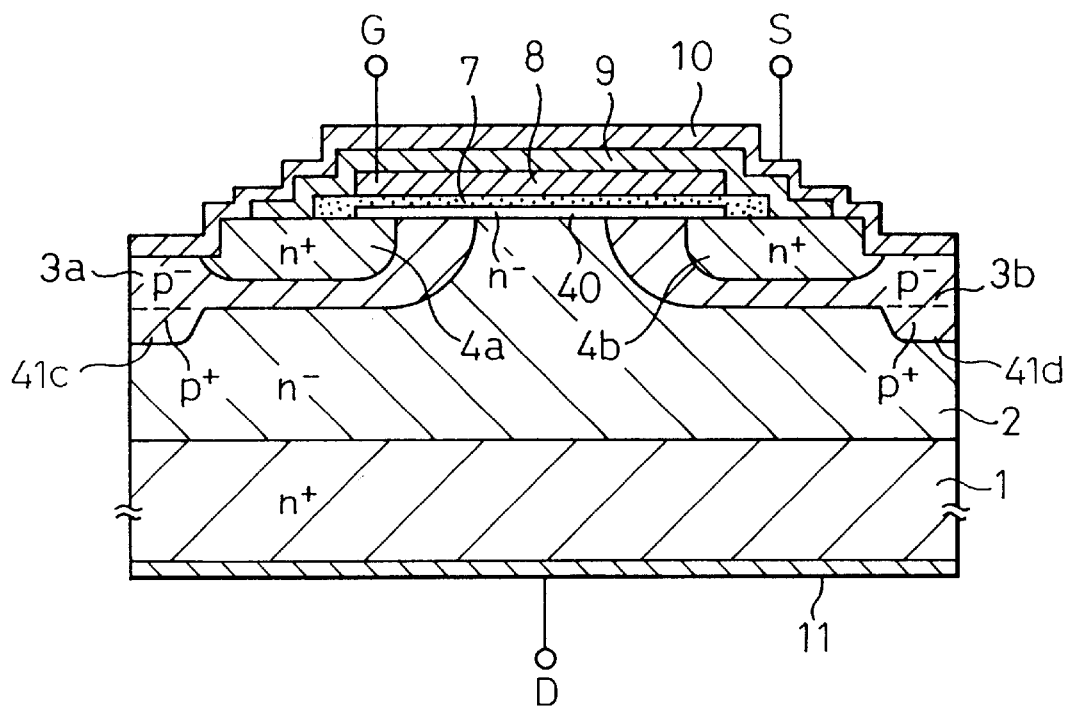
FIG. 29 is a cross-sectional view illustrating yet another production process for a power planar-type MOSFET according to the fourth embodiment of the invention.

Alternatively, as shown in FIG. 29, deep base regions 50*c*, 50*d* are formed as sections of greater thickness in the base regions 3*a*, 3*b*, and these deep base regions 50*c*, 50*d* are formed at locations not overlapping the source regions 4*a*, 4*b*. This helps to prevent its destruction.

Also, the crystal system/polymorph of the silicon carbide constituting the semiconductor substrate 1, the n⁻ type silicon carbide epi-layer 2, the base regions 3*a*, 3*b* and the source regions 4*a*, 4*b* may be the same as the crystal system/polymorph of the silicon carbide of the surface channel epi-layer 40.

(Fifth Embodiment of the Invention)

Figure 31:
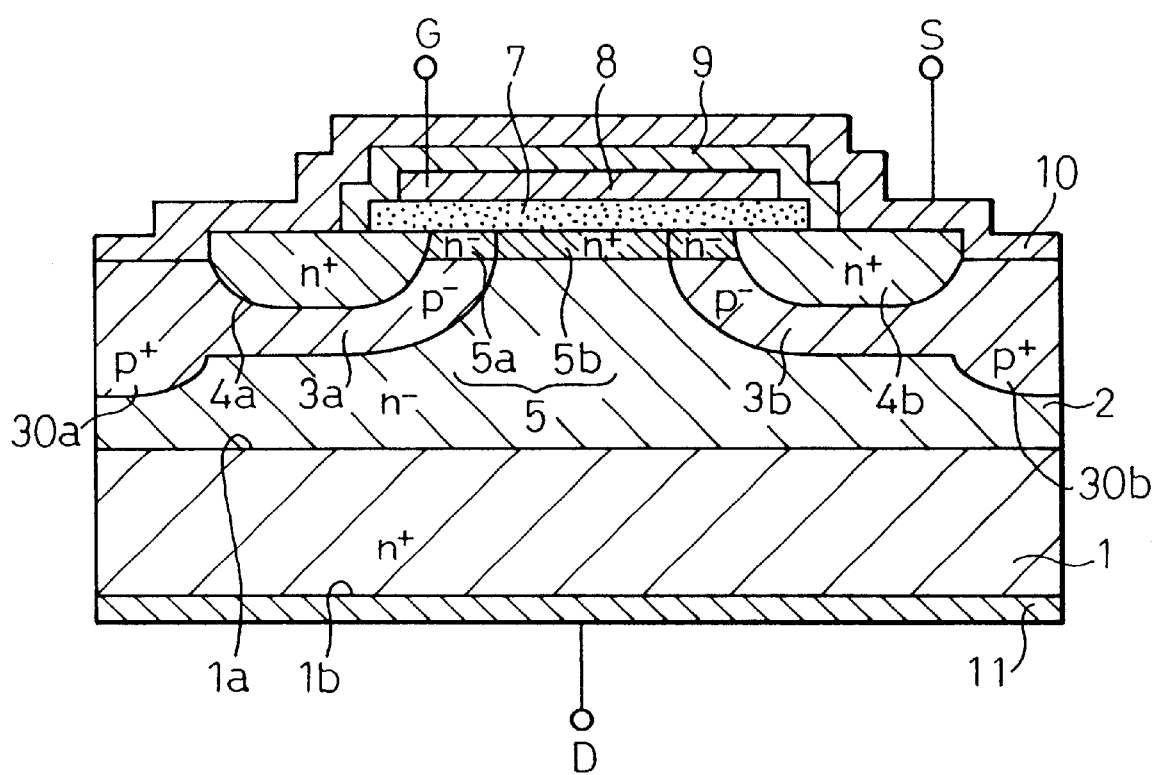
FIG. 31 is a cross-sectional view of a vertical power MOSFET according to an embodiment of the invention.

FIG. 31 is a cross-sectional view of a normally OFF n-channel-type planar vertical power MOSFET according to this embodiment of the invention. This device is suitable for application to inverters or alternators for vehicle.

The construction of the vertical power MOSFET will now be explained with reference to FIG. 31. However, because the vertical power MOSFET of this embodiment has generally the same construction as the MOSFET shown in FIG. 1, only the distinct aspects will be explained. The aspects of the vertical power MOSFET of this embodiment which are the same as those of the MOSFET shown in FIG. 1 are indicated with like reference numerals.

In the MOSFET shown in FIG. 1, the surface channel layer 5 is made entirely of an n⁻ type layer, but in the vertical power MOSFET of this embodiment, the channel region section 5*a* of the surface channel layer is formed of an n⁻ type layer while the sections 5*b* other than the channel region are formed of an n⁺ type layer.

That is, the surface channel layer 5 is formed so as to connect the source regions 4*a*, 4*b* and the n⁻ type silicon carbide epi-layer 2 on the surface sections of the p⁻ type silicon carbide base regions 3a, 3b and the surface section of the n⁻ type silicon carbide epi-layer 2, but the surface sections of the p⁻ type silicon carbide base regions 3a, 3b are made of n⁻ type layers while the surface section of the n⁻ type silicon carbide epi-layer 2 is made of an n⁺ type layer.

Regarding the internal accumulation drift resistance $R_{acc\text{-}drift}$ of the surface channel layer 5, since the sections 5b other than the channel region section 5a of the surface channel layer 5 are formed of an n⁺ type layer, the internal resistance of those sections 5b is lower than when they are formed of an n⁻ type layer. Consequently, the sum of the ON resistance $R_{on}$ is smaller, allowing the ON resistance $R_{on}$ to be reduced.

The ON resistance $R_{on}$ of a planar vertical power MOSFET is determined by the contact resistance $R_{s\text{-}cont}$ between the source electrode and the n⁺ type source regions; the internal drift resistance $R_{source}$ of the n⁺ type source regions; the accumulation channel resistance $R_{channel}$ in the channel region formed in the surface channel layer; the internal accumulation drift resistance $R_{acc\text{-}drift}$ of the surface channel layer; the JFET resistance $R_{JFET}$ of the JFET section; the internal drift resistance $R_{drift}$ of the n⁻ type silicon carbide channel epi-layer; the internal resistance $R_{sub}$ of the n⁺ type silicon carbide semiconductor substrate; and the contact resistance $R_{d\text{-}cont}$ between the n⁺ type silicon carbide semiconductor substrate and the drain electrode. The sum of above said components constitute the ON resistance. Specifically, it is represented by the following equation (1).

$$R_{on}=R_{s\text{-}cont}+R_{source}+R_{channel}+R_{acc\text{-}drift}+R_{JFET}+R_{drift}+R_{sub}+R_{d\text{-}cont} \quad (5)$$

Figure 32:
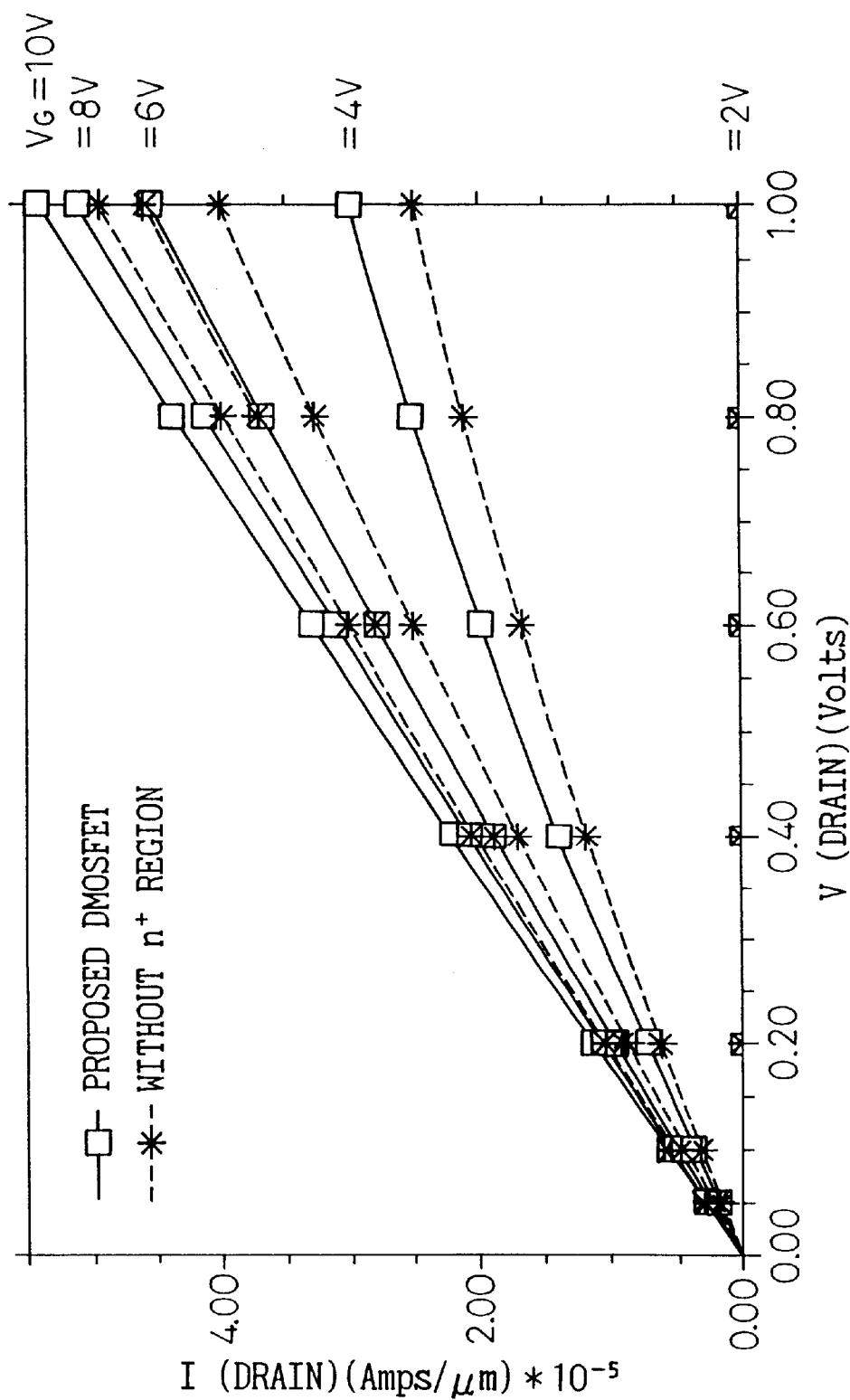
FIG. 32 is a gate application voltage-drain current characteristic graph showing the ON resistance of the vertical power MOSFET of FIG. 31.

FIG. 32 shows a comparison of the drain current-drain voltage characteristics of the vertical power MOSFET of this embodiment shown in FIG. 31 and of one such as shown in FIG. 1 where the sections other than the channel region of the surface channel layer 5 are also formed of an n⁻ type layer. This illustration shows the change in the drain current when the gate application voltage is varied.

As shown in FIG. 32, when the sections 5b other than the channel region of the surface channel layer 5 are made of an n⁺ type layer, the drain current is greater than when the sections 5b other than the channel region are made of an n⁻ type layer. This is because of the reduced ON resistance $R_{on}$ of the vertical power MOSFET. Thus, by making the sections 5b other than the channel region of the surface channel layer 5 with an n⁺ type layer, it is possible to further reduce the ON resistance $R_{on}$ of the vertical power MOSFET.

Also, deep base layers 30a, 30b are formed which are thickened sections of the base regions 3a, 3b. The deep base layers 30a, 30b are formed on sections not overlapping the n⁺ type source region, and the thickened sections where the deep base layers 30a, 30b are formed in the p⁻ type silicon carbide base regions 3a, 3b have a higher impurity concentration than the thinner sections on which the deep base layers 30a, 30b are not formed.

With these deep base layers 30a, 30b, the thickness of the n⁻ type silicon carbide epi-layer 2 under the deep base layers 30a, 30b is reduced (the distance between the n⁺ type silicon carbide semiconductor substrate 1 and the deep base layer 30a, 30b is shortened) allowing increase in the field intensity and facilitating avalanche breakdown.

Since the deep base layers 30a, 30b are formed on sections not overlapping the n⁺ type source region, the following condition results.

Avalanche breakdown occurs at the deep base regions 30a, 30b, and a breakdown current therefore flows between the source electrode 10 and drain electrode 11. At such time, if the path of breakdown current (positive hole current) flow is the p⁻ type base regions 3a, 3b sandwiched between the source regions 4a, 4b and the n⁻ drift region 2, a voltage drop occurs in the p⁻ type source regions 3a, 3b, the PN junction between the p⁻ type base regions 3a, 3b and the source regions 4a, 4b are order biased, and therefore the parasitic NPN transistor consisting of the n⁻ type silicon carbide epi-layer 2, the base regions 3a, 3b and the source regions 4a, 4b begins to operate, producing a large current. The element is thus heated, which may be undesirable in terms of reliability. Consequently, this problem may be avoided, because the deep base regions 30a, 30b are formed on sections not overlapping the n⁺ type source region.

A production process for the vertical power MOSFET shown in FIG. 31 will now be explained with reference to FIGS. 33 to 41.

Figure 33:
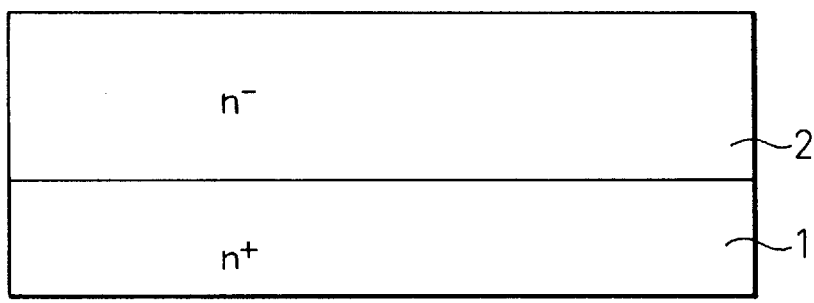
FIGS. 33 to 41 are illustrations of a production process for the vertical power MOSFET of FIG. 31.

[Step shown in FIG. 33]

First, an n-type 4H, 6H or 3C-SiC substrate, i.e. an n⁺ type silicon carbide semiconductor substrate 1, is prepared. Here, the thickness of the n⁺ type silicon carbide semiconductor substrate 1 is 400 micron, and the main surface 1a is the (0001) Si face, (000$\bar{1}$) C face, (11$\bar{2}$0) a face or (1$\bar{1}$00) prism face. An n⁻ type silicon carbide epi-layer 2 is epitaxially grown to a thickness of 5–10 micron on the main surface 1a of the substrate 1. In this embodiment, the n⁻ type silicon carbide epi-layer 2 gives the same crystals as the underlying substrate 1, for an n-type 2H, 4H, 6H, 15R or 3C-SiC layer.

Figure 34:
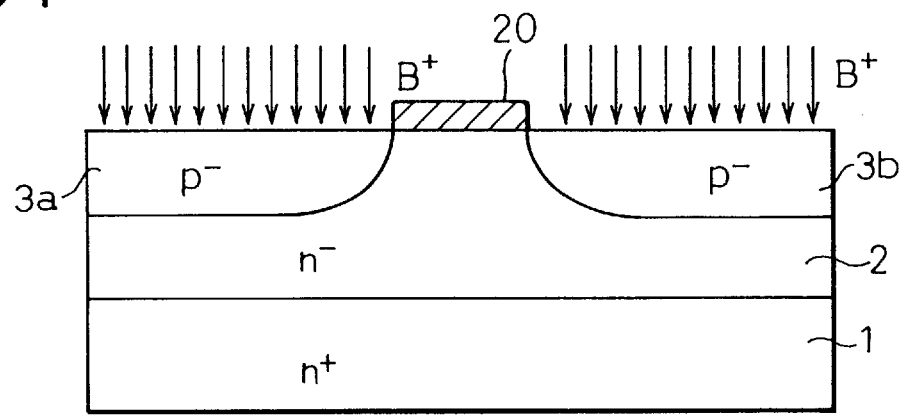

[Step shown in FIG. 34]

An insulating film 20 is situated on a predetermined region of the n⁻ type silicon carbide epi-layer 2, and this is used as the mask for ion implantation of group IIIA impurities i.e., B+, Al+ or Ga+ to form the p-type silicon carbide base regions 3a, 3b. The ion implantation conditions are a temperature of 700° C. and a douse of 1E14 cm⁻².

Figure 35:
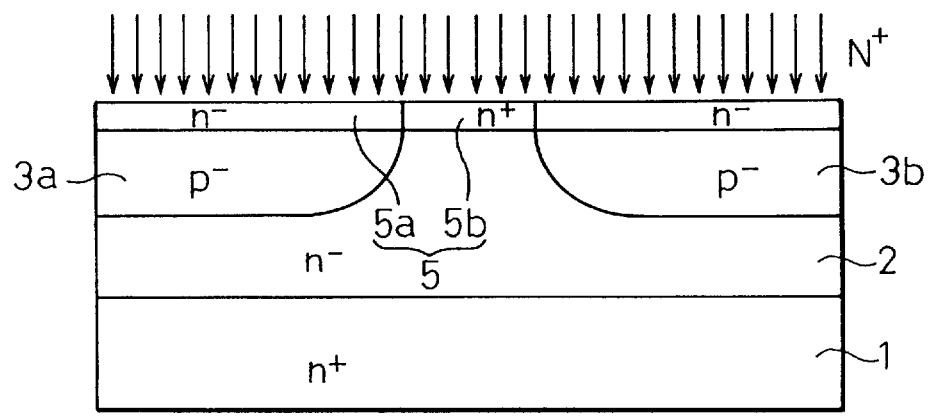

[Step shown in FIG. 35]

After removal of the insulating film 20, ion implantation of N+ is effected from the top of the substrate 1 to form a surface channel layer 5 on the surface section of the n⁻ type silicon carbide epi-layer 2 and the surface sections (surface layer portions) of the p⁻ type silicon carbide base regions 3a, 3b. The ion implantation conditions are a temperature of 700° C. and a dose of 1E12 cm⁻². Thus, the surface channel layer 5 is compensated on the surface sections of the p⁻ type base regions 3a, 3b, being formed there as an n⁻ type layer with a low n-type impurity concentration, and is formed as an n⁺ type layer with a high n-type impurity concentration on the surface section of the n⁻ type silicon carbide epi-layer 2.

In this embodiment the surface channel is produced with ion implantation in silicon carbide because when the production is accomplished using silicon, it becomes difficult to control the degree of thermal diffusion of the impurity in the surface channel layer 5, thus complicating efforts to produce a normally OFF-type MOSFET with the same structure described above. Consequently, by using SiC as according to this embodiment, it is possible to produce a vertical power MOSFET with more precision than by using silicon.

In addition, in order to obtain a normally OFF-type vertical power MOSFET it is necessary to set the thickness of the surface channel layer 5 so that it satisfies the condition of equation (5) mentioned above; however, because the $V_{built}$ is low when silicon is used, it becomes necessary to form the surface channel layer 5 with a low thickness and with a low impurity concentration, making it difficult to control the degree of scattering of the impurity ions, and this greatly complicates production. Yet, when SiC is used the $V_{built}$ is about 3 times higher than with silicon, allowing formation of a thick n⁻ type layer and a high impurity concentration, and it therefore becomes easier to produce a normally OFF accumulation-type MOSFET.

Figure 36:
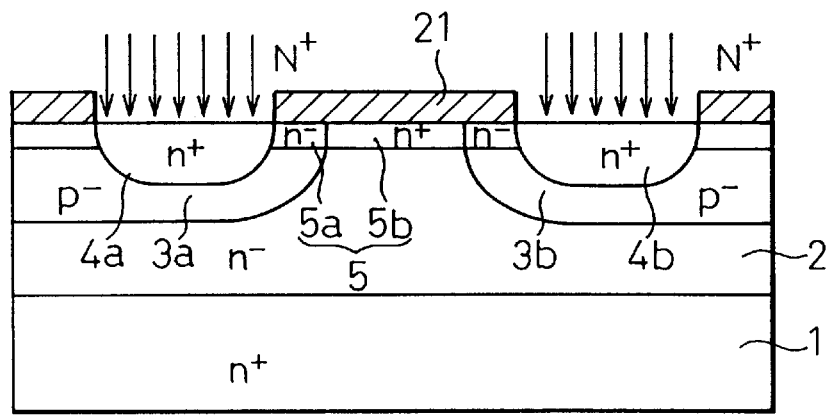

[Step shown in FIG. 36]

An insulating film 21 is situated on a predetermined region of the surface channel layer 5, and this is used as the mask for ion implantation of N+ to form the n+ type source regions 4a, 4b. The ion implantation conditions are a temperature of 700° C. and a douse of 1E15 $cm^{-2}$.

Figure 37:
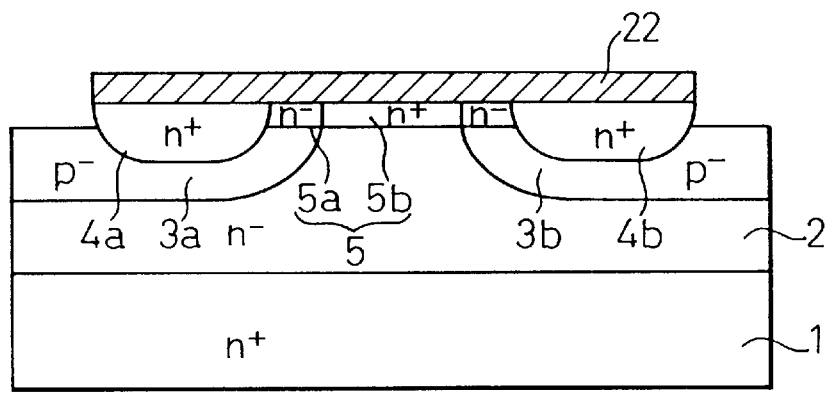

[Step shown in FIG. 37]

After removal of the insulating film 21, the photoresist method is used to place an insulating film 22 on a predetermined region of the surface channel layer 5, and this is used as a mask for partial etching removal of the surface channel layer 5 on the p⁻ type silicon carbide base regions 3a, 3b by RIE.

Figure 38:
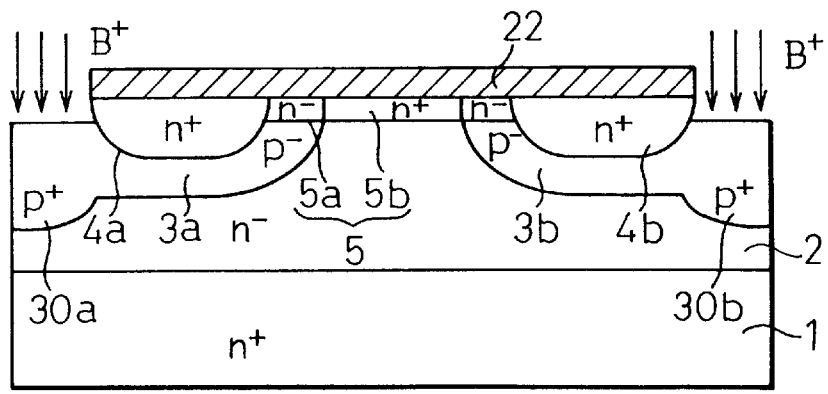

[Step shown in FIG. 38]

Also, the insulating film 22 is used as a mask for B+ ion implantation to form deep base layers 30a, 30b. This creates thicker sections on the base regions 3a, 3b. The deep base layers 30a, 30b are formed on sections not overlapping the n⁺ type source regions 4a, 4b, and the thickened sections where the deep base layers 30a, 30b are formed in the p⁻ type silicon carbide base regions 3a, 3b have a higher impurity concentration than the thinner sections on which the deep base layers 30a, 30b are not formed.

Figure 39:
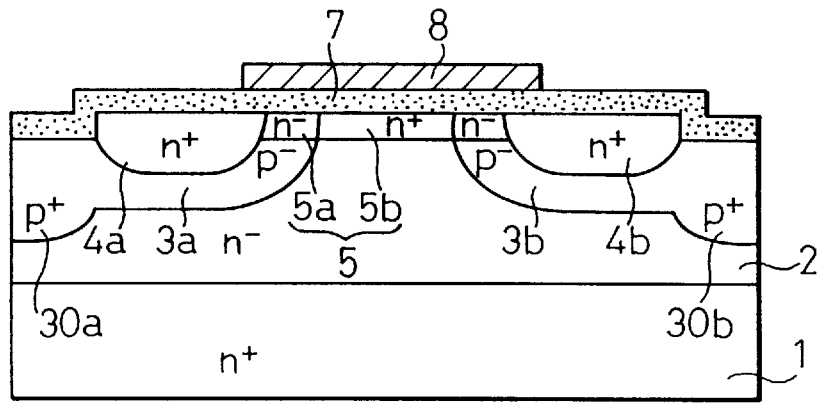

[Step shown in FIG. 39]

After removal of the insulating film 22, a gate insulating film (gate oxide film) 7 is formed by wet oxidation on the substrate. Here, the atmosphere temperature is 1080° C.

Then, a polysilicon gate electrode 8 is accumulated on the gate insulating film 7 by LPCVD. The film forming temperature here is 600° C.

Figure 40:
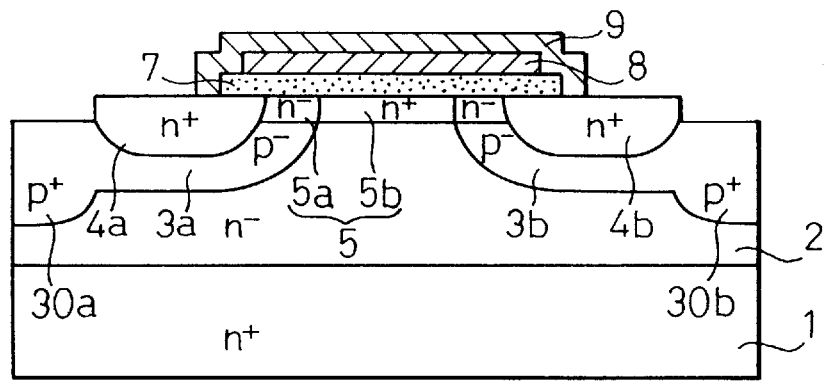

[Step shown in FIG. 40]

Next, after removal of the undesired portions of the gate insulating film 7, an insulating film 9 is formed to cover the gate insulating film 7. More specifically, the film-forming temperature is 425° C. and annealing is performed at 1000° C. after film formation.

Figure 41:
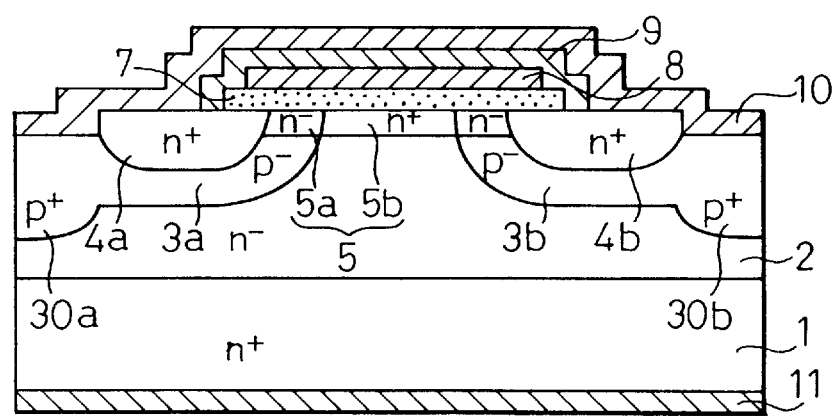

[Step shown in FIG. 41]

Also, a source electrode 10 and drain electrode 11 are created by metal sputtering at room temperature. Annealing is then performed at 1000° C. after the film formation.

According to this embodiment when power device is OFF, it is in a pinch-off state due to depletion by the difference in the work functions of the polysilicon gate electrode 8 and the surface channel layer 5a, 5b and the pn junction between the p⁻ type silicon carbide base regions 3a, 3b and the surface channel layer 5a, 5b. On the other hand, by application of a voltage to the polysilicon gate electrode 8, it is switched ON in accumulation mode wherein the carrier accumulates on the surface channel layer 5a. In the ON state, the electrons flow from the n+ type source regions 4a, 4b through the n⁻ type surface channel layer 5a and from the n+ type surface channel layer 5b to the n⁻ type silicon carbide epi-layer 2, and upon reaching the n⁻ type silicon carbide epi-layer 2 (drift region), the electrons flow vertically to the n⁺ type silicon carbide semiconductor substrate 1.

Also, as shown in FIG. 31, the p⁻ type silicon carbide base regions 3a, 3b are in contact with the source electrode 10 and thus grounded. Consequently, the built-in voltage $V_{built}$ at the PN junction between the surface channel layer 5 and the p⁻ type silicon carbide base regions 3a, 3b can be utilized to bring the surface channel layer 5 to a pinch-off state. For example, when the p⁻ type silicon carbide base regions 3a, 3b are not grounded and are in a floating state, the depleted layer cannot be extended from the p⁻ type silicon carbide base regions 3a, 3b by utilizing the built-in voltage $V_{built}$, and therefore the contact between the p⁻ type silicon carbide base regions 3a, 3b and the source electrode 10 may be considered an effective structure for bringing the surface channel layer 5 to a pinch-off state. According to this embodiment, the p⁻ type silicon carbide base regions 3a, 3b are formed with a low impurity concentration, but the built-in voltage $V_{built}$ can be utilized even more with a high impurity concentration.

This completes the vertical power MOSFET shown in FIG. 31.

This embodiment has the following features.

Since by making the impurity concentration of the section of the surface channel layer situated on the surface section of the epitaxial layer to be higher than that of the epitaxial layer, it is possible to lower the resistance of the sections of the surface channel layer other than the channel region (accumulation-drift resistance of channel layer), thus lowering the ON resistance of the MOSFET. This allows an even lower ON resistance to be achieved for the MOSFET.

(Sixth Embodiment of the Invention)

Figure 42:
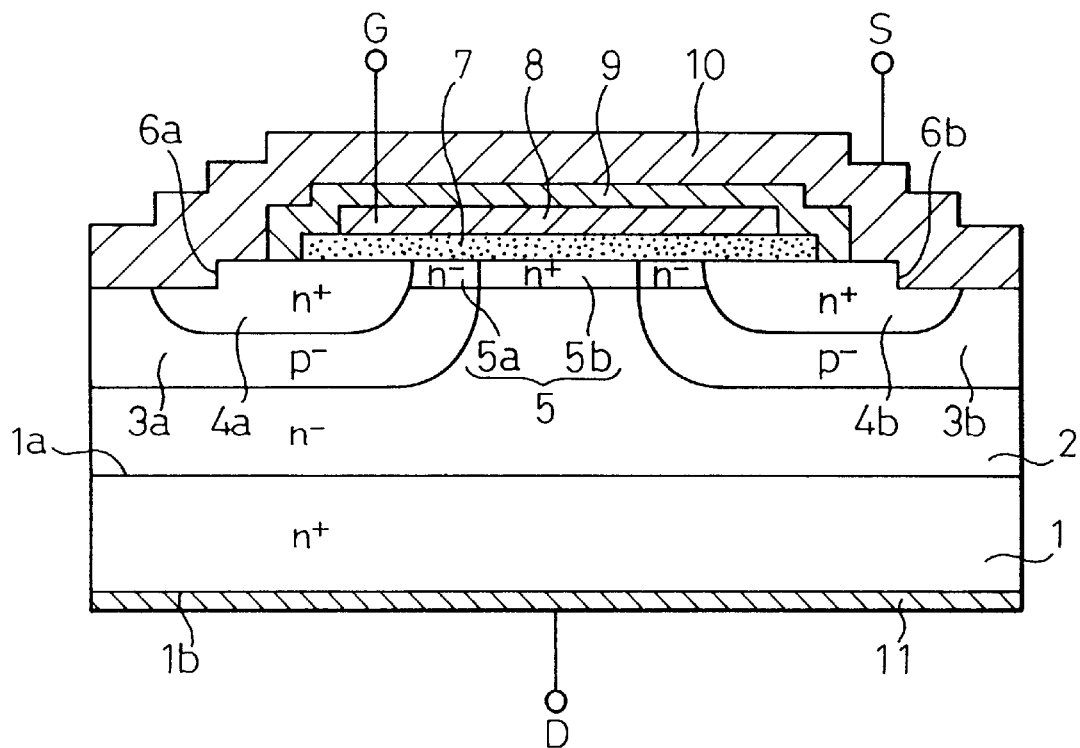
FIGS. 42 to 43 are cross-sectional views illustrating a vertical power MOSFET according to another embodiment of the invention.

In the previous embodiment, the surface channel layer 5 is formed by direct ion implantation into the surface section of the n⁻ type silicon carbide epi-layer 2 and the surface sections (surface layers) of the p⁻ type silicon carbide base regions 3a, 3b, but as shown in FIG. 42, an n⁻ type surface channel layer 5 is epitaxially grown over them, after which the n-type impurity concentration at the sections other than the channel region of the surface channel layer 5 may be selectively raised by a photo step and ion implantation. However, because this procedure increases the number of production steps, it is preferred for vertical power MOSFETs to be produced by the method of the previous embodiment.

(Seventh Embodiment of the Invention)

Figure 43:
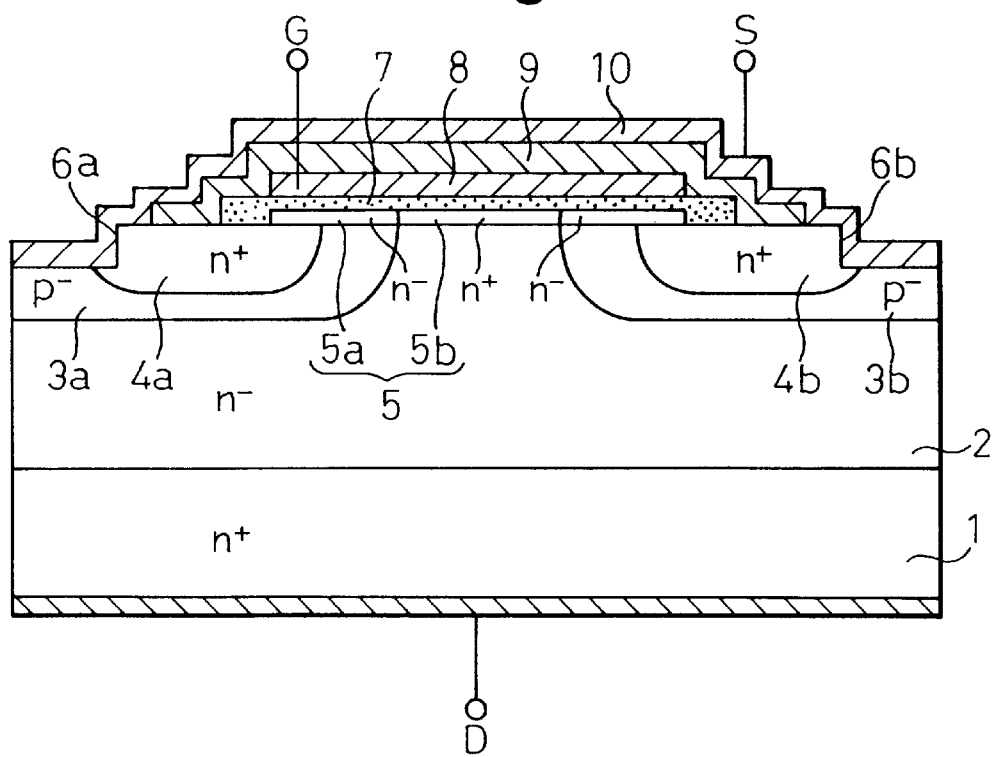

Also, as shown in FIG. 43, after formation of the n⁺ type source regions 4a, 4b, when a surface channel layer 40 is epitaxially grown on the surfaces of the n⁺ type source regions 4a, 4b or the p⁻ type silicon carbide base regions 3a, 3b and n⁻ type silicon carbide epi-layer 2, the sections other than the channel region may be formed as an n⁺ type layer. However, in this case as well, since the number of production steps must be increased by epitaxial growth of the surface channel layer followed by ion implantation as in the case shown in FIG. 42, the process according to the previous embodiment is more effective.

(Eighth Embodiment)

In the MOSFET shown in FIG. 31, an n-type impurity is ion implanted into the p⁻ type silicon carbide base regions 3a, 3b, the p-type impurity in the p⁻ type silicon carbide base regions 3a, 3b is compensated by a corresponding amount of n-type impurity (in the case of a low activation rate, however, the doping amount is increased), and ion implantation of the n-type impurity is continued until the desired carrier concentration is reached, to form a surface channel layer 5a. The surface channel layer 5a therefore contains large amounts of neutral impurities in addition to the n-type impurity carrier.

Thus, the problem of reduced carrier mobility was found to occur because large amounts of neutral impurities are included in the surface channel layer 5 which functions as the channel region.

Furthermore, a greater amount of the p-type impurity means a greater amount of ion implantation of the n-type impurity is required to compensate for the p-type impurity. Thus, ion-implantation defects are increased, leading to the problems of possible leaking and lower "blocking voltage".

These problems are not limited to the planar-type MOSFET shown in FIG. 31, as the same can be said for all semiconductor devices which invert conductivity types to form channel regions by ion implantation in semiconductors containing impurities of different conductivity types.

This embodiment was carried out in light of these considerations, and its first object is to provide a silicon carbide semiconductor with satisfactory carrier mobility even when the channel regions are formed by ion implantation and which can prevent leaks from defects due to ion implantation, as well as process for its production.

It is a second object to provide a semiconductor substrate suited for fewer neutral impurities in channel regions even in cases where the channel regions are formed by ion implantation.

This eighth embodiment is characterized in that an impurity of a first conductivity type is ion implanted into the surface section of semiconductor layers (3a, 3b) of a second conductivity type, with a surface channel layer (5) formed in such a manner as to connect the source regions (4a, 4b) with the drain layer (2), in such a manner that the concentration of the impurity of the second conductivity type lying in the surface channel layer is lower than the concentration of the impurity of the second conductivity type lying in the regions of the semiconductor layers (3a, 3b) situated below the surface channel layer.

If the concentration of the impurity of the second conductivity type lying in the surface channel layer is thus lower than the concentration of the impurity of the second conductivity type lying in the regions of the semiconductor layers situated below the surface channel layer, that is if the concentration of the impurity of the second conductivity type in the semiconductor layers at the sections forming the surface channel layer is lower than in the other sections of the semiconductor layers, then it is possible to reduce the neutral impurities formed by ion implantation. Since the amount of ion implantation is reduced, crystallization defects in the surface channel layer are also reduced. This allows the carrier mobility to be improved even when a surface channel layer is formed by ion implantation.

It preferably has a channel layer of the second conductivity type formed by ion implantation of an impurity of the second conductivity type in the surface layer section of the semiconductor layers, such that the concentration of the impurity of the first conductivity type lying in the channel layer is lower than the concentration of the impurity of the first conductivity type lying in the regions of the semiconductor layers situated below the channel layer.

Furthermore, in silicon carbide semiconductor devices wherein the impurity of the second conductivity type is ion implanted into the surface section of the semiconductor layers of the first conductivity type made of silicon carbide for inversion to make a channel region in the sections in which the impurity of the second conductivity type has been implanted, the concentration of the impurity of the first conductivity type lying in the channel region may be lower than the concentration of the impurity of the first conductivity type lying in the sections of the semiconductor layers situated below the channel region.

If the concentration of the impurity of the second conductivity type in the semiconductor layers (3a, 3b) is high, conversion to the first conductivity type will require offsetting the impurity of the second conductivity type by introduction of a high concentration of impurity of the first conductivity type, and when it is subsequently attempted to introduce the impurity of the first conductivity type at the desired concentration, that desired concentration will sometimes fall within the region of error for the concentration of the impurity of the first conductivity type introduced to offset the impurity of the second conductivity type, and as a result it will be difficult to achieve the desired impurity concentration of the first conductivity type. In other words, the controllability will be reduced. For example, if the region where the p-type impurity concentration is $10^{18}/cm^3$ is to be brought to an n-type impurity concentration of $10^{16}/cm^3$, when the n-type impurity is introduced at $10^{18}/cm^3$ to offset the p-type impurity an error on the order of $10^{16}/cm^3$ can easily occur, so that when it is attempted to realize a final n-type impurity concentration on the order of $10^{16}/cm^3$, the desired concentration falls within the range of error for the offsetting impurity concentration, making it difficult to achieve high control of the n-type impurity concentration.

Here, if the impurity concentration of the second conductivity type in the surface sections (channel layer-forming regions) of the semiconductor layers (3a, 3b) is made lower than the sections of the semiconductor layers (3a, 3b) which are further inward, then upon conversion to the first conductivity type region it will be possible to achieve the desired impurity concentration of the first conductivity type with a high degree of control, even when the desired impurity concentration of the first conductivity type is low.

The process used to fabricate a semiconductor device such as described above is characterized by comprising an outward diffusion step whereby the impurity of the second conductivity type lying in the surface sections of the semiconductor layers (3a, 3b) is diffused out from the semiconductor layers, a step of ion implantation into the surface sections of the semiconductor layers to form a surface channel layer (5) made of a channel region, and a step of forming on prescribed regions of the surface layer sections of the semiconductor layers source regions (4a, 4b) of the first conductivity type which contact with the surface channel layer and are shallower than the depth of the semiconductor layers.

Thus, after diffusion of the impurity of the second conductivity type lying in the surface layer sections of the semiconductor layers outward from the semiconductor layers, ion implantation is used to form a surface channel layer, which allows formation of the surface channel layer after having minimized the impurity of the second conductivity type which will be offset, and therefore the neutral impurities in the surface channel layer can be reduced while the amount of ion implantation can also be reduced. This allows improvement in the carrier mobility in the surface channel layer and results in fewer crystal defects in the surface channel layer.

It also comprises an outward diffusion step whereby the impurity of the first conductivity type lying in the surface sections of the semiconductor layers is diffused out from the semiconductor layers, and a step of ion implantation into the surface sections of the semiconductor layers to form a channel layer of the second conductivity type.

It may also have an outward diffusion step whereby the impurity of the first conductivity type lying in the surface sections of the semiconductor layer is diffused out from the semiconductor layers, and the ion implantation for formation of the channel region is carried out after the diffusion step.

Thus, the ion implantation step for formation of the channel region may be carried out after the outward diffusion step.

The outward diffusion step can also be accomplished by forming diffusion films on the semiconductor layers and diffusing the impurity into the diffusion films. Specifically, silicon oxide may be used as the diffusion film material.

The outward diffusion step can also be accomplished by heat treatment in a reduced pressure atmosphere for diffusion of the impurity in the atmosphere.

It may also have a semiconductor layer of the first conductivity type, with the impurity of the first conductivity type in the surface layer sections of the semiconductor layer diffused out from the semiconductor layer so that the concentration of the impurity of the first conductivity type lying in the surface sections is lower than the concentration of the impurity of the first conductivity type lying inward from the surface sections of the semiconductor layer.

Thus, a silicon carbide semiconductor substrate is utilized which has a lower concentration of the impurity of the first conductivity type in the surface sections of the semiconductor layer than the concentration in the inner sections, and by making as the channel regions the parts of the surface layer sections of the semiconductor layer which have a low concentration, it is possible to achieve satisfactory carrier mobility in the channel region while also reducing crystal defects by ion implantation.

The concentration of the impurity of the first conductivity type may also decrease in a linear relationship with respect to the depth from the surface of the semiconductor layer. The "channel mobility" can thus be increased by creating a linear relationship between the depth from the surface of the semiconductor layer and the concentration of the impurity of the first conductivity type. In order to create such a relationship, high-temperature and prolonged heat treatment may be carried out after forming the outward diffusion films (for example, silicon oxide or silicon nitride) on the surface of the semiconductor layer.

In order to convert this relationship into a relationship according to an error function, the outward diffusion may be accomplished by heat treatment at low temperature for a short time, and for a relationship according to a logarithmic function, the outward diffusion may be accomplished by heat treatment at high temperature for a long time.

This embodiment will now be explained with reference to the drawings.

Figure 44:
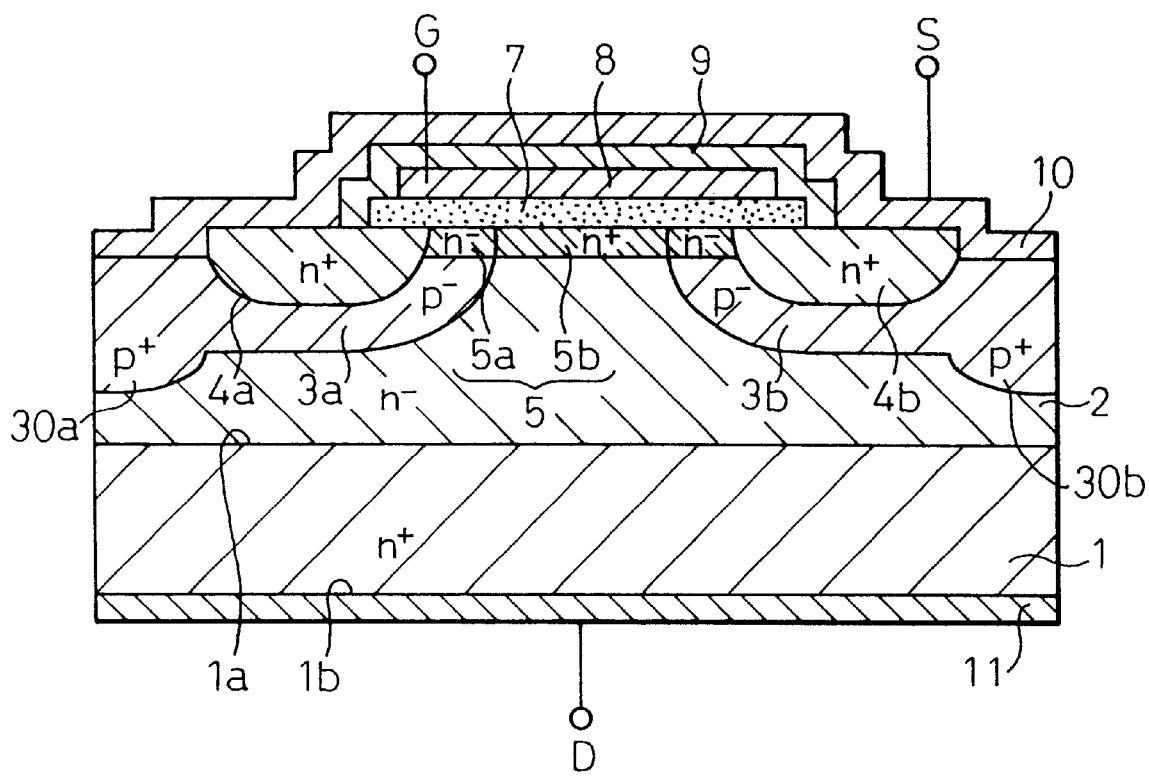
FIG. 44 is a cross-sectional view showing the structure of a silicon carbide semiconductor device according to an eighth embodiment of the present invention.

FIG. 44 shows a cross-section of a normally off-type n channel type planar MOSFET (vertical power MOSFET) according to this embodiment. This device can be suitably used for inverters or vehicle alternator rectifiers.

The structure of the vertical power MOSFET will now be explained based on FIG. 44. Since the vertical MOSFET of this embodiment has roughly the same structure as the aforementioned MOSFET of the fifth embodiment shown in FIG. 31, only the different parts will be discussed. The parts of the vertical power MOSFET of this embodiment which correspond to those of the MOSFET shown in FIG. 31 are indicated by like reference numerals.

In the MOSFET shown in FIG. 31, the channel region is constructed of a surface channel layer 5a including a large amount of neutral impurities, but in the vertical power MOSFET of this embodiment as shown in FIG. 44, the channel region is constructed of a surface channel layer 5a with a relatively low amount of neutral impurities.

Because of fewer neutral impurities inside the surface channel layer 5a, it is possible to improve the carrier mobility in the surface channel layer 5a.

The steps for producing the vertical power MOSFET with this construction as shown in FIG. 44 will now be explained with reference to FIGS. 33–40 and FIGS. 45, 46A–46C.

[Step shown in FIG. 33]

First, an n-type 4H, 6H or 3C-SiC substrate, i.e. an n$^+$ type silicon carbide semiconductor substrate 1 is prepared. The n$^+$ type silicon carbide semiconductor substrate 1 is doped with an n-type impurity to a high concentration of $1 \times 10^{18}$ cm$^{-3}$.

Here, the n$^+$ type silicon carbide semiconductor substrate 1 has a thickness of 400 μm, and the main surface 1a is the (0001) Si face, or (11$\bar{2}$0) a-face. An n$^-$ type silicon carbide epi-layer 2 is formed by epitaxial growth to a thickness of 5 μm on the main surface 1a of the substrate 1. In this example, the n$^-$ type silicon carbide epi-layer 2 is obtained in the form of crystals similar to those of the underlying substrate 1, and becomes the n-type 4H, 6H or 3C-SiC layer.

[Step shown in FIG. 34]

An LTO film 20 is situated on a predetermined region of the n$^-$ type silicon carbide epi-layer 2, and this is used as the mask for ion implantation of B$^+$ (or aluminum) to form the p$^-$ type silicon carbide base regions 3a, 3b. The ion implantation conditions are a temperature of 700° C. and a dose of $1 \times 10^{16}$ cm$^{-2}$, for a p-type impurity concentration of $1 \times 10^{18}$ cm$^{-3}$ in the p$^-$ type silicon carbide base regions 3a, 3b. Creation of such a high concentration allows punch through prevention in the p$^-$ type silicon carbide base regions 3a, 3b while also facilitating depletion of the surface channel layer 5.

Figure 45:
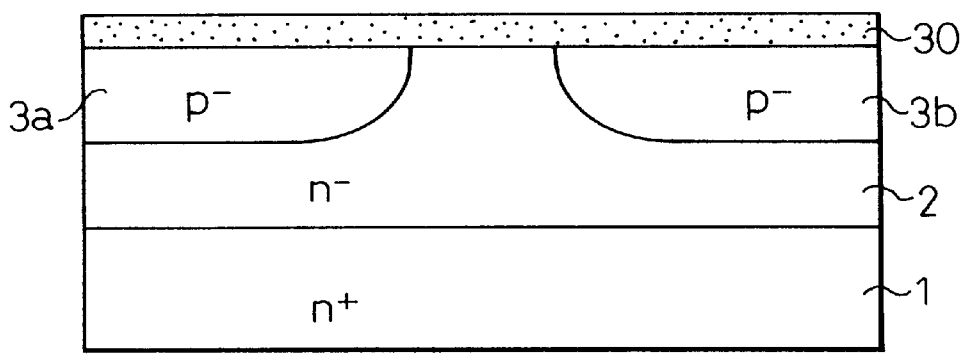
FIG. 45 is a cross-sectional view showing a step in the process for producing the silicon carbide semiconductor device shown in FIG. 44.

[Step shown in FIG. 45]

After removal of the LTO film 20, heat treatment is carried out to form a silicon oxide (SiO$_2$) film 30 on the n$^-$ type silicon carbide epi-layer 2 including the sections over the p$^-$ type silicon carbide base regions 3a, 3b. Heat treatment is continued for outward diffusion (hereunder referred to as outward diffusion step). Specifically, the heat treatment is at 1300° C. for 0.5 hour.

Because the silicon oxide film 30 is formed on the p$^-$ type silicon carbide base regions 3a, 3b creating relatively lower diffusion resistance, this heat treatment causes the impurities lying in the surface sections of the p$^-$ type silicon carbide base regions 3a, 3b to diffuse out into the silicon oxide film 30.

Figure 46A:
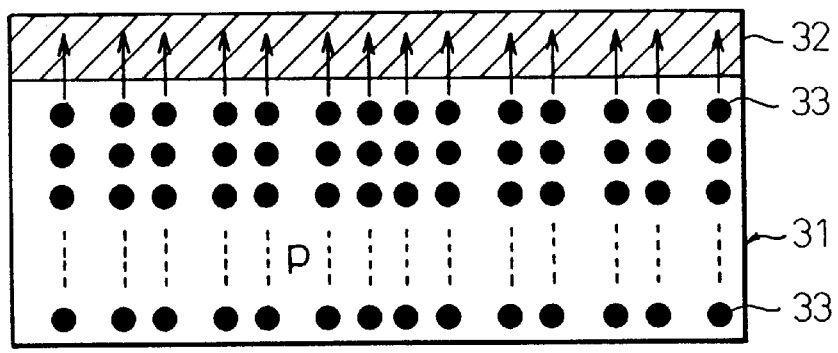
FIGS. 46A–46C are illustrations of the external diffusion steps.
Figure 46B:
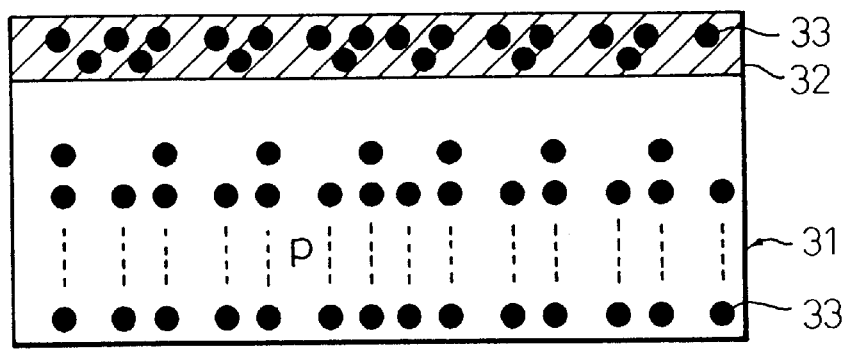
Figure 46C:
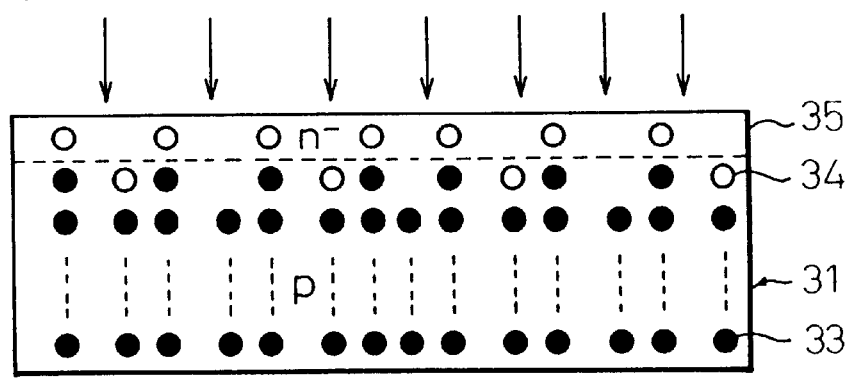

This outward diffusion step will now be explained using a case where silicon oxide 32 is formed as a film on a p-type semiconductor substrate 31. FIGS. 46A–46C illustrate an outward diffusion step where silicon oxide 32 has been formed as a film on a p-type semiconductor substrate 31. FIGS. 46A–46C include not only the outward diffusion step shown in FIG. 46C but also an additional step of ion implantation of an n-type impurity, described hereunder, to form the channel region as shown in FIG. 35, and this explanation will include the ion implantation step. Specifically, FIG. 46A shows the state during the outward diffusion step, FIG. 46B shows the state after the outward diffusion step, and FIG. 46C shows the state of the ion implantation step after the outward diffusion step.

As shown in FIG. 46A, prior to the outward diffusion step the p-type impurity 33, such as boron, is essentially uniformly present from the surface of the p-type semiconductor substrate 31 to its interior. As shown by the arrows, the outward diffusion step causes outward diffusion of the p-type impurity 33 lying at the surface side of the p-type semiconductor substrate 31 into the silicon oxide film 32.

Also, as shown in FIG. 46B, the p-type impurity 33 is reduced at the surface side of the p-type semiconductor substrate 31 after the outward diffusion step, causing the p-type impurity 33 which was lying at the surface side of the p-type semiconductor substrate 31 to become shifted into the silicon oxide film 32.

Afterwards, a fluoric acid-containing aqueous solution is used as the etching solution to remove the silicon oxide 32, and as shown in FIG. 46C, ion implantation of an n-type impurity 34 forms an n-type semiconductor layer 35 on the surface of the p-type semiconductor substrate 37.

Figure 47B:
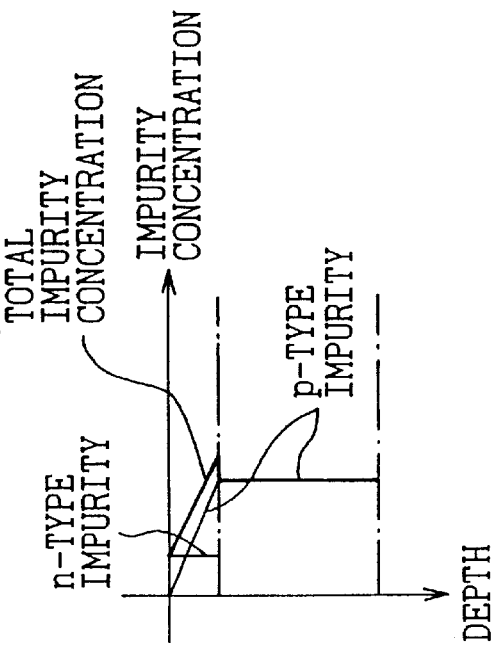
FIGS. 47A, 47B, 48A and 48B show comparison between the case in which an external diffusion is caused and the case in which an external diffusion is not caused.
Figure 48B:
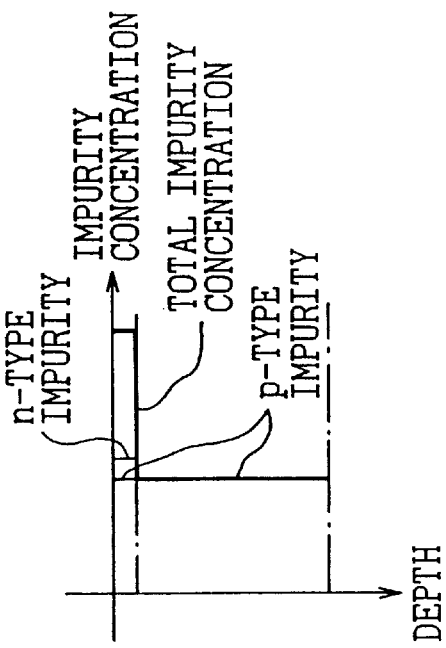
Figure 47A:
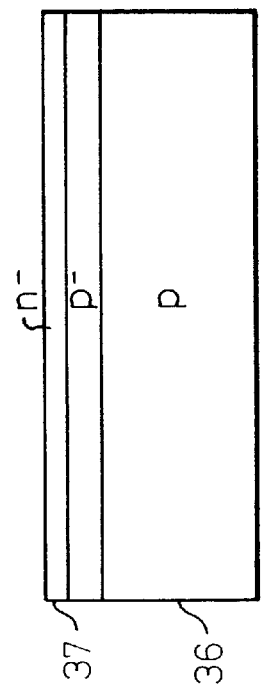
Figure 48A:
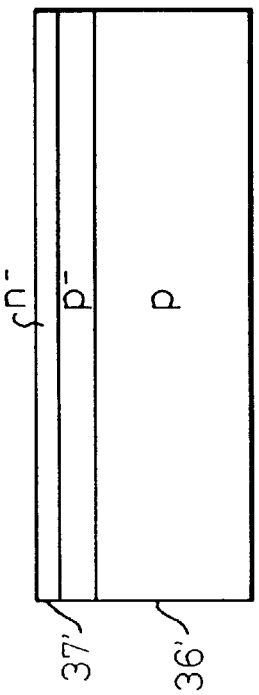

FIGS. 47A and 47B show the results of determining the impurity concentration in the p-type semiconductor substrate 36 on which the n-type semiconductor layer 37 has been formed, for a case where an outward diffusion step is carried out. FIGS. 48A and 48B show the results of determining the impurity concentration in the p-type semiconductor substrate 36' on which the n-type semiconductor layer 37' has been formed, for a case where no outward diffusion step is carried out. The vertical axes in FIGS. 47B and 48B indicate depth while the horizontal axes indicate the impurity concentration, the depth on the vertical axis corresponding to the depth from the surface of the p-type semiconductor substrates 36, 36' shown at left in the illustrations.

As shown in FIGS. 47A and 47B, the p-type impurity concentration in the n-type semiconductor layer 36 is low when the outward diffusion step has been carried out, and it will be understood that even with addition of the n-type impurity the total impurity concentration, as a sum of the p-type impurity concentration and the n-type impurity concentration, is low.

However, when no outward diffusion step has been carried out, as shown in FIGS. 48A and 48B, the p-type impurity concentration at the surface side of the n-type semiconductor layer 36 is not lower, and it will be understood that when the n-type impurity is added the total impurity concentration, as a sum of the p-type impurity concentration and the n-type impurity concentration, is greatly increased as a result.

As is clear from these results, by reducing the amount of the p-type impurity lying in the surface sections of the p-type silicon carbide base regions 3a, 3b through the outward diffusion step, it is possible to reduce the amount of neutral impurities introduced by ion implantation of the n-type impurity.

Furthermore, because of the lower ion implanted amount of the n-type impurity required to compensate for the p-type impurity, it is also possible to reduce crystal defects due to the ion implantation.

[Step shown in FIG. 35]

After removal of the silicon oxide film 30, the n-type impurity is ion implanted in the manner described above. Specifically, ion implantation of N$^+$ is effected from the top of the substrate 1 to form a surface channel layer 5 on the surface sections (surface layer portions) of the p$^-$ type silicon carbide base regions 3a, 3b, while an n$^+$ type layer 5b is formed to a thickness of about 0.3 μm on the surface layer portion of the n$^-$ type silicon carbide epi-layer 2. The ion implantation conditions are a temperature of 700° C. and a douse of $1 \times 10^{13}$ to $1 \times 10^{14}$ cm$^{-2}$.

As mentioned above, the surface sections (surface layer portions) of the p$^-$ type silicon carbide base regions 3a, 3b have a reduced amount of the p-type impurity due to the outward diffusion step, and therefore the surface channel layer 5a is formed with few neutral impurities. It is thus possible to improve the carrier mobility of the surface channel layer 5a.

Furthermore, because of the lower amount of the n-type impurity which must be ion implanted to compensate for the p-type impurity in the p$^-$ type silicon carbide base regions 3a, 3b, it is possible to reduce crystal defects due to the ion implantation. Leak current due to crystal defects can therefore be prevented.

Also, in order to obtain a normally OFF-type vertical power MOSFET, the thickness (film thickness) of the surface channel layer 5a is determined based on the equation given below. In order to obtain a normally OFF-type vertical power MOSFET, it is necessary for it to have a sufficient barrier height so that the extended depletion layer in the n$^-$ type layer does not impede the electrical conductance when no gate voltage is being applied. The conditions are represented by the following equation.

$$T_{epi} = \sqrt{2\varepsilon_s/q \cdot \{(N_D + N_A)/N_D N_A\} \cdot V_{built}} + \sqrt{2\varepsilon_s/q \cdot N_D \cdot \{\phi_{ms} - (Q_s + Q_{fc} + Q_i + Q_{ss})/C_{oxide}\}} \quad (4)$$

Here, $T_{epi}$ is the thickness of the extended depletion layer in the n$^-$ type layer.

The first expression on the right side of equation (4) is the degree of extension of the depletion layer due to built-in voltage $V_{built}$ at the PN junction between the surface channel layer 5a and the p$^-$ type silicon carbide base regions 3a, 3b, i.e. the degree of extension of the depletion layer from the p$^-$ type silicon carbide base regions 3a, 3b to the surface channel layer 5a, and the second expression is the degree of extension of the depletion layer due to the charge and $\phi_{ms}$ of the gate insulating film 7, that is, the degree of extension of the depletion layer from the gate insulating film 7 to the surface channel layer 5a. Consequently, if the sum of the extension of the depletion layer from the p$^-$ type silicon carbide base regions 3a, 3b and the extension of the depletion layer from the gate insulating film 7 is made greater than the thickness of the surface channel layer 5a, the vertical power MOSFET can be made as a normally OFF type, and therefore the surface channel layer 5a is formed under ion implantation conditions which meet such a condition.

Since this normally OFF type vertical power MOSFET can be made so that current does not flow even when no voltage can be applied to the gate electrode due to a device failure or the like, it is possible to ensure greater safety than with a normally ON type.

Also, as shown in FIG. 44, the p$^-$ type silicon carbide base regions 3a, 3b are in contact with the source electrode 10 and thus grounded. Consequently, the built-in voltage $V^{built}$ at the PN junction between the surface channel layer 5a and the p$^-$ type silicon carbide base regions 3a, 3b can be utilized to bring the surface channel layer 5a to a pinch-off state. For example, when the p$^-$ type silicon carbide base regions 3a, 3b are not grounded and are in a floating state, the depletion layer cannot be extended from the p$^-$ type silicon carbide base regions 3a, 3b by utilizing the built-in voltage $V_{built}$, and therefore the contact between the p$^-$ type silicon carbide base regions 3a, 3b and the source electrode 10 may be considered an effective structure for bringing the surface channel layer 5 to a pinch-off state. According to this embodiment, the p$^-$ type silicon carbide base regions 3a, 3b are formed with a low impurity concentration, but the built-in voltage $V_{built}$ can be utilized even more with a high impurity concentration.

Furthermore, in this embodiment the vertical power MOSFET is produced with silicon carbide, because when the production is accomplished using silicon it becomes difficult to control the degree of thermal diffusion during formation of the impurity layers of the p$^-$ type silicon carbide base regions 3a, 3b and the surface channel layer 5a, etc., thus complicating efforts to produce a normally OFF-type MOSFET with the same structure described above. Consequently, by using SiC as according to this embodiment, it is possible to produce a vertical power MOSFET with more precision than by using silicon.

In addition, in order to obtain a normally OFF-type vertical power MOSFET it is necessary to set the thickness of the surface channel layer 5a so that it satisfies the condition of equation (4) above; however, because the $V_{built}$ is low when silicon is used, it becomes necessary to form the surface channel layer 5a with a low thickness and with a low impurity concentration, making it difficult to control the degree of diffusion of the impurity ions, and this greatly complicates production. Yet, when SiC is used the $V_{built}$ is about 3 times higher than with silicon, allowing formation of a thick n⁻ type layer and a high impurity concentration, and it therefore becomes easier to produce a normally OFF accumulation-type MOSFET.

[Step shown in FIG. 36]

An LTO film 21 is situated on a predetermined region of the surface channel layer 5a, and this is used as the mask for ion implantation of N⁺ to form the n⁺ type source regions 4a, 4b. The ion implantation conditions are a temperature of 700° C. and a douse of $1 \times 10^{13}$ to $1 \times 14$ cm⁻².

[Step shown in FIG. 37]

After removal of the LTO film 21, the photoresist method is used to place an LTO film 22 on a predetermined region of the surface channel layer 5a, and this is used as a mask for partial etching removal of the surface channel layer 5a on the p⁻ type silicon carbide base regions 3a, 3b by RIE.

[Step shown in FIG. 38]

Also, the LTO film 22 is used as a mask for B⁺ ion implantation to form deep base layers 30a, 30b. This creates thicker sections on the base regions 3a, 3b. The deep base layers 30a, 30b are formed on sections not overlapping the n⁺ type source regions 4a, 4b, and the thickened sections where the deep base layers 30a, 30b are formed in the p⁻ type silicon carbide base regions 3a, 3b have a higher impurity concentration than the thinner sections on which the deep base layers 30a, 30b are not formed.

[Step shown in FIG. 39]

After removal of the LTO film 22, a gate insulating film (gate oxide film) 7 is formed by wet oxidation on the substrate. Here, the atmosphere temperature is 1080° C.

A polysilicon gate electrode 8 is then accumulated on the gate insulating film 7 by LPCVD. The film forming temperature here is 600° C.

[Step shown in FIG. 40]

Next, after removal of the undesired portions of the gate insulating film 7, an LTO insulating film 9 is formed to cover the gate insulating film 7. More specifically, the film-forming temperature is 425° C. and annealing is performed at 1000° C. after film formation.

Following this, a source electrode 10 and drain electrode 11 are created by metal sputtering at room temperature. Annealing is then performed at 1000° C. after the film formation, thus completing the vertical power MOSFET shown in FIG. 44.

The function (operation) of the vertical power MOSFET will now be explained.

This MOSFET operates in normally OFF accumulation mode, so that when no voltage is being applied to the polysilicon gate electrode, the carrier of the surface channel layer 5a is totally depleted by the potential created by the difference in the static potentials of the p⁻ type silicon carbide base regions 3a, 3b and surface channel layer 5a, and the difference in the work functions of the surface channel layer 5a and the polysilicon gate electrode 8. Applying a voltage to the polysilicon gate electrode 8 changes the potential difference produced by the sum of the difference in the work functions of the surface channel epi-layer 5 and the polysilicon gate electrode 8, and the externally applied voltage. This allows control of the channel state.

In other words, if the work function potential of the polysilicon gate electrode 8 is defined as the first work function potential, the work function potential of the p⁻ type silicon carbide base regions 3a, 3b is defined as the second work function potential, and the work function potential of the surface channel layer 5a is defined as the third work function potential, then the difference in the first to third work function potentials may be utilized, setting the first to third work functions and the impurity concentration and film thickness of the surface channel layer 5a so that the n-type carrier in the surface channel layer 5a is depleted.

Also, in the OFF state, a depletion region is formed in the surface channel layer 5a by the electric field generated by the p⁻ type silicon carbide base regions 3a, 3b and the polysilicon gate electrode 8. When a positive bias is supplied to the polysilicon gate electrode 8 in this state, a channel region is formed extending from the n⁺ type source regions 4a, 4b in the direction of the n⁻ type drift region 2, at the interface between the gate insulating film (SiO₂) 7 and the surface channel layer 5a, so that switching is effected to the ON state. Here, the electrons flow from the n⁺ type source regions 4a, 4b through the surface channel layer 5a and from the surface channel layer 5a to the n⁻ type silicon carbide epi-layer 2. Also, upon reaching the n⁻ type silicon carbide epi-layer 2 (drift region), the electrons flow vertically with respect to the n⁺ type silicon carbide semiconductor substrate 1 (n⁺ drain).

Because the surface channel layer 5a is formed with a low amount of neutral impurities it is possible to improve the channel shift, and since the amount of ion implantation for formation of the surface channel layer 5a is lower, it is possible to reduce crystal defects due to the ion implantation and thus prevent leakage due to crystal defects.

(Ninth Embodiment)

The eighth embodiment described above was explained for application of an embodiment of the invention to a vertical power MOSFET wherein the current flows in the vertical direction (direction of substrate thickness), but this next embodiment will be explained for application of an embodiment of the invention to a MOSFET wherein the current flows in the substrate lateral direction (direction parallel to the substrate surface).

Figure 49:
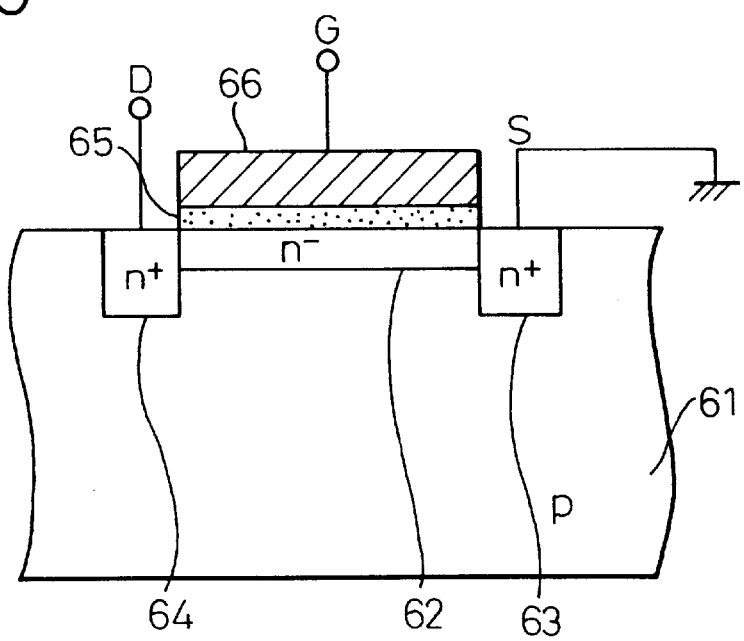
FIG. 49 is a cross-sectional view showing the structure of a silicon carbide semiconductor device according to a ninth embodiment of the present invention.

FIG. 49 shows a MOSFET according to this embodiment. As shown in this illustration, a channel layer 62 is formed as the channel region on the surface section of a p-type semiconductor substrate 61. The channel layer 62 is constructed with few neutral impurities. Also, a source contact n⁺ type region 63 is formed at one end of the channel layer 62 while a drain contact n⁺ type region 64 is formed at the other end. A gate electrode layer 66 is also formed on the channel layer 62 via a gate oxide film 65.

In the MOSFET constructed in this manner, the channel region is the channel layer 62 formed on the surface section of the p-type semiconductor substrate 61, and current flows in the lateral direction of the p-type semiconductor substrate 61.

Because the channel layer 62 is constructed with few neutral impurities as explained above, it is possible to improve the carrier mobility.

A process for producing the MOSFET shown in FIG. 50 will now be explained with reference to FIGS. 51–53.

Figure 50:
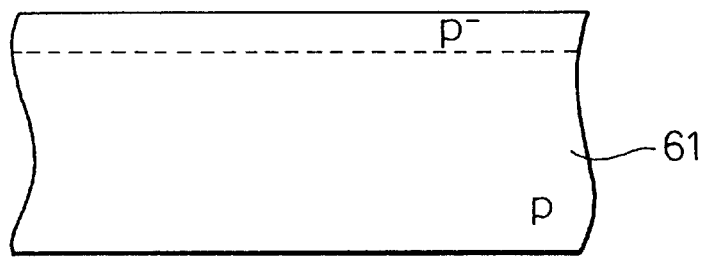
FIGS. 50–52 are cross-sectional views showing a process for producing the silicon carbide semiconductor device shown in FIG. 49.

[Step shown in FIG. 50]

First, a p-type semiconductor substrate 61 is prepared with a low amount of p-type impurity in the surface section. The p-type semiconductor substrate 61 can be produced by the outward diffusion step described for the aforementioned first embodiment, using a semiconductor substrate with the p-type impurity uniformly present throughout the interior. The p-type semiconductor substrate 61 is suitable for manufacturing the MOSFET shown in FIG. 49.

Figure 51:
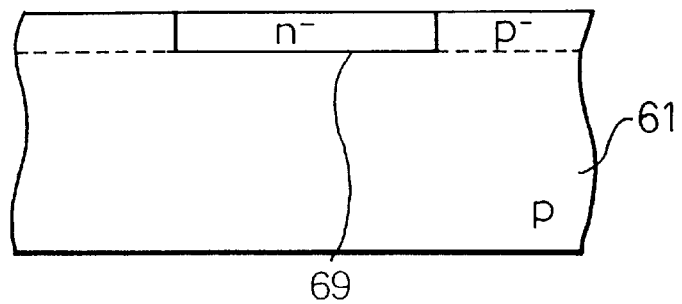

[Step shown in FIG. 51]

An oxide film is formed on the surface of the p-type semiconductor substrate 61, and openings are formed at prescribed regions of the oxide film (not shown) by a photolithography step. The oxide film is used as a mask for ion implantation of an n-type impurity (for example, $N^+$, etc.) to form the channel layer 69.

Since the channel layer 69 is formed on the surface section of the p-type semiconductor substrate 61 with a low amount of the p-type impurity, the channel layer 62 is formed with few neutral impurities. Furthermore, because of the lower ion implanted amount of the n-type impurity required to compensate for the p-type impurity, it is also possible to reduce crystal defects due to the ion implantation.

Figure 52:
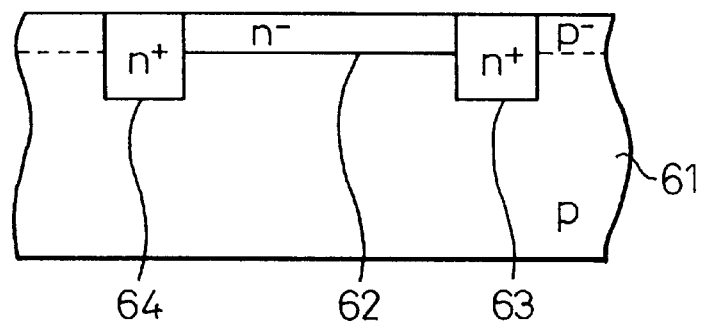

[Step shown in FIG. 52]

After removal of the silicon oxide film, a silicon oxide film (not shown) is again formed on the surface of the p-type semiconductor substrate 61, and openings are formed at prescribed regions of the oxide film by a photolithography step. The oxide film is used as a mask for ion implantation of an n-type impurity (for example, $N^+$, etc.) to form a source contact $n^+$ type layer 63 and a drain contact $n^+$ type layer 64.

After subsequently removing the oxide film, the gate oxide film 65 and gate electrode 66 are formed in that order, and then the source electrode layer and drain electrode layer are formed via an interlayer insulating film (not shown), to complete the MOSFET shown in FIG. 49.

It is thus possible to apply an embodiment of the invention to a MOSFET wherein the current flows in the lateral direction.

The eighth and ninth embodiments were explained using a MOSFET as an example, but the invention can also be applied to other forms of FETs. For example, the application may be for a lateral-type MESFET, or for a trench gate-type MOSFET with a trench formed in the substrate and the channel regions formed on the side walls of the trench.

Since in the eighth embodiment heat treatment is carried out under the above-described conditions (high temperature, prolonged time), the concentration of the p-type impurity is in a linear relationship with respect to the depth from the substrate surface (see FIGS. 47A, 47B, 48A and 48B), but it may also be in a logarithmic function relationship with respect to the depth, or it may even be in an error function relationship.

For example, in order to create a logarithmic function relationship the heat treatment may be carried out either at a high temperature or for a prolonged time, and in order to create an error function relationship the heat treatment may be carried out at a low temperature and for a shorter time than the heat treatment described for the eighth embodiment. However, since the carrier mobility can be increased by creating a linear relationship as described in the above embodiment, the heat treatment conditions given above are considered to be preferable.

Also, although the silicon oxide film 30 for outward diffusion was formed by heat oxidation in the eighth and ninth embodiments, it may also be formed by other processes (for example, deposition).

The outward diffusion can also be achieved by forming a silicon nitride film or aluminum nitride film instead of the silicon oxide film 30.

For example, a silicon nitride film can be formed by heat oxidation in a nitrogen atmosphere, by heat oxidation in an oxygen/nitrogen atmosphere or by heat oxidation after doping with nitrogen. A silicon nitride film is an insulating film with a high dielectric constant and a high band gap, and is therefore effective when used for passivation.

Outward diffusion can still be accomplished even if no film is formed for outward diffusion. For example, it can be achieved by heat treatment in a vacuum at high temperature. That is, diffusion of the impurity is not achieved because of a large diffusion resistance, but since diffusion of the impurity will occur under conditions which give a low diffusion resistance, it is not always necessary to form a film for outward diffusion.

Furthermore, in the embodiment described above the ion implantation of the n-type impurity is effected after removal of the silicon oxide film 30, but the silicon oxide film 30 can also be used as the mask during ion implantation. This allows the number of production steps to be reduced. The same applies for cases where a silicon nitride film or the like is used instead of the silicon oxide film 30.

(Tenth Embodiment)

In the vertical power MOSFET shown in FIG. 31, the deep base layers 30a, 30b are formed deep by ion implantation from the surface of the $n^-$ type silicon carbide epi-layer 2.

The nature of silicon carbide, however, is such that the projection range of impurities introduced by ion implantation is shorter than with silicon, and its smaller diffusion coefficient almost totally prevents movement of introduced impurity atoms even when heat treatment is carried out; thus, formation of the deep base layers 30a, 30b has been difficult as it requires a large ion implantation energy.

This embodiment was provided in light of such circumstances, and its object is to provide a process for fabricating a silicon carbide semiconductor device in which deep base layers with partially deepened base regions can be formed with a low ion implantation energy.

In order to achieve the aforementioned object, this embodiment has trenches (70, 80) formed through the source regions (4a, 4b) and reaching to the semiconductor layer (2), and ion implantation is carried out in prescribed regions of the semiconductor layer including the source regions and the trenches, to form base regions (3a, 3b, 30a, 30b) of a second conductivity type.

By formation of these trenches it is thus possible to accomplish ion implantation to a partial high depth in the sections of the trenches, and the deepened sections can serve as the deep base layers (30a, 30b). Consequently, there is no need to perform ion implantation at high energy in order to form the deep base layers. The deep base layers can therefore be formed by low-energy ion implantation.

The tenth embodiment comprises a step of laminating in order a first and second mask material (71, 72) on the semiconductor layer (2), a step of forming a first opening (72a) in the second mask material (72), a step of etching the first mask material (71) through the first opening to form a second opening (71a) which is larger than the first opening, a step of using the second mask material for ion implantation through the first opening to form source regions (4a, 4b) of a first conductivity type, a step of accumulating a third mask material (74) on the second mask material which contains the first opening, a step of anisotropic etching back the third mask material until the second mask material is exposed, leaving the third mask material within the first opening, a step of etching using the second mask material and third mask material as masks to form a trench (70) passing through the source regions and reaching to the semiconductor layer, a step of removing the third mask material and the second mask material, and a step of using the first mask material as a mask for ion implantation through the second opening to form base regions (3a, 3b) of a second conductivity type in prescribed regions of the semiconductor layer which include the source regions and the trenches.

In this manner, the trench is formed and ion implantation is carried out to form the base regions. Also, since etching back of the third mask material makes it possible to reduce the area of the first opening by equal spacing from the edge of each first opening, the trench can be formed at the center of the source region. The deep base regions (30a, 30b) are formed on the floors of the trenches, thus allowing the deep base layers to be formed precisely at the centers of the source regions.

Furthermore, by thus forming the first opening 72a in the second mask material (72), etching the first mask material (71) through the first opening to form a second opening (71a) which is larger than the first opening, and performing ion implantation through these first and second openings to form the base regions and source regions, a consistent spacing is achieved between the respective edges of the first and second openings, thus allowing self-aligned formation of the base regions and source regions.

Isotropic etching using a gas containing $CF_4$ will allow formation of the side walls in a roughly tapered manner to form trenches whose bottoms are generally parallel to the surface of the semiconductor layer.

By thus forming the trenches in such a manner so that their side walls are roughly tapered, it is possible to increase the shortest distance from the corner of the trench to the semiconductor layer, i.e. the thickness of the base region between them, and thus lower the internal resistance of the base region to prevent operation of a parasitic transistor.

This embodiment will now be explained with reference to the drawings.

Figure 53:
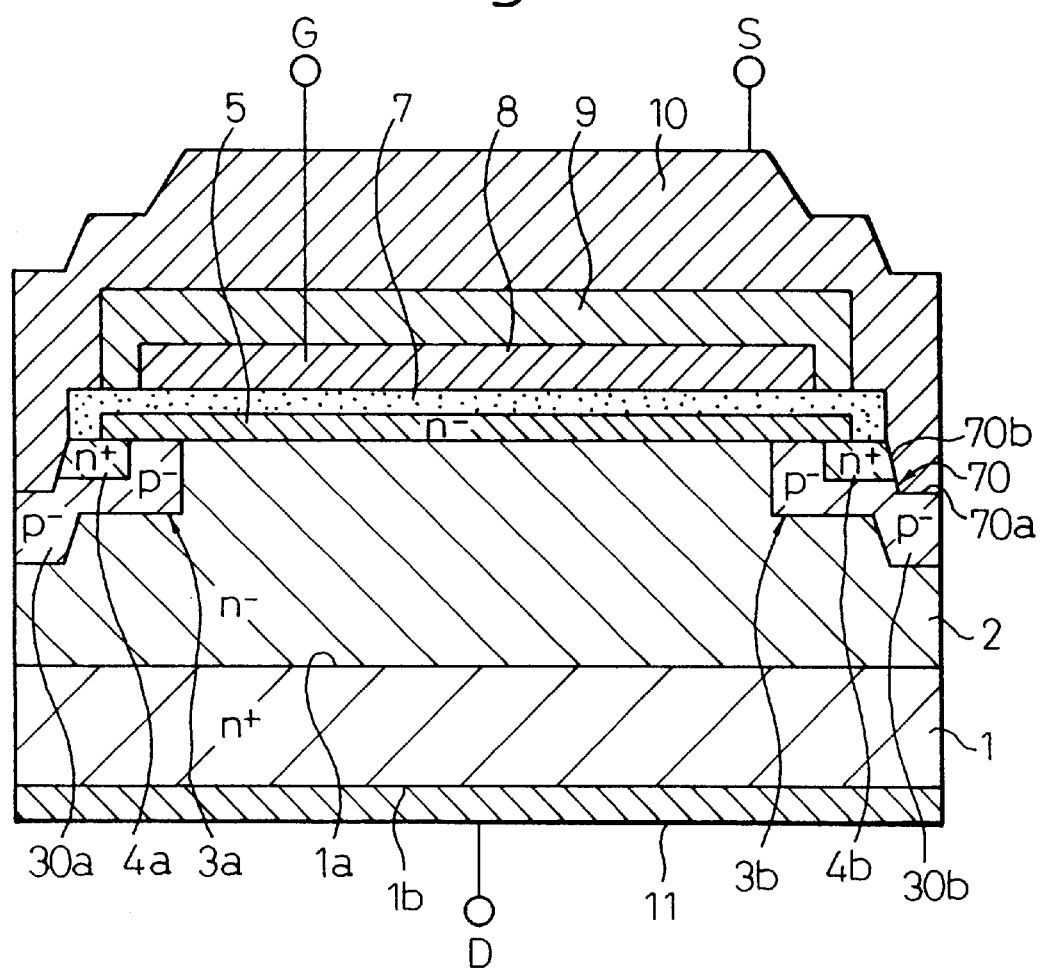
FIG. 53 is a cross-sectional view showing the structure of a silicon carbide semiconductor device according to a tenth and eleventh embodiments of the present invention.

FIG. 53 shows a vertical power MOSFET according to this embodiment. The vertical power MOSFET illustrated in FIG. 53 has almost the same construction as the vertical power MOSFET shown in FIG. 31, and therefore only the differing parts will be explained, indicating the corresponding parts with like reference numerals. As shown in FIG. 53, the surface of the n$^-$ type silicon carbide epi-layer 2 on which the p$^-$ type silicon carbide base regions 3a, 3b and the n$^+$ type source regions 4a, 4b are formed constitutes a trench 70 at the center of each of the p$^-$ type silicon carbide base regions 3a, 3b. The trench consists of the bottom 70a which is horizontal with respect to the substrate surface and side walls 70b which are roughly tapered with respect to the substrate surface, thus forming a "bathtub-like" shape.

By thus constructing a trench with tapered side walls and a deep base layer which are parallel, it is possible to increase the shortest distance from the corner of the trench to the semiconductor layer, i.e. the thickness of the base region between them, and thus lower the internal resistance of the base region to prevent operation of a parasitic transistor.

The trench 70 passes through the n$^+$ type source regions 4a, 4b, reaching to the p$^-$ type silicon carbide base regions 3a, 3b. Under the trench 70, the p$^-$ type silicon carbide base regions 3a, 3b are partially deepened, and those sections constitute the deep base layers 30a, 30b. The deep base layers 30a, 30b, which are the partially deepened sections of the p$^-$ type silicon carbide base regions 3a, 3b, constitute the bottom 70a which is horizontal with respect to the substrate surface and the side wall 70b which is roughly tapered with respect to the substrate surface, and is generally parallel to the trench 70. The deep base layers 30a, 30b are formed so that they essentially do not overlap with the n$^+$ type source regions 4a, 4b.

Here, if the side wall 70b of the trench 70 is made perpendicular to the substrate surface, this results in a much smaller shortest distance from the corner of the trench 70 to the n$^-$ type silicon carbide epi-layer 2, that is, a much smaller width of the p$^-$ type silicon carbide base regions 3a, 3b near the corner of the trench 70, so that the resistance value at these sections is increased. However, the internal resistance of the p$^-$ type silicon carbide base regions 3a, 3b is preferably reduced in order to minimize operation of a parasitic transistor formed by the n$^-$ type silicon carbide epi-layer 2, the p$^-$ type silicon carbide base regions 3a, 3b and the n$^+$ type source regions 4a, 4b. For this reason, the side walls 70b of the trench 70 and the deep base layers 30a, 30b are tapered in order to maximize the shortest distance from the corner of the trench 70 to the n$^-$ type silicon carbide epi-layer 2.

The surface channel layer 5 is situated above the surfaces of the n$^+$ type source regions 4a, 4b. This is done by forming the surface channel layer 5 after formation of the n$^+$ type base regions 4a, 4b.

The vertical power MOSFET of this embodiment differs from the one shown in FIG. 31 in the aspects described above.

The steps for production of the vertical power MOSFET shown in FIG. 53 will now be explained with reference to FIGS. 54–62. These illustrations show only the parts which differ from the production steps shown in FIGS. 13–27, omitting explanation of the corresponding parts.

First, as shown in FIG. 13, an n$^-$ type silicon carbide epi-layer 2 is formed as a film on an n$^+$ type silicon carbide semiconductor substrate 1. The following steps are then carried out in order.

Figure 54:
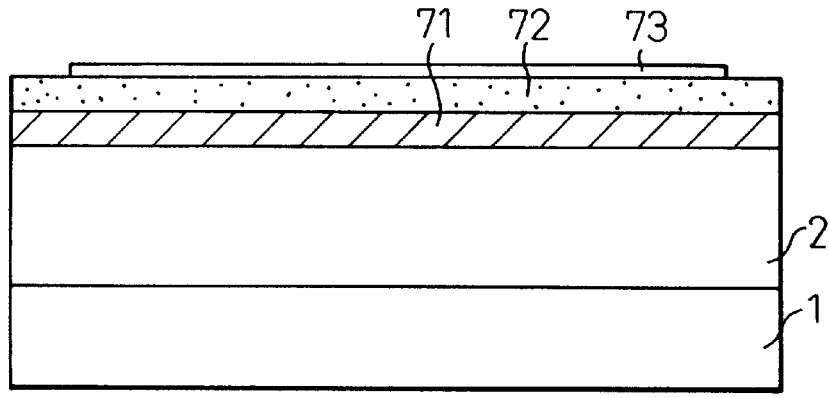
FIGS. 54–62 are cross-sectional views showing a process for producing the silicon carbide semiconductor device according to the tenth embodiment of the present invention.

[Step shown in FIG. 54]

A polysilicon film 71 is formed to the desired thickness on the n$^-$ type silicon carbide epi-layer 2, and a silicon oxide film ($SiO_2$ film) 72 is further formed thereon to the desired thickness. After accumulation of a photoresist 73, prearranged regions are opened in the photoresist to form the n$^+$ type source regions 4a, 4b.

Figure 55:
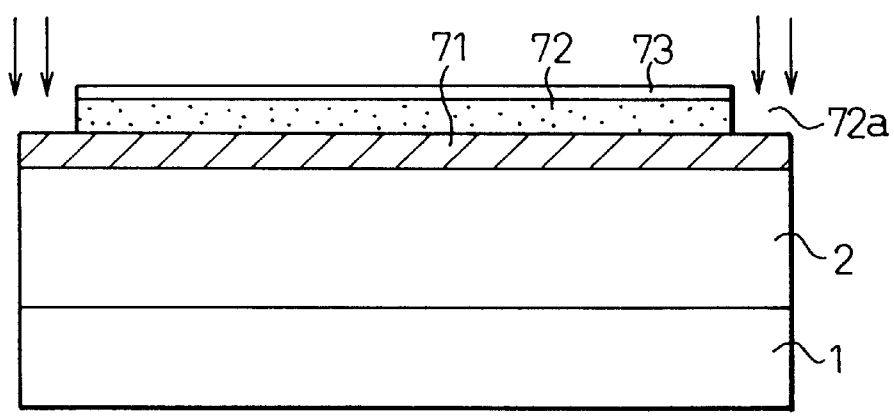

[Step shown in FIG. 55]

$CF_4+H_2$ gas is used to form openings 72a at prescribed regions in the silicon oxide film 72 by RIE (reactive ion etching) where the n$^+$ type source regions 4a, 4b are to be formed. Because $CF_4+H_2$ gas is used for the etching here, only the silicon oxide film is selectively etched, while the polysilicon film 71 remains without being etched.

Figure 56:
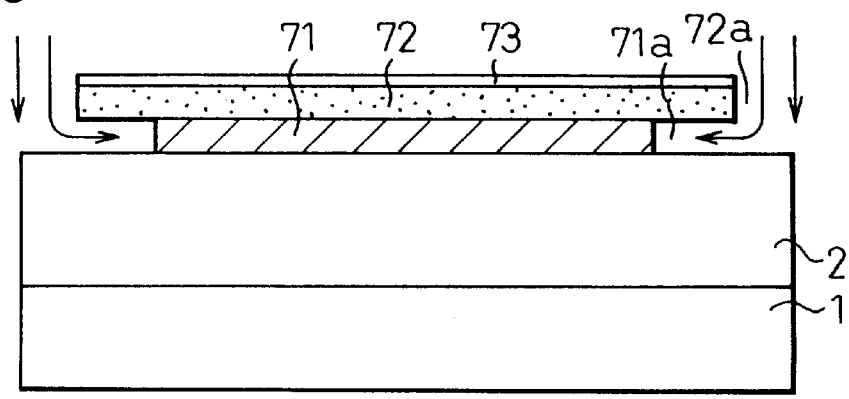

[Step shown in FIG. 56]

Next, a portion of the polysilicon film 71 is removed by dry etching using $CF_4$ gas, to form openings 71a at prescribed regions where the p$^-$ type silicon carbide base regions 3a, 3b are to be formed. Specifically, these regions are opened by etching of the polysilicon film 71 in the lateral direction. The degree of dry etching is controlled by selection of the etching material, control of the etching time, etc. Because the degree of etching occurs equally in all lateral directions of the dry etching, the spacing from the edge of the opening 72a to the edge of the opening 71a is equivalent in all directions.

Figure 57:
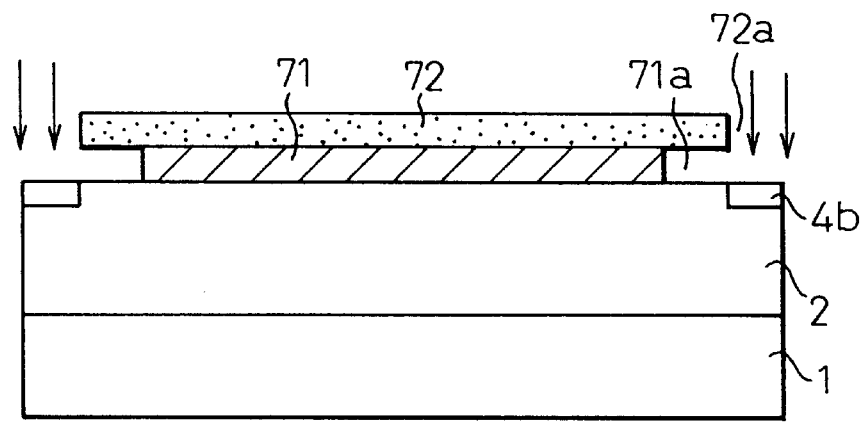

[Step shown in FIG. 57]

After removal of the photoresist 73, a silicon oxide film 72 is used as a mask for ion implantation to form the n source regions 4a, 4b.

Figure 58:
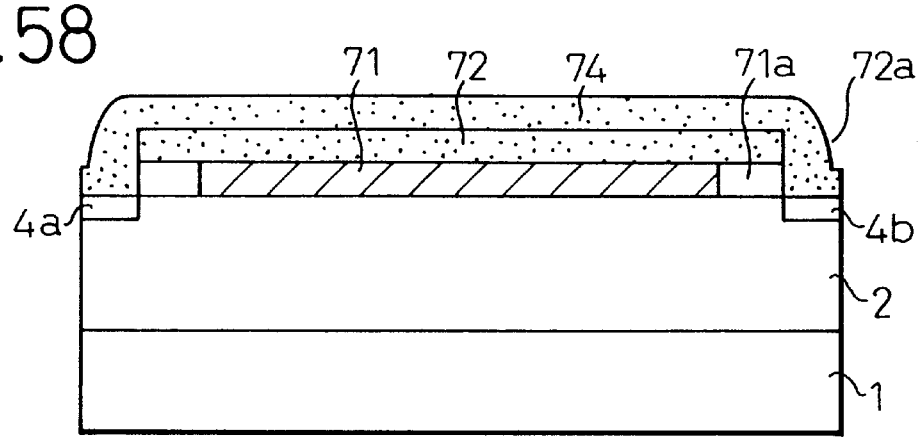

[Step shown in FIG. 58]

A TEOS oxide film 74 is formed by deposition on the total surface (wafer surface) of the silicon oxide film 72 including the openings 72a. This fills even the openings 72a with the TEOS oxide film 74. The part of the TEOS oxide film 74 which has plugged the opening 72 is formed to the same thickness on the silicon oxide film 72 only at the center portion of the opening 72, but is formed thicker than the other center sections near the edges of the opening 72. The thickness of the TEOS oxide film 74 plugging the opening 72 at a certain distance from the edges of the opening 72 is roughly equivalent at all locations.

Figure 59:
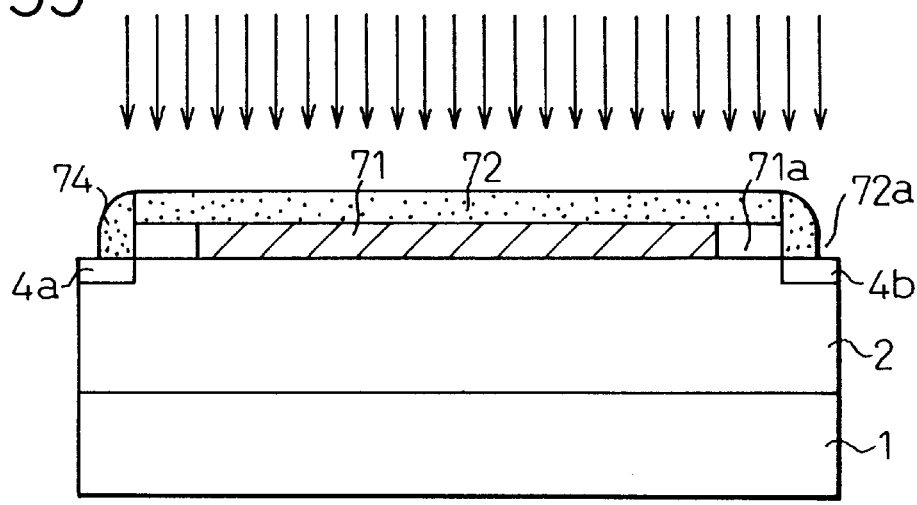

[Step shown in FIG. 59]

The TEOS oxide film 74 is etched until the TEOS oxide film 74 is eliminated from the silicon oxide film 72. Thus, since the TEOS oxide film 74 remains at the thickly formed sections (other than the center section) in the plugged openings 72a, forming an opening at the center, the opening area of each opening 72a is reduced. The thickness of the remaining TEOS oxide film 74 from the edge of the opening 72 is roughly equal at all locations.

Figure 60:
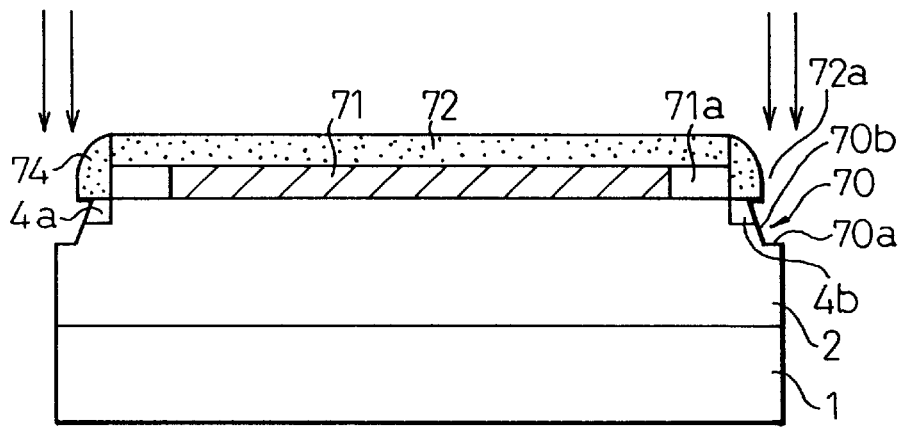

[Step shown in FIG. 60]

The silicon oxide film 72 and the TEOS oxide film 74 are used as masks for isotropic dry etching by gas containing $CF_4$. This forms a trench 70 in the $n^-$ type silicon carbide epi-layer 2 passing through the $n^+$ type source regions 4a, 4b, having a bottom 70a which is roughly parallel to the substrate surface, and side walls 70b which are tapered with respect to the substrate surface. The trench 70 is formed at roughly the center of the opening 72 and opening 71.

Figure 61:
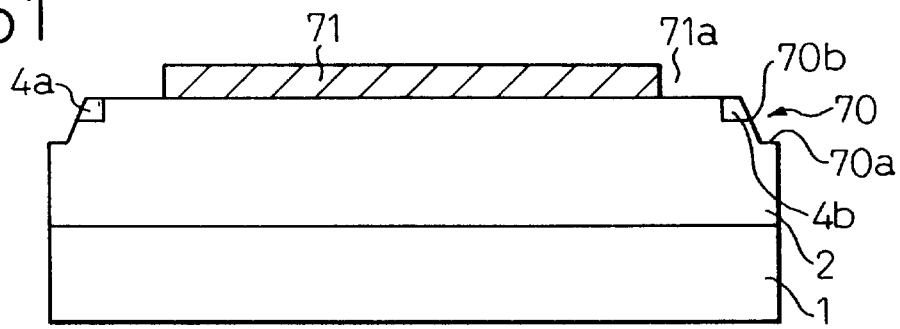

[Step shown in FIG. 61]

The silicon oxide film 72 and TEOS oxide film 74 are removed to expose the polysilicon film 71.

Figure 62:
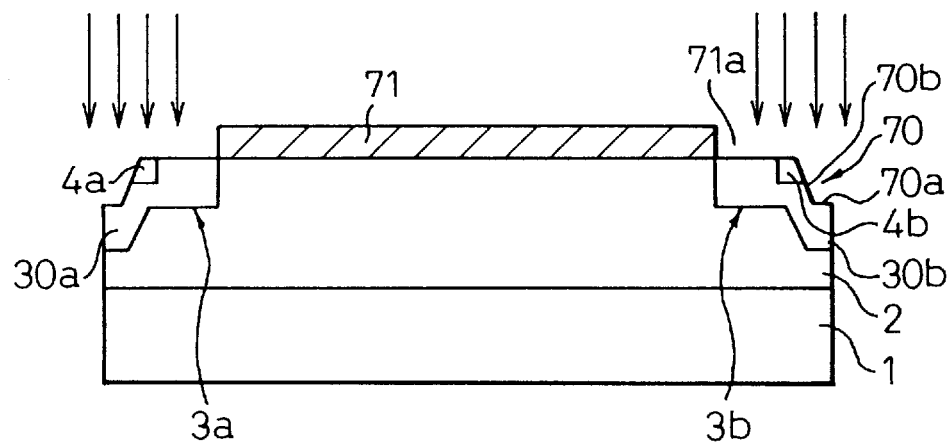

[Step shown in FIG. 62]

The polysilicon film 71 is used as a mask for ion implantation of a p-type impurity (for example, boron or aluminum). The ion implantation depth is constant here, but because of the trench 70 formed in the $n^-$ type silicon carbide epi-layer 2, the p-type impurity is ion implanted only to a depth corresponding to the degree to which the trench 70 is formed. Specifically, since the p-type impurity is implanted only to the prescribed depth from the surface of the trench 70, the p-type impurity is implanted to a partial depth by the amount of the section where the trench 70 is formed, so that the p-type impurity is implanted in a roughly parallel manner to the trench 70. Thus, $p^-$ type silicon carbide base regions 3a, 3b are formed, of which the partially deepened sections become the deep base layers 30a, 30b.

Since the distance from the edge of the opening 71a to the edge of the opening 72a is roughly equal at all locations, self-aligned formation is achieved between the $n^+$ type source regions 4a, 4b formed using the silicon oxide film 72 as the mask and the $p^-$ type silicon carbide base regions 3a, 3b formed using the polysilicon film 71 as the mask.

The polysilicon film 71 is then removed, and a surface channel layer 5 is formed by a step such as epitaxial growth to complete the vertical power MOSFET shown in FIG. 53.

The vertical power MOSFET completed in this manner has the $n^+$ type source region and the $p^-$ type silicon carbide base regions 3a, 3b formed in a self-aligned manner, thus resulting in low variation in the element characteristics.

(Eleventh embodiment)

This embodiment will be explained as a case of producing a vertical power MOSFET by a process different from the tenth embodiment. The structure of the vertical power MOSFET is identical to that shown in FIG. 53 and therefore the explanation of its structure will be omitted.

The process may comprise a step of laminating in order first, second and third mask materials (82, 83, 84) on the semiconductor layer (2), a step of forming a first opening (88) through the first to third mask materials, a step of using the first to third mask materials for ion implantation through the first opening to form source regions (4a, 4b) of a first conductivity type, a step of accumulating a fourth mask material (86) on the third mask material which contains the first opening, a step of anisotropic etching back the fourth mask material until the third mask material is exposed, leaving the third mask material within the first opening, a step of etching using the third mask material and fourth mask material as masks to form a trench (80) passing through the source regions and reaching to the semiconductor layer, a step of removing the third mask material and the second mask material, a step of using the second mask material as a mask to form a second opening (89) in the first mask material which is larger than the first opening, a step of removing the second mask material, and a step of using the first mask material as a mask for ion implantation through the second opening to form base regions (3a, 3b) of a second conductivity type in prescribed regions of the semiconductor layer which include the source regions and the trench. By thus forming the trench with the fourth mask material in a manner which reduces the area of the first opening, it is possible to form deep base layers at precisely the centers of the source regions. Also, since a predetermined spacing is achieved between the respective edges of the first and second openings, it is possible to achieve self-aligned formation of the base regions and source regions.

Specifically, the first mask material is made of polysilicon, the second mask material is made of a silicon nitride film, the third mask material is made of an oxide film and the fourth mask material is made of an oxide film.

Also, the step of forming the base regions may be followed by a step of forming a surface channel layer (5) serving as the channel region on the base regions to connect the source regions and the semiconductor layer, as well as a gate electrode-forming step to form a gate electrode on the surface channel layer.

This allows application for an accumulation-type silicon carbide semiconductor device wherein a surface channel layer is formed.

The steps for production of a vertical MOSFET according to this embodiment will now be explained based on FIGS. 63–71. These illustrations show only the parts which differ from the production steps described above, omitting explanation of the corresponding parts.

Figure 63:
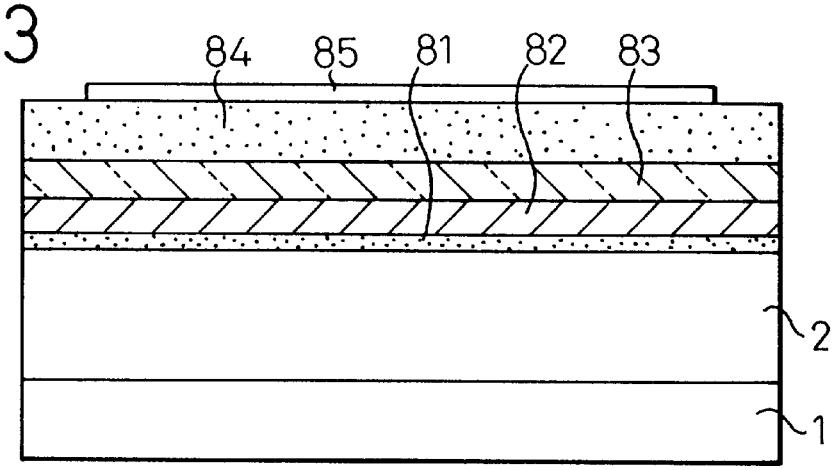
FIGS. 63–71 are cross-sectional views showing a process for producing the silicon carbide semiconductor device according to eleventh embodiment of the present invention.

[Step shown in FIG. 63]

A silicon oxide film 81, a polysilicon film 82, a silicon nitride ($Si_3N_4$) film 83 and a silicon oxide film 84 are formed to prescribed thicknesses in that order on an $n^-$ type silicon carbide epi-layer 2. Silicon oxide ($SiO_2$) is also formed as a film to a prescribed thickness. After accumulating a photoresist 65, prearranged regions are opened in the photoresist where the $n^+$ type source regions 4a, 4b are to be formed.

Figure 64:
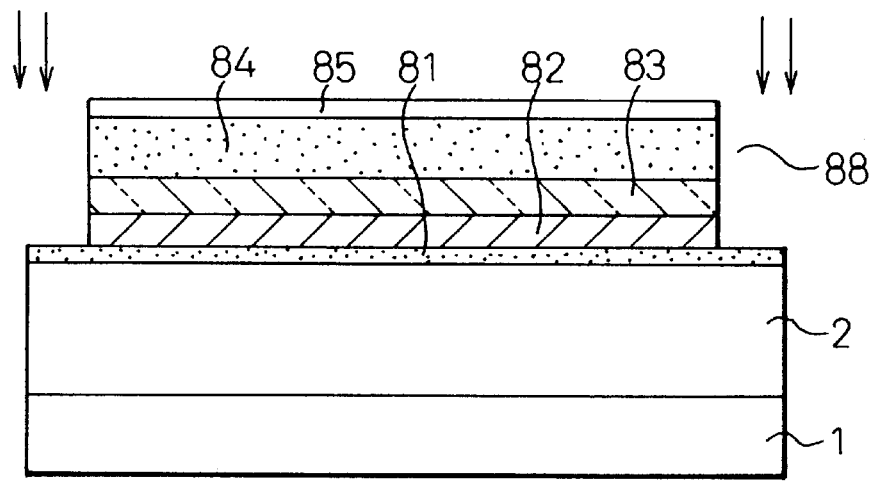

[Step shown in FIG. 64]

RIE (reactive ion etching) is used to form openings 88 at prearranged regions of the silicon oxide film 84, silicon nitride film 83 and polysilicon film 82 where the $n^+$ type source regions 4a, 4b are to be formed.

Figure 65:
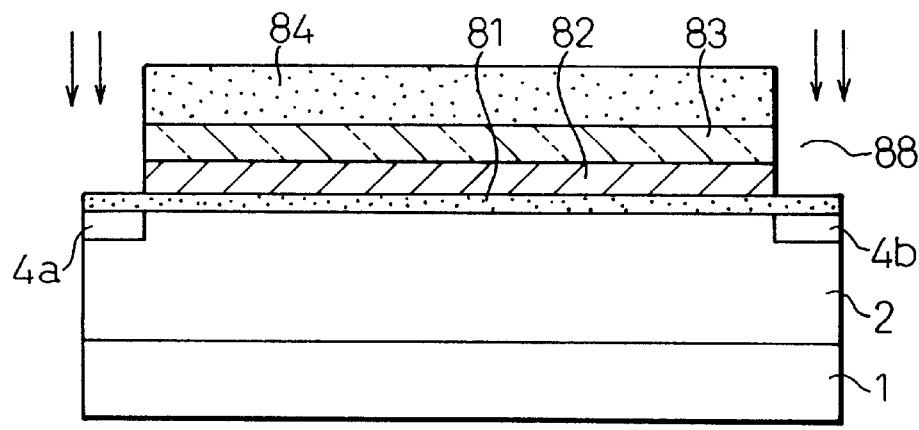

[Step shown in FIG. 65]

After removing the photoresist, the silicon oxide film 84, silicon nitride film 83, polysilicon film 82 and silicon oxide film 81 are used as masks for ion implantation to form $n^+$ type source regions 4a, 4b.

Figure 66:
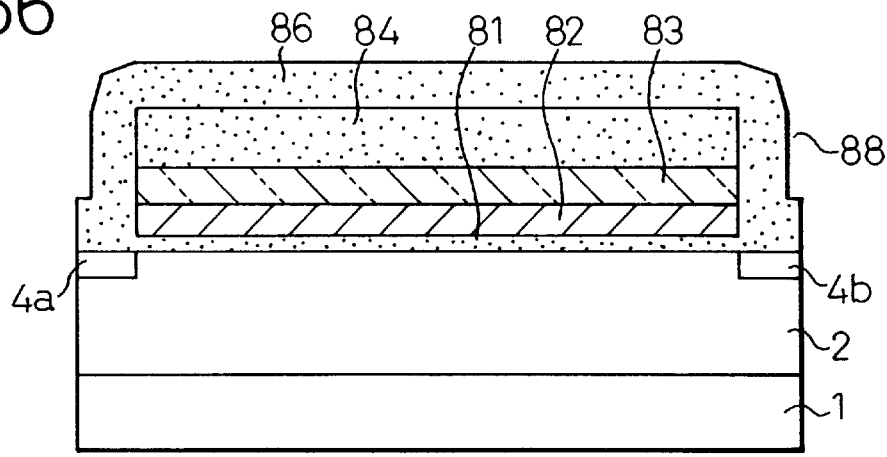

[Step shown in FIG. 66]

A TEOS oxide film 86 is formed by deposition on the total surface of the silicon oxide film 84 including the opening 88. This fills even the opening 88 with the TEOS oxide film 86. The part of the TEOS oxide film 86 which has plugged the opening 88 is formed to the same thickness on the silicon oxide film 84 only at the center portion of the opening 88, but is formed thicker than the other center sections near the edges of the opening 88. The thickness of the TEOS oxide film 86 plugging the opening 88 at a location with a certain distance from the edges of the opening 88 is roughly equivalent at all locations.

By increasing the height of the silicon oxide film 84, it is possible to gain thickness for the TEOS oxide film 86 from the edges of the opening 88.

Figure 67:
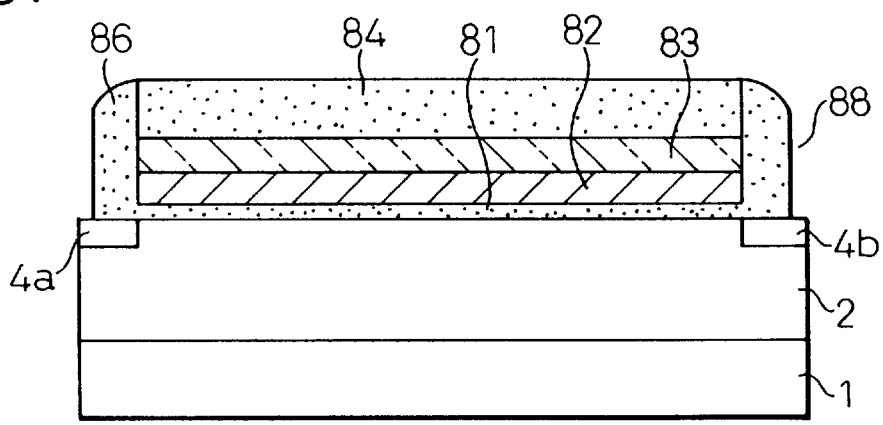

[Step shown in FIG. 67]

The TEOS oxide film 86 is etched until the TEOS oxide film 86 is eliminated from the silicon oxide film 84. Thus, the TEOS oxide film 86 remains at the thickly formed sections (other than the center section) in the plugged opening 88, and the center section is opened. The opening area of the opening 88 is thus reduced. The thickness of the remaining TEOS oxide film 86 from the edges of the opening 88 is roughly equal at all locations.

Figure 68:
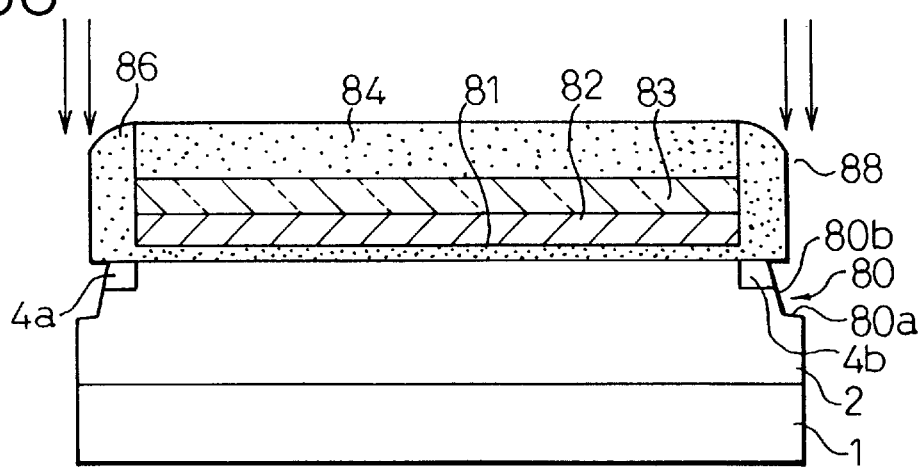

[Step shown in FIG. 68]

The silicon oxide film 84 and the TEOS oxide film 86 are used as masks for isotropic dry etching by gas containing $CF_4$. This forms a trench 80 in the $n^-$ type silicon carbide epi-layer 2 passing through the $n^+$ type source regions 4a, 4b, having a bottom 80a which is roughly parallel to the substrate surface, and side walls 80b which are tapered with respect to the substrate surface. The trench 80 is formed at roughly the center of the opening 88 and opening 89.

Figure 69:
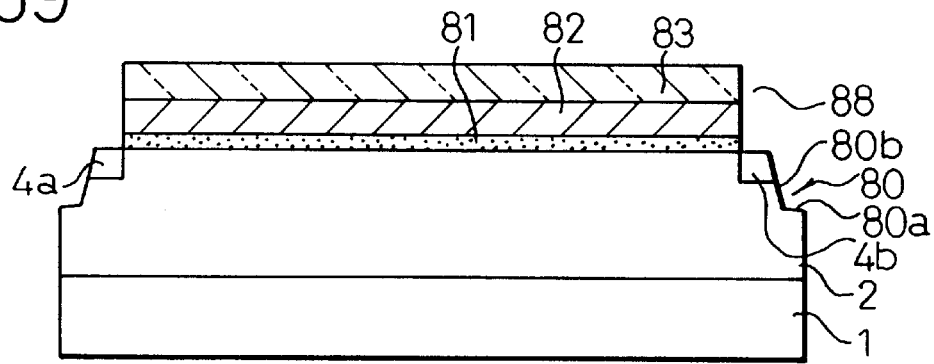

[Step shown in FIG. 69]

The silicon oxide film 84 and TEOS oxide film 80 are removed to expose the silicon nitride 83.

Figure 70:
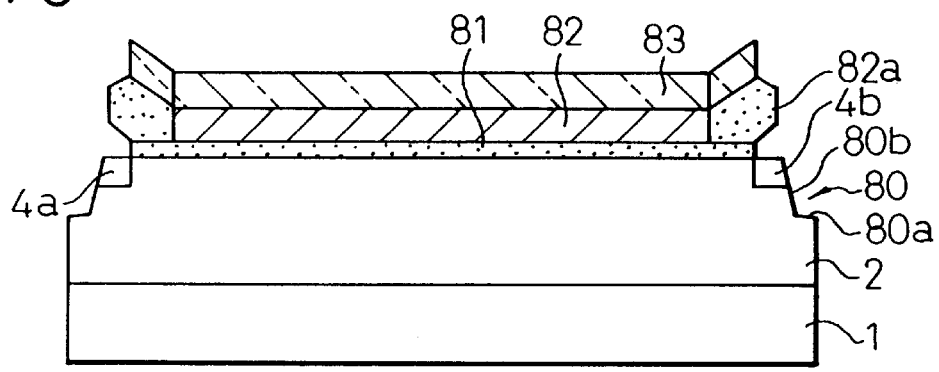

[Step shown in FIG. 70]

The silicon nitride film 83 is used as a mask for LOCOS (Local Oxidation of Silicon) oxidation to partially oxidize the polysilicon film 82. This converts the section 82a near the opening 88 to silicon oxide. The polysilicon film 82 is oxidized by the same distance in all directions from the edges of the opening 88.

Fluoric acid or the like is then used for etching removal of the oxidized sections 82a of the polysilicon film 82 and etching silicon nitride 83. This forms an opening 89 in the polysilicon film 82, which is enlarged by the prescribed amount in all directions with respect to the opening 88 for formation of the $n^+$ type source regions 4a, 4b.

Figure 71:
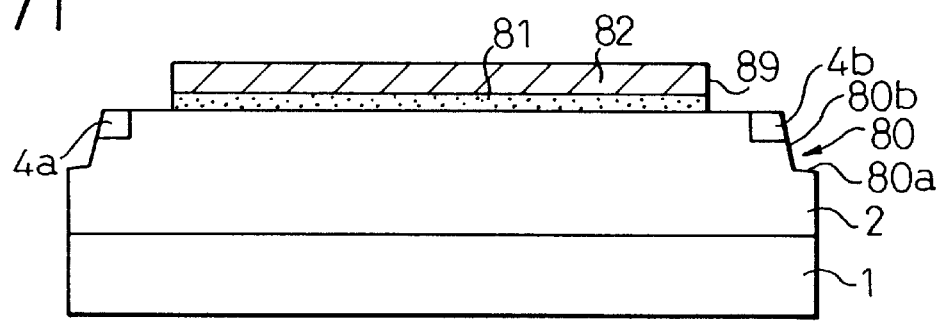

[Step shown in FIG. 71]

The polysilicon film 84 is used as a mask for ion implantation of a p-type impurity (for example, boron or aluminum). The ion implantation depth is constant here, but because of the trench 80 formed in the $n^-$ type silicon carbide epi-layer 2, the p-type impurity is ion implanted only to a depth corresponding to the degree to which the trench 80 is formed. Specifically, since the p-type impurity is implanted only to the prescribed depth from the surface of the trench 80, the p-type impurity is implanted to a partial depth by the amount of the section where the trench 80 is formed, so that the p-type impurity is implanted in a roughly parallel manner to the trench 80. Thus, $p^-$ type silicon carbide base regions 3a, 3b are formed, of which the partially deepened sections become the deep base layers 30a, 30b.

Since the distance from the edge of the opening 89 to the edge of the opening 88 is roughly equal at all locations, self-aligned formation is achieved between the $n^+$ type source regions 4a, 4b formed using the silicon oxide film 82 as the mask and the $p^-$ type silicon carbide base regions 3a, 3b formed using the polysilicon film 81 as the mask.

The polysilicon film 81 is then removed, and a surface channel layer 5 is formed by a step such as epitaxial growth to complete the vertical power MOSFET according to this embodiment.

The vertical power MOSFET completed in this manner has the $n^+$ type source regions 4a, 4b and the $p^-$ type silicon carbide base regions 3a, 3b formed in a self-aligned manner, thus resulting in low variation in the element characteristics.

(Twelfth embodiment)

According to this embodiment, a trench 90 is first formed in a prescribed region of the semiconductor layer (2), ion implantation is carried out in and around the trench to form base regions (3a, 3b, 30a, 30b) of a second conductivity type, while source regions (4a, 4b) of the first conductivity type which is of lower resistance than the semiconductor layer are formed in the surface section of the semiconductor layer in contact with the trench.

Thus, the same effect is obtained as with the eleventh embodiment even when the trench is formed before formation of the source regions and the base regions are formed afterward.

In this case, if the trench is formed together with an alignment key (96) formed by indenting the periphery of the cell region in which the gate electrode is formed, it is possible to eliminate the step required only for formation of the trench, and thus simplify the process.

This embodiment will be explained as a case of producing a vertical power MOSFET by a different process than the tenth embodiment. The structure of the vertical power MOSFET is virtually identical to that shown in FIG. 53 and therefore only the differing parts of the cross-sectional structure of the vertical power MOSFET of this embodiment shown in FIG. 72 will be explained.

Figure 72:
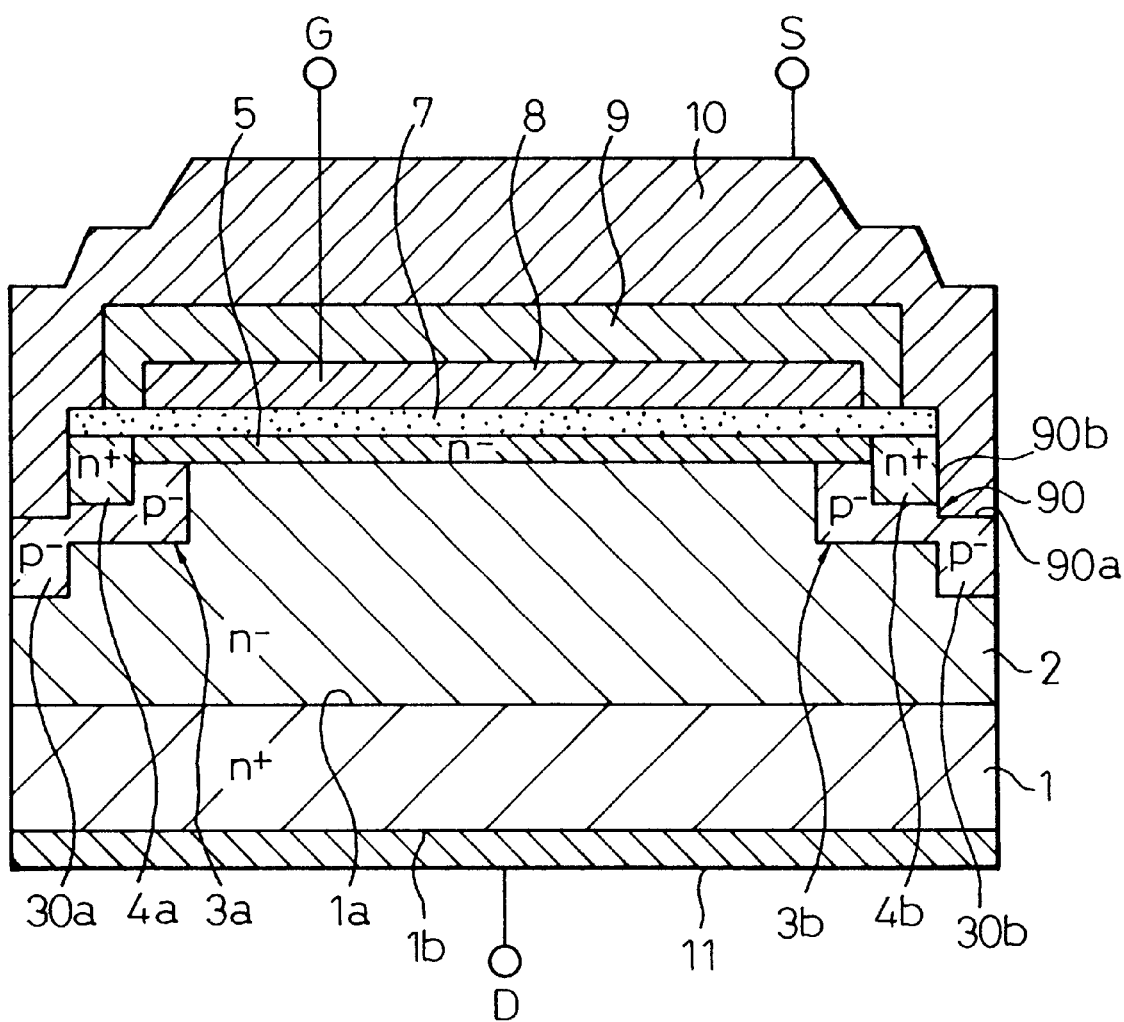
FIG. 72 is a cross-sectional view showing the structure of a silicon carbide semiconductor device according to a twelfth embodiment of the present invention.

As shown in FIG. 72, the vertical power MOSFET of this embodiment has the upper positions (surfaces) of the $n^+$ type source regions 4a, 4b at the same level as the upper position of the $n^-$ type epi-layer 5. This is because the $n^+$ type source regions 4a, 4b were formed after the $n^-$ type epi-layer 5. Thus, the $p^-$ type silicon carbide base regions 3a, 3b are thicker under the $n^+$ type source regions 4a, 4b, impeding punch through by the extended depletion layer which extends into the $p^-$ silicon carbide base regions 3a, 3b, so that blocking voltage can be improved. In this embodiment, the deep base layers 30a, 30b are formed on the base of the trench 90.

The steps for production of a vertical MOSFET according to this embodiment will now be explained based on FIGS. 73–78. These illustrations show only the parts which differ from the production steps described above, omitting explanation of the corresponding parts.

Figure 73A:
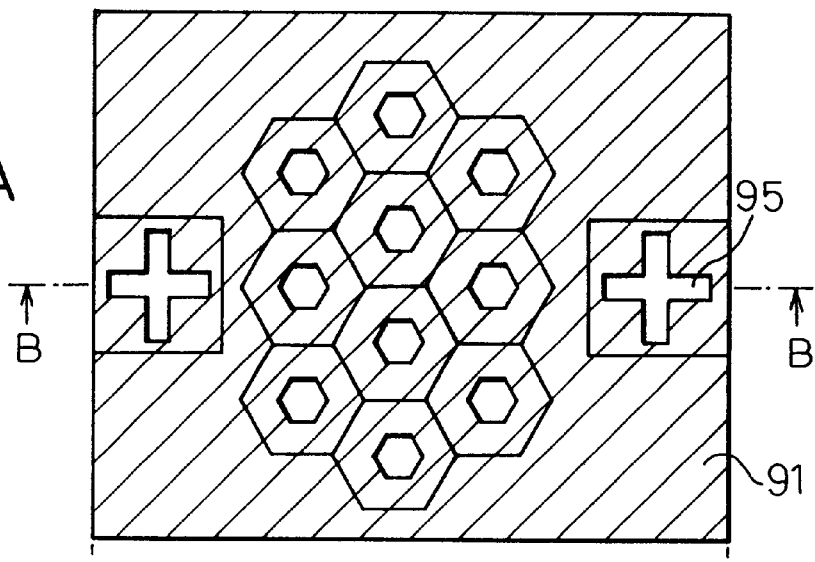
FIGS. 73A, 73B and 74–79 are cross-section and plan views showing a process for producing the silicon carbide semiconductor device according to the twelfth embodiment of the present invention, FIG. 73A being a plan view.
Figure 73B:
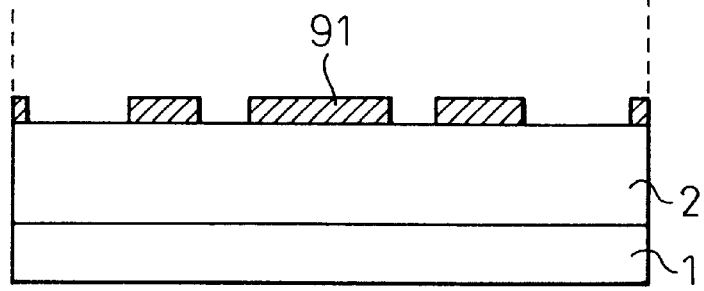

[Steps shown in FIGS. 73A and 73B]

FIGS. 73A and 73B are top views of the device. As shown in FIGS. 73A and 73B, formation of an $n^-$ type silicon carbide epi-layer 2 on an $n^+$ type silicon carbide semiconductor substrate 1 is followed by formation of an oxide film 91 as a mask on the $n^-$ type silicon carbide epi-layer 2. Also, the vertical power MOSFET has a structure wherein several hexagonally shaped MOSFET cells are assembled, and therefore each of the sections of the oxide film 91 corresponding to the trench in FIG. 72 is a hexagonal opening, as shown in FIG. 73A. Here, an alignment key is constructed by simultaneously forming cross-shaped openings 95 at positions (at left and right in the illustration) separated from the cells in the oxide film 91.

Figure 74:
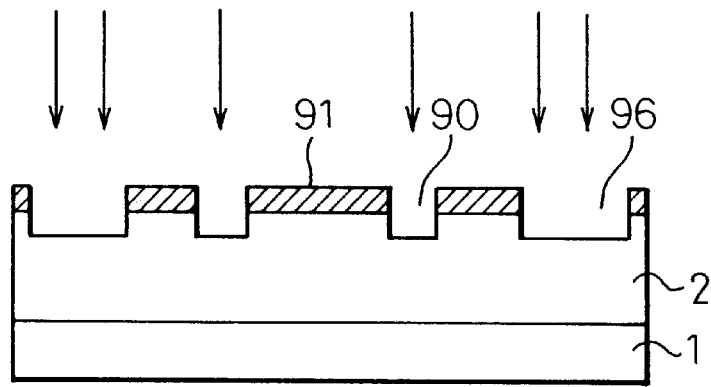

[Step shown in FIG. 74]

The oxide film 91 is used as a mask for etching. This simultaneously forms trenches 90 in the cell regions and a trench 96 as the alignment key. Thus, it is possible to simultaneously form the trenches 90 for formation of the deep base layers 30a, 30b during construction of the alignment key, and thus the step required to form the trenches 90 can be eliminated, for a more simplified process.

This illustration shows anisotropic etching of the trenches 90, 90, but isotropic dry etching with a gas containing $CF_4$ may also be used in the same manner as the tenth and eleventh embodiments to form the bottoms of the trenches roughly parallel to the substrate surface, and to form the sides in a tapered manner with respect to the substrate surface.

The alignment key portion will be omitted in the following explanation.

Figure 75:
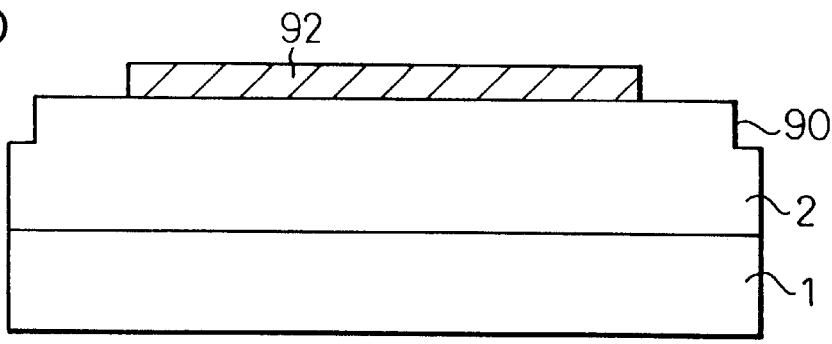

[Step shown in FIG. 75]

After removal of the oxide film 91, an oxide film 92 is again formed as a mask material over the n⁻ type silicon carbide epi-layer 2. The opening is extended in the oxide film 92 to the outer perimeter and surrounding area of the trench 90.

Figure 76:
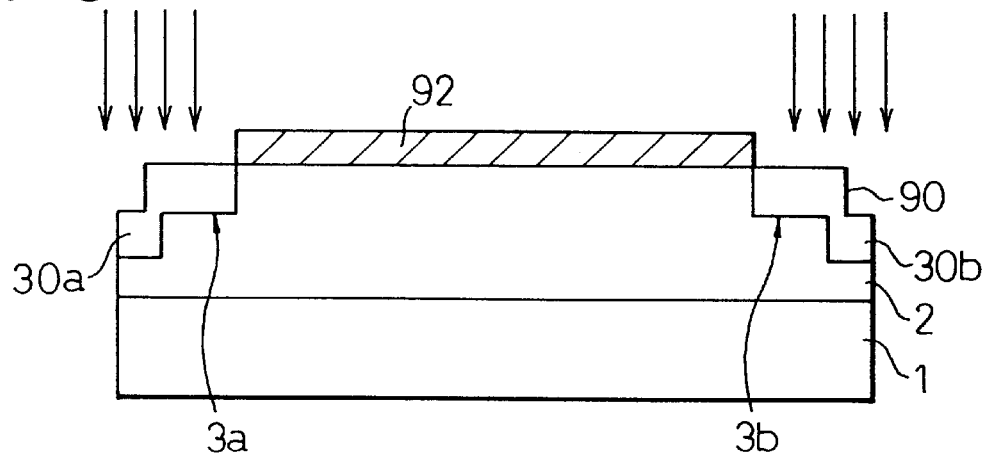

[Step shown in FIG. 76]

The oxide film 92 is used as a mask for ion implantation of a p-type impurity (for example, boron or aluminum). The ion implantation depth is constant here, but because of the trench 90 formed in the n⁻ type silicon carbide epi-layer 2, the p-type impurity is ion implanted only to a depth corresponding to degree to which the trench 90 is formed. Specifically, since the p-type impurity is implanted only to the prescribed depth from the surface of the trench 90, the p-type impurity is implanted to a partial depth by the amount of the section where the trench 90 is formed. Thus, p⁻ type silicon carbide base regions 3a, 3b are formed, of which the partially deepened sections become the deep base layers 30a, 30b.

Figure 77:
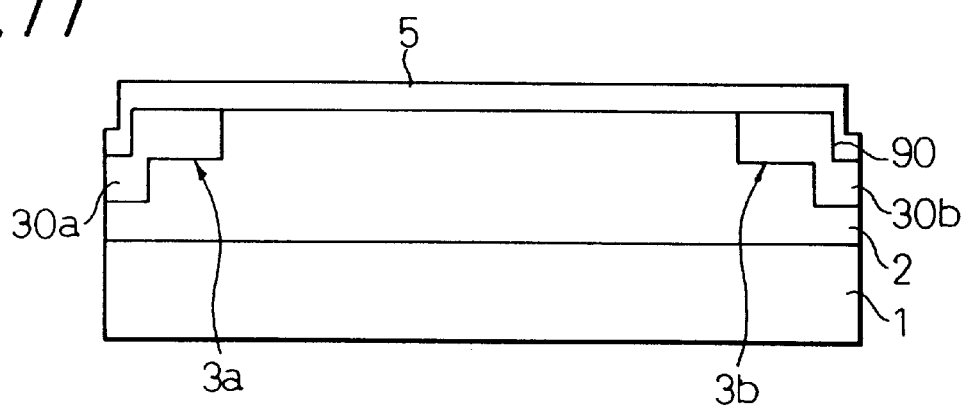

[Step shown in FIG. 77]

A surface channel layer 5 is epitaxially grown on the p⁻ type silicon carbide base regions 3a, 3b and the n⁻ type silicon carbide epi-layer 2.

Figure 78:
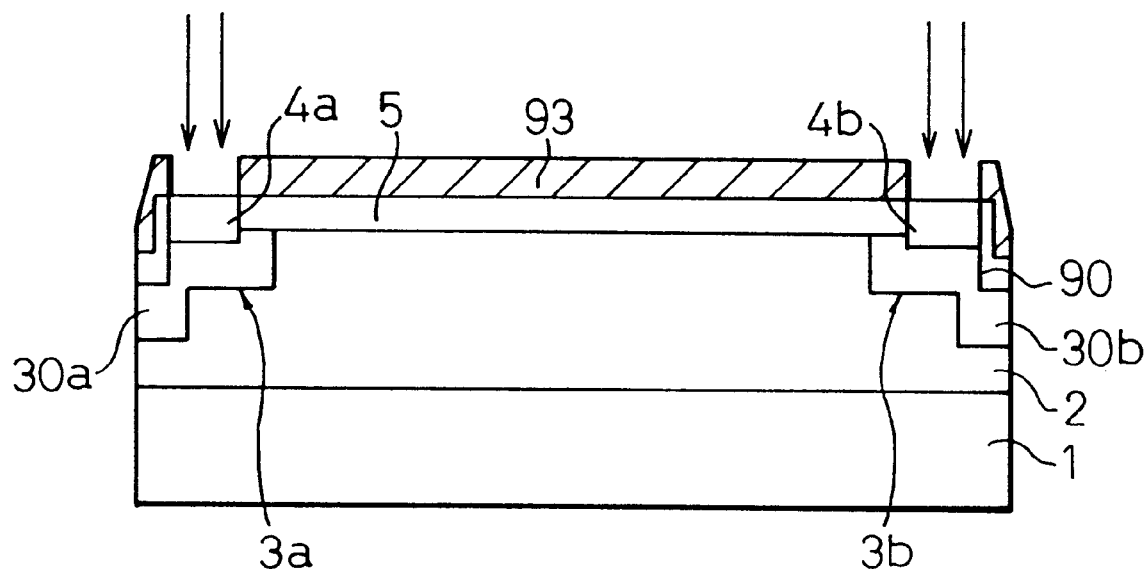

[Step shown in FIG. 78]

A silicon oxide film 93 is formed as a mask on the surface channel layer 5 while openings are made in the regions where the n⁺ type source regions 4a, 4b are to be formed in the silicon oxide film 93. The silicon oxide film 93 is also used as a mask for ion implantation of an n-type impurity to form the n⁺ type source regions 4a, 4b.

Figure 79:
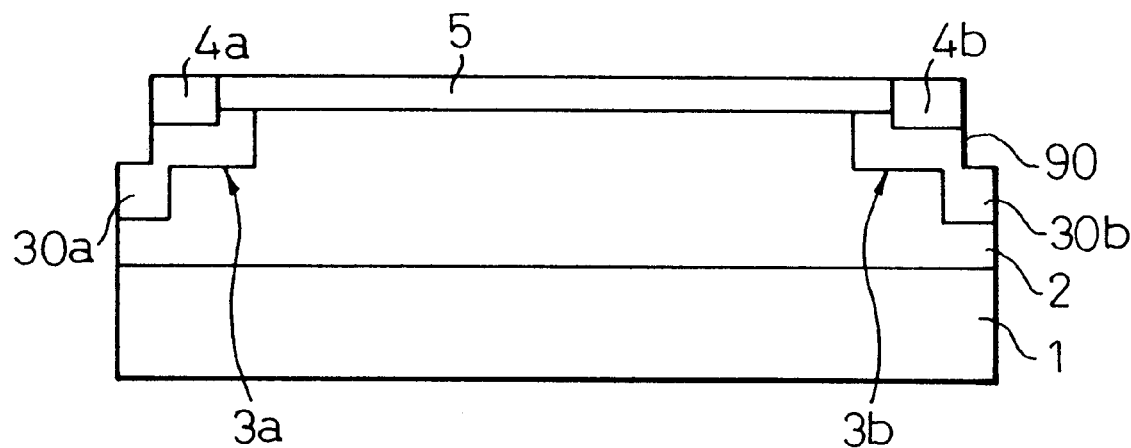

[Step shown in FIG. 79]

After etching removal of the silicon oxide film 93, the portions of the surface channel layer plugging the trench 90 are removed.

The power MOSFET shown in FIG. 72 is then completed by the steps described above.

Thus, it is possible to simultaneously form the trenches 90 for formation of the deep base layers 30a, 30b during construction of the alignment key 96.

In the tenth and eleventh embodiments, multiple film laminations were used as masks for self-aligned formation of the n⁺ type source regions 4a, 4b and the p⁻ type silicon carbide base regions 3a, 3b, but if trenches 70, 80 are first formed in the n type silicon carbide epi-layer 2 during formation of the p⁻ type silicon carbide base regions 3a, 3b and ion implantation is effected in the sections where the trenches 70, 80 are formed, then it is possible to form the deep base layers 30a, 30b with very low energy even when other methods are employed.

The deep base layers 30a, 30b can also be formed by separate steps than those for the other sections of the p⁻ type silicon carbide base regions 3a, 3b. The deep base layers 30a, 30b can also be formed to a higher density than the other sections of the p⁻ type silicon carbide base regions 3a, 3b.

Crystal forms of silicon carbide are conventionally expressed with bars over the relevant numerals, but for the embodiments throughout this specification, the symbol "−" will be attached after the relevant numeral instead of a bar over it, due to limitations of the means of expression.

(Thirteenth Embodiment of the Invention)

Figure 80:
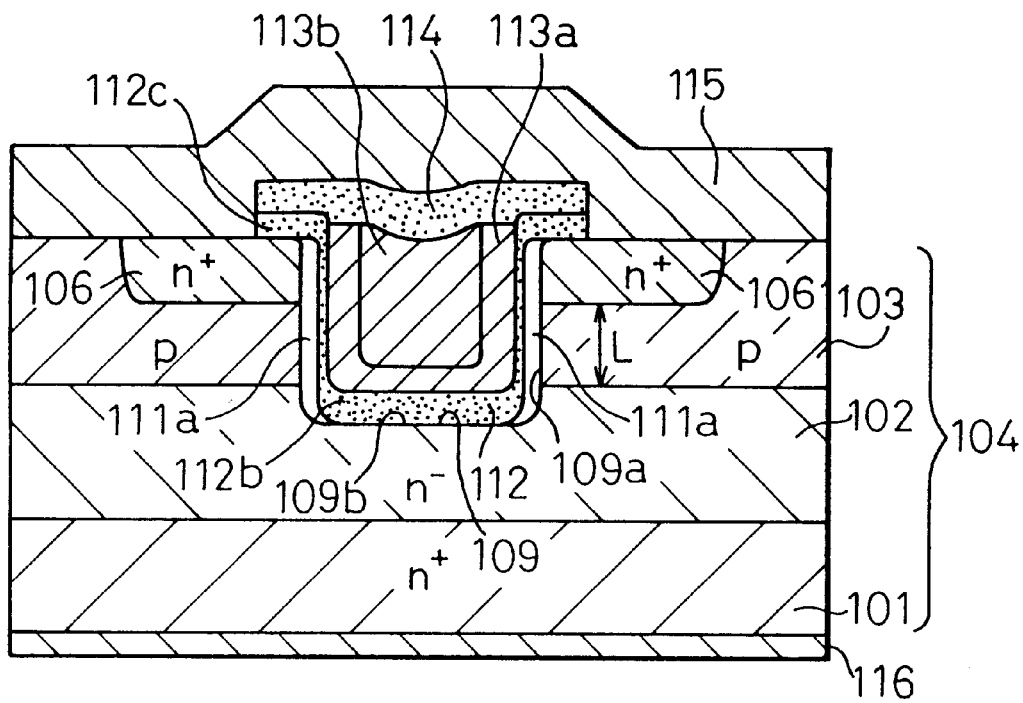
FIG. 80 is a cross-sectional view showing the structure of a silicon carbide semiconductor device according to a thirteenth embodiment of the present invention.

FIG. 80 is a cross-sectional view of an n channel type, trench gate type power MOSFET (vertical power MOSFET) according to one embodiment of the present invention.

An n⁺ type single crystal silicon carbide semiconductor substrate 101 as a low-resistance semiconductor layer is formed of silicon carbide of a hexagonal system. An n⁻ type silicon carbide semiconductor layer 102 as a high-resistance semiconductor layer and a p type silicon carbide semiconductor layer 103 are successively laminated on the n⁺ type silicon carbide semiconductor substrate 101.

Thus, a semiconductor substrate 104 of single crystal silicon carbide comprises an n⁺ type silicon carbide semiconductor substrate 101, an n⁻ type silicon carbide semiconductor layer 102 and a p type silicon carbide semiconductor layer 103, and the upper surface thereof has a carbon face with a substantially (0001) face orientation.

An n⁺ type source region 106 is provided in a predetermined region in the surface layer portion of the p type silicon carbide semiconductor layer 103. Further, a trench 109 is provided in a predetermined position of the n⁺ type source region 106. This trench 109 extends through the n⁺ type source region 106 and the p type silicon carbide semiconductor layer 103 into the n⁻ type silicon carbide semiconductor layer 102. The trench 109 has a side face 109a perpendicular to the surface of the semiconductor substrate 104 and a bottom face 109b parallel to the surface of the semiconductor substrate 104.

A thin n type silicon carbide semiconductor layer 111a is extendedly provided on the surface of the n⁺ type source region 106, the p type silicon carbide semiconductor layer 103, and the n⁻ type silicon carbide semiconductor layer 102 in the side face 109a of the trench 109. The thickness of the thin n type silicon carbide semiconductor layer 111a is about 1000 to 5000 Å. The crystalline form of the thin n type silicon carbide semiconductor layer 111a is the same as that of the p type silicon carbide semiconductor layer 103 and is, for example, 6H-SiC. It may be 4H-SiC or 3C-SiC. The impurity concentration of the thin n type silicon carbide semiconductor layer 107 is lower than that of the n⁺ type silicon carbide semiconductor substrate 101 and the n⁺ type source region 106.

Further, in the trench 109, a gate insulating layer 112 is provided on the surface of the thin n type silicon carbide semiconductor layer 111a and on the bottom face 109b of the trench 109. Gate electrode layers 113a, 113b are filled inside the gate insulating layer 112 within the trench 109. The gate electrode layers 113a, 113b are covered with an insulating layer 114. A source electrode layer 115 is provided on the surface of the n⁺ type source region 106 and on the surface of the low-resistance p type silicon carbide region 103. A drain electrode layer 116 is provided on the surface (back side of the semiconductor substrate 104) of the n⁺ type silicon carbide semiconductor substrate 101.

In the operation of the trench gate type power MOSFET, the application of a positive voltage to the gate electrode layers 113a, 113b induces an accumulation type channel in the thin n type silicon carbide semiconductor layer 111a, permitting a carrier to flow between the source electrode layer 115 and the drain electrode layer 116. That is, the thin n type silicon carbide semiconductor layer 111a serves as a channel forming region.

In this case, when the impurity concentration of the p type silicon carbide semiconductor layer 103 is regulated independently of the impurity concentration of the thin n type silicon carbide semiconductor layer 111a, a MOSFET having a high blocking voltage, a low current loss, and a low threshold value can be provided. In particular, when the impurity concentration of the thin n type silicon carbide semiconductor layer 111a, wherein the channel is formed, is low, the influence of impurity scattering at the time of flow of the carrier is reduced, increasing the channel mobility. Since the blocking voltage across the source and the drain is governed mainly by the impurity concentration and thickness of the n⁻ type silicon carbide semiconductor layer 102 and the p type silicon carbide semiconductor layer 103, the impurity concentration of the p type silicon carbide semiconductor layer 103 can be increased to shorten the distance L between the high-resistance semiconductor layer and the semiconductor region, thus enabling the channel length to be shortened while maintaining the high blocking voltage. This in turn results in markedly lowered channel resistance and lowered ON resistance across the source and the drain.

In the case of the accumulation mode wherein the channel is induced as the MOSFET operation mode, as compared with an inversion mode MOSFET wherein the conductive type is inverted to induce the channel, the MOSFET can be operated at a lower gate voltage and, at the same time, the channel mobility can be increased, realizing low threshold voltage while enjoying low current loss. When the voltage is not applied, the regulation of the source/drain current is conducted by widening the depletion layer of the pn junction formed by the p type silicon carbide semiconductor layer 103 (body layer) and the thin n type silicon carbide semiconductor layer 111a (channel forming layer). The normally OFF properties can be achieved by completely depleting the thin n type silicon carbide semiconductor layer 111a. Further, since the p type silicon carbide semiconductor layer 103 (body layer) and the n⁻ type silicon carbide semiconductor layer 102 (drift layer) form a pn junction, the blocking voltage of the device can be designed so as to be determined by the avalanche breakdown of the pn junction between the p type silicon carbide semiconductor layer 103 fixed to the source electrode and the n⁻ type silicon carbide semiconductor layer 102, enabling the breakdown voltage to be increased. Further, the leakage current between the source and the drain can be decreased even under high temperature conditions by lowering the impurity concentration of the thin n type silicon carbide semiconductor layer 111a, wherein the channel is formed, and, further, reducing the thickness thereof to about 1000 to 5000 Å.

Next, a process for producing a trench gate type MOSFET will be described with reference to FIGS. 46 to 52.

Figure 81:
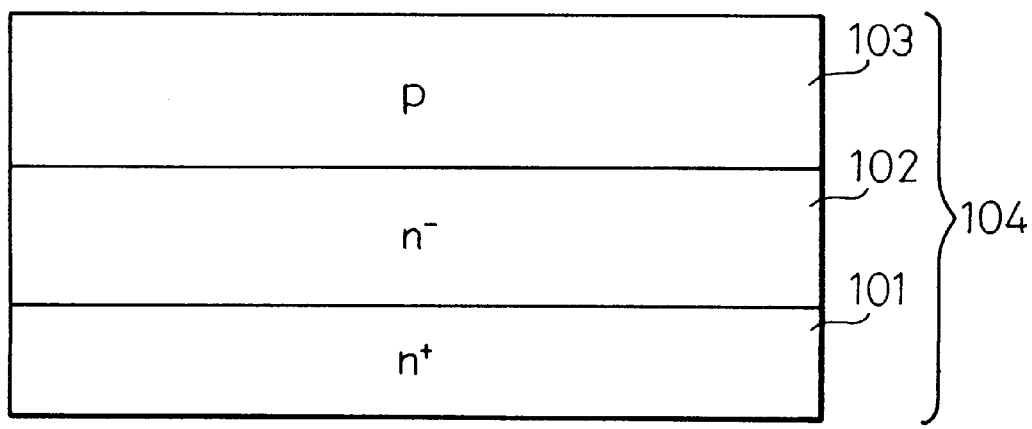
FIGS. 81 to 87 are cross-sectional views showing a process for producing the silicon carbide semiconductor device shown in FIG. 81.

At the outset, as shown in FIG. 81, an n⁺ type single crystal SiC substrate 101 is provided as a low-resistance semiconductor layer. The n⁺ type single crystal SiC substrate 101 is of hexagonal system and has a surface having a carbon face with a substantially (000$\bar{1}$) face orientation. An n⁻ type silicon carbide semiconductor layer 102 as a high-resistance semiconductor layer and a p type epitaxial layer 103 are laminated on the surface of the n⁺ type single crystal SiC substrate 101. The n⁻ type silicon carbide semiconductor layer 102 has a carrier density of about $1 \times 10^{16}$ cm$^{-3}$ and a thickness of about 10 µm. On the other hand, the p type silicon carbide semiconductor layer 103 has a carrier density of about $1 \times 10^{17}$ cm$^{-3}$ and a thickness of about 2 µm.

Thus, a semiconductor substrate 104 consisting of an n⁺ type single crystal SiC substrate 101, an n⁻ type silicon carbide semiconductor layer 102, and a p type silicon carbide semiconductor layer 103 is formed.

Figure 82:
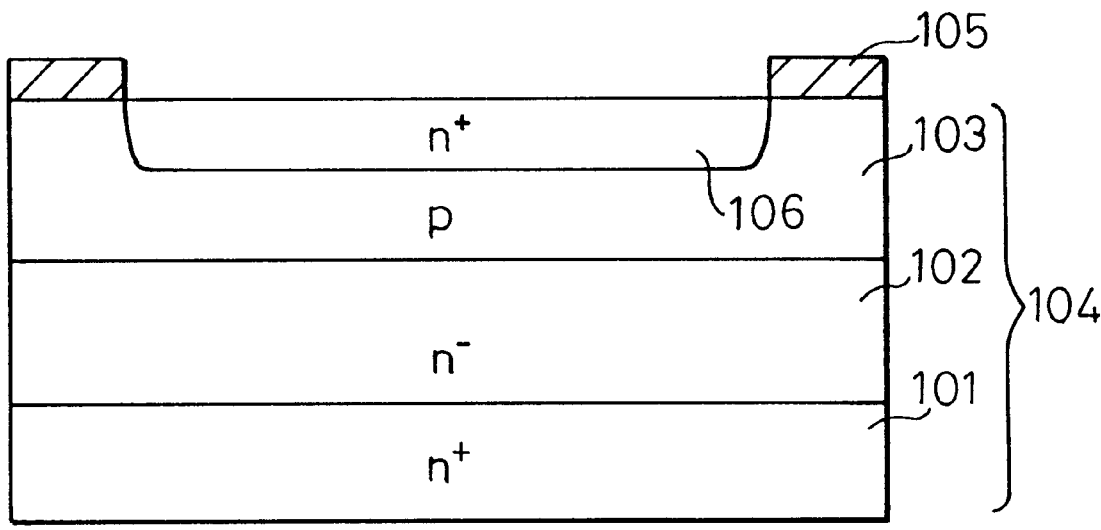

Subsequently, as shown in FIG. 82, an n⁺ source region 106 is formed in a predetermined region in the surface layer portion of the p type silicon carbide semiconductor layer 103, for example, by ion implantation using a mask 105 on the p type silicon carbide semiconductor layer 103. The n⁺ source region 106 has a surface carrier density of about $1 \times 10^{19}$ cm$^{-3}$ and a junction depth of about 0.5 µm.

In this case, since the n⁺ source region 106 is formed by ion implantation, it can be formed in any site of the p type silicon carbide semiconductor layer 103, enabling the percentage area of each surface of the p type silicon carbide semiconductor layer 103 (that is, body layer) and the source region 106 to be freely designed.

Figure 83:
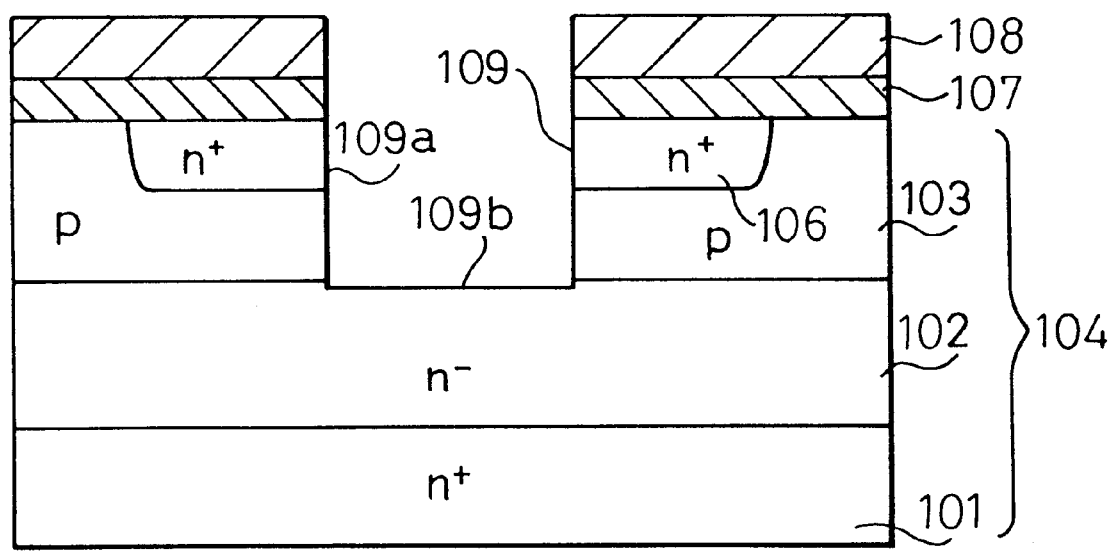

Thereafter, as shown in FIG. 83, a trench 109, which extends from the surface of the semiconductor substrate 104, through the n⁺ type source region 106 and the p type silicon carbide semiconductor layer 103 into the n⁻ type silicon carbide semiconductor layer 102, is formed by dry etching using mask materials 107, 108. The trench 109 has a width of, for example, 2 µm and a depth of, for example, 2 µm. Further, the inner wall of the trench 109 has a side face 109a and a bottom face 109b.

Figure 84:
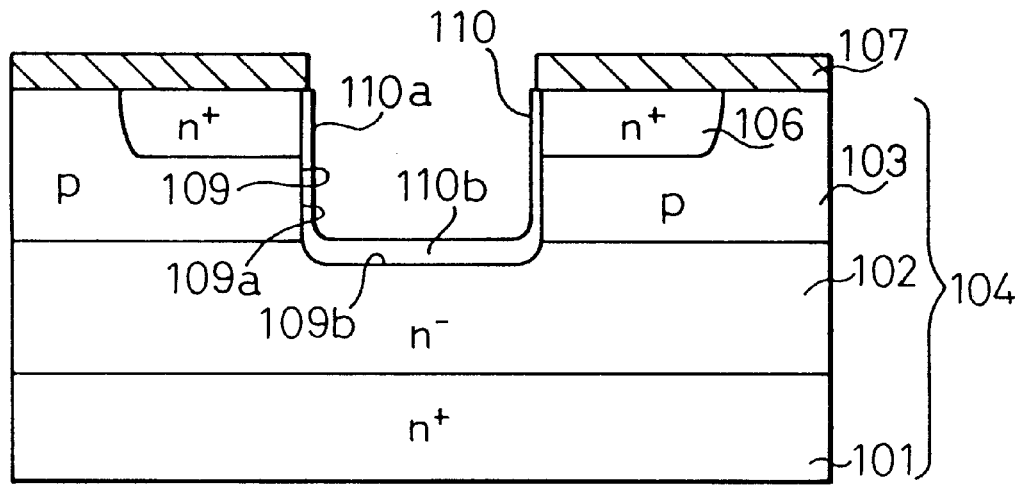

Thereafter, as shown in FIG. 84, for example, thermal oxidation at 1100° C. for, for example, about 5 hr is performed using a mask material 107 as a non-oxidizable mask, thereby forming an oxide layer 110, formed by thermal oxidation, on the inner wall of the trench 109. In this case, an about 100 nm-thick oxide layer 110a is formed on the side face 109a of the trench 109, while an about 500 nm-thick oxide layer 110b is formed on the bottom face 109b of the trench 109. Further, the oxide layer 110 and the mask material 107 are removed by etching.

Figure 85:
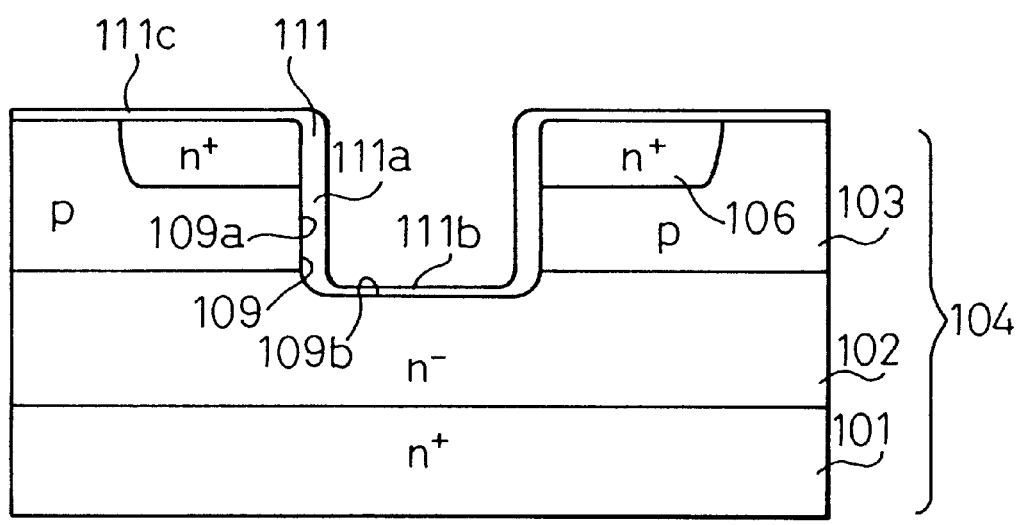

Subsequently, as shown in FIG. 85, an epitaxial layer (thin n type silicon carbide semiconductor layer) 111 is formed on the inner wall of the trench 109 and the surface of the n⁺ type source region 106 and the p type silicon carbide semiconductor layer 103 by epitaxial growth utilizing CVD. The epitaxial growth may be, for example, homoepitaxial growth wherein a thin layer 111 of 6H-SiC is grown on 6H-SiC. The epitaxial growth results in the formation of an epitaxial layer (a thin n type silicon carbide semiconductor layer) 11a having a thickness of, for example, about 100 nm on the side face 9a of the trench 109 and an epitaxial layer 111b having a thickness of, for example, about 10 nm on the bottom face 9b of the trench 109, and an epitaxial layer 111c having a thickness of about 10 nm on the surface of the substrate.

The epitaxial layer 111 is controlled to any desired impurity concentration. More specifically, in the vapor growth of silicon carbide by CVD while introducing a SiH₄ gas and C₃H₈ as starting gases, the regulation of the flow rate of the N₂ gas (or trimethylaluminum gas) permits the impurity concentration of the epitaxial layer 111 to be adjusted in the range of from $10^{15}$ to $10^{17}$/cm³. In this case, the impurity concentration can be lowered.

Figure 89:
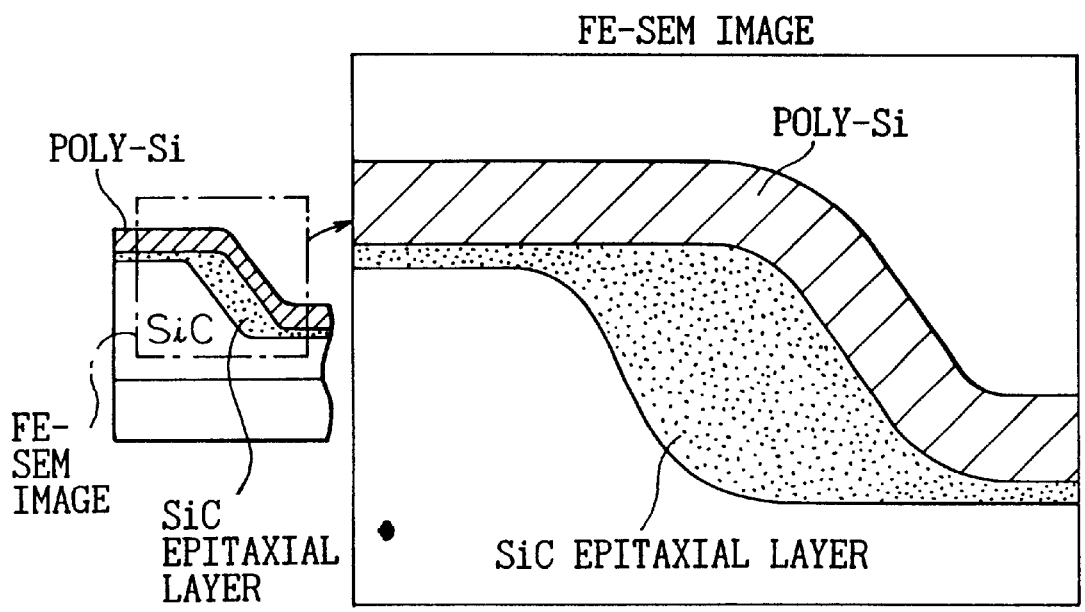
FIG. 89 is a schematic view showing the anisotropy of epitaxial growth of a silicon carbide semiconductor material.
Figure 90:
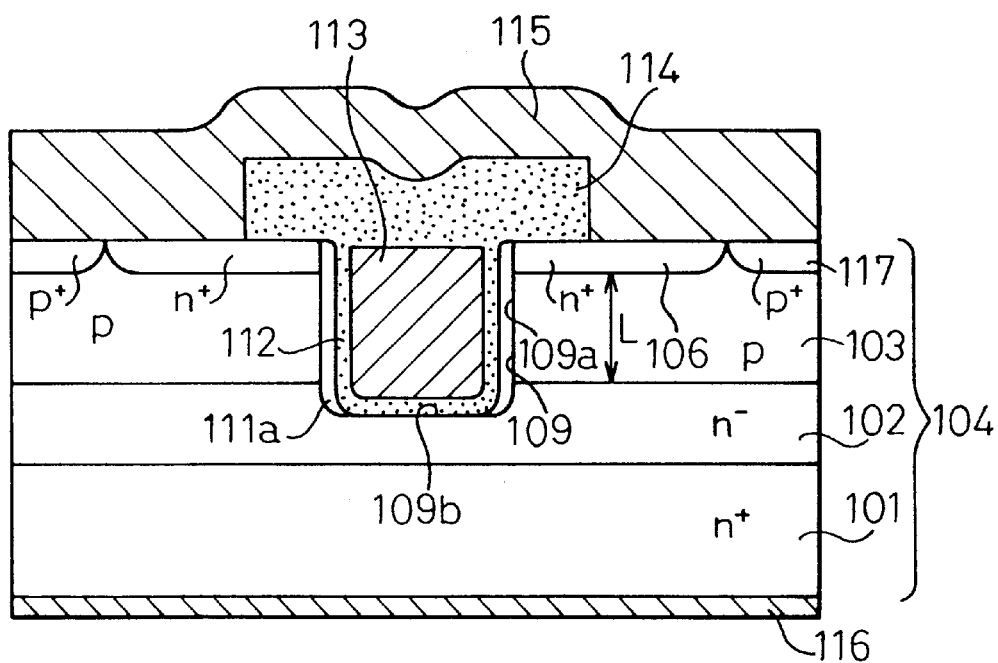
FIG. 90 is a cross-sectional view showing the structure of a silicon carbide semiconductor device according to a fourteenth embodiment of the present invention.

In this connection, an experiment has revealed that epitaxial layers 111 having different thicknesses are formed. This is shown in FIG. 89. FIG. 90 is a sketch of an FE-SEM image in a region including the side face and bottom face in the trench. A difference in the epitaxial growth rates of silicon carbide enables homoepitaxial growth to be performed on the side face of the trench so that the thickness of the homoepitaxial layer on the side face of the trench is 10 times or more larger than that of the epitaxial layer on the surface of the substrate and on the bottom face of the trench. Therefore, a device can be produced, in a high yield, which, although the epitaxial layer 111 serves as a channel forming region, can lower the voltage drop of the channel and has low loss.

As described above, the formation and removal of an oxide layer 110 (the formation and removal of a relatively thin oxide layer 110 by local anisotropic thermal oxidation) offers a trench, free from ion damage, on the inner wall of the trench 109. Therefore, the epitaxial layer 111a formed on the side face of the trench has a high quality, and the MOS interface formed in the epitaxial layer 111 is good, enabling the production of a device having excellent switching properties.

Figure 86:
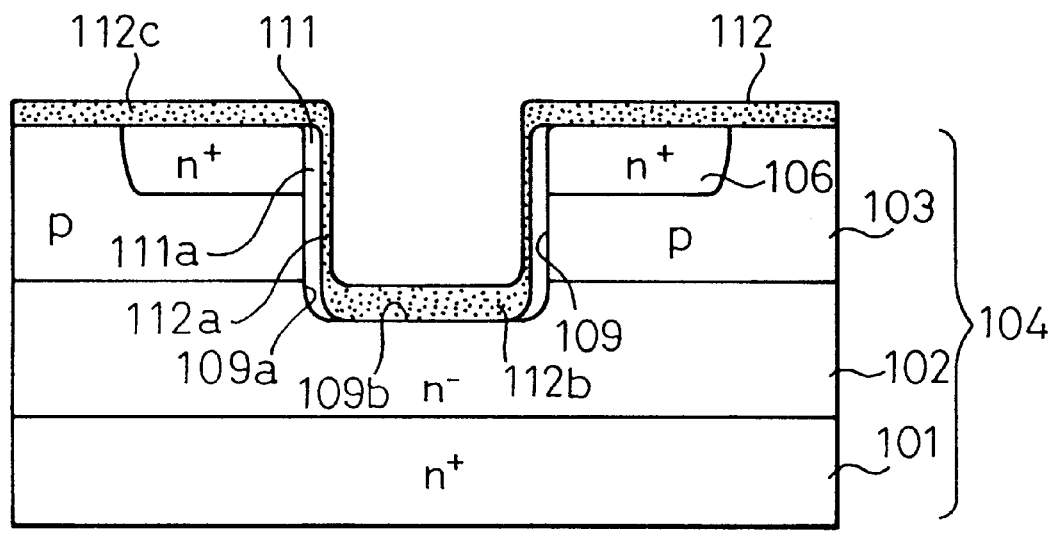

Then, as shown in FIG. 86 for example, anisotropic thermal oxidation at 1100° C. for, for example, about 5 hr is performed to form a gate oxide layer 112 on the surface of the epitaxial layer 111. In this case, an about 100 nm-thick thin gate oxide layer 112a is formed on the surface of the epitaxial layer 111a located on the side face 109a of the trench 109. On the other hand, the epitaxial layer 111b in the bottom face 109b of the trench 109 is oxidized and converted to an oxide film, thereby forming an about 500 nm-thick thick gate oxide layer 112b. Further, the epitaxial layer 111c on the n$^+$ source region 106 and on the p type silicon carbide semiconductor layer 103 is converted to an oxide layer, thereby forming an about 500 nm-thick thick gate oxide layer 112c.

In this case, an experiment has revealed that oxide layers 112 having different thickness are formed. Specifically, as shown in FIG. 89, the thickness of the oxide layer formed by thermal oxidation was measured using a silicon carbide having a carbon face with a (000$\bar{1}$) face orientation and a slanted face with a slant angle θ. As a result, the layer thickness in the face of θ=90°{(112 bar 0)face} is smaller than that in the carbon face with (000$\bar{1}$) face orientation. This anisotropic oxidation can minimize the removal of the necessary epitaxial layer 111 on the surface of the substrate and the bottom face of the trench. Therefore, the epitaxial layer 111 can be formed on only the side face by single thermal oxidation in a simple manner at a high yield, enabling a device to be produced at a low cost and a high yield.

Figure 87:
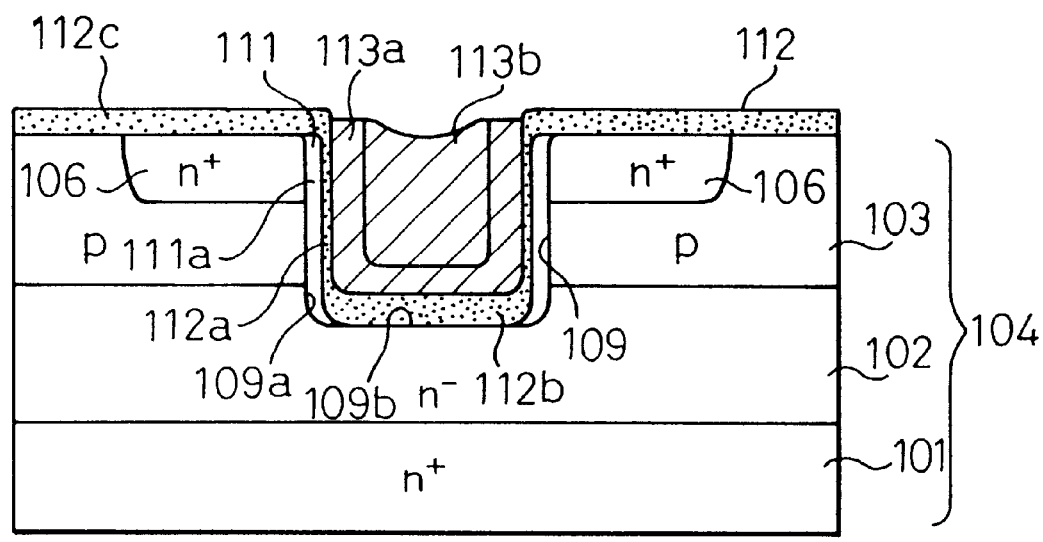
Figure 88:
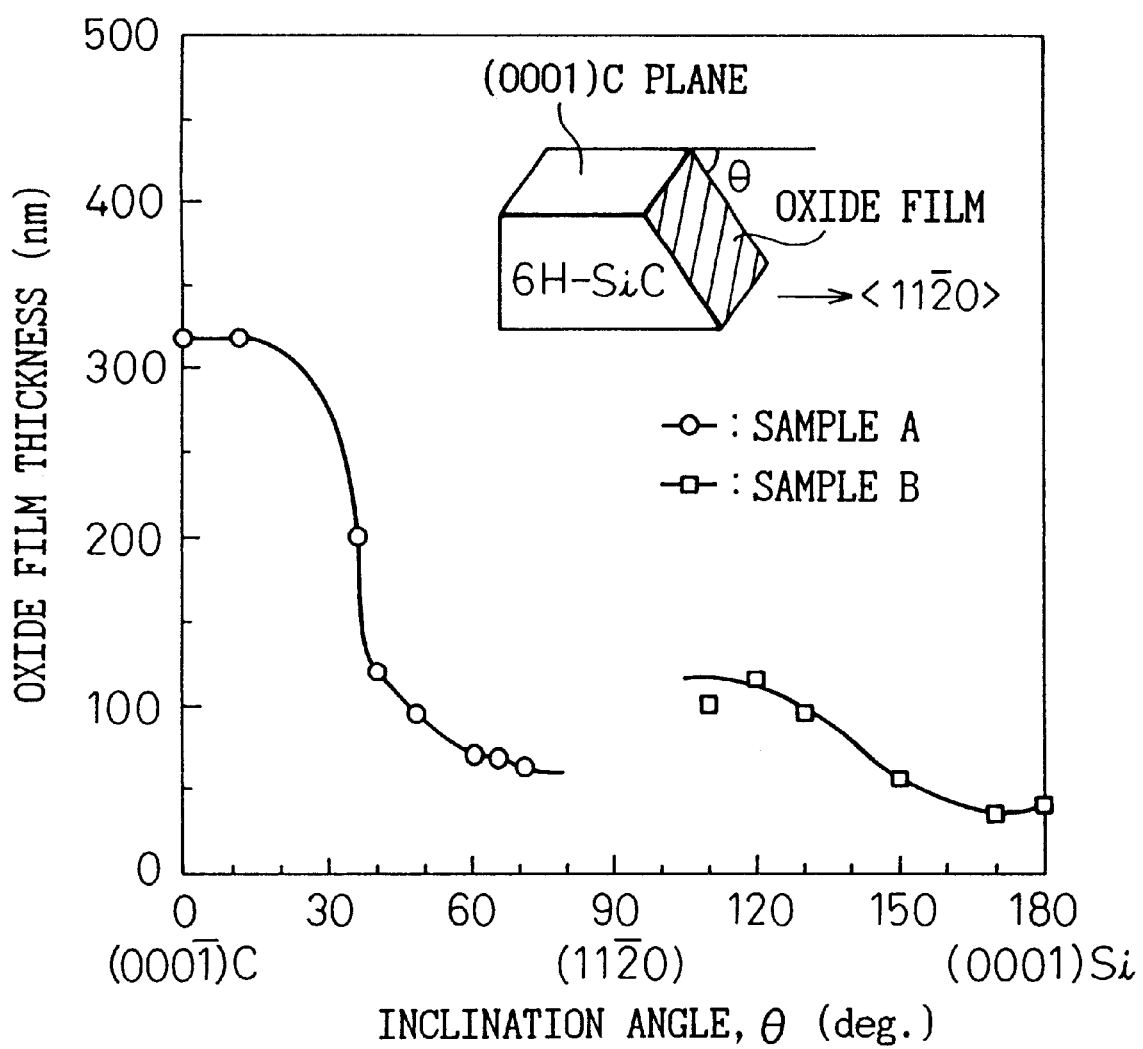
FIG. 88 is a graph showing the anisotropy of thermal oxidation of a silicon carbide semiconductor material.

Subsequently, as shown in FIG. 87, the interior of the trench 109 is filled successively with a first polysilicon layer 113a and a second polysilicon layer 113b as a gate electrode layer. Thus, the first and second polysilicon layers 113a, 113b are disposed inside the gate oxide layer 112 within the trench 109. In this case, the first and second polysilicon layers 113a, 113b may be formed on the gate oxide layer 112c on the n$^+$ source region 106.

Thereafter, as shown in FIG. 80, a layer-insulation layer 114 is formed, by CVD, on the gate oxide layer 112c, including the surface of the first and second polysilicon layers 113a, 113b. The gate oxide layer 112c and the layer-insulation layer 114 which are located on the surface of the n$^+$ type source region 106 and the p type silicon carbide semiconductor layer 103, are removed in a predetermined position where a source contact is to be provided. Thereafter, a source electrode layer 115 is formed as a first electrode on the n$^+$ type source region 106, the p type silicon carbide semiconductor layer 103, and the layer-insulation layer 114, and, further, a drain electrode layer 116 is formed as a second electrode on the back surface of the semiconductor substrate 104 (bottom surface of the n$^+$ type single crystal SiC substrate 101), thereby completing a power MOSFET.

Thus, according to the present embodiment, the impurity concentration of the epitaxial layer 111a, wherein a channel is formed using a semiconductor substrate 104 of silicon carbide, can be desirably designed independently of the concentration of an impurity in the n$^-$ type silicon carbide semiconductor layer 102 and the p type silicon carbide semiconductor layer 103. As a result, it is possible to provide a high blocking voltage and low loss power MOSFET which has a lowered drop voltage in the channel portion by virtue of suppressed impurity scattering in the channel mobility and a low threshold voltage.

Since the epitaxial layer 111a is formed within the trench 109, a semiconductor layer free from ion damage can be provided in the epitaxial layer 111a. Thus, reduced ion damage and irregularities on the channel formed face can provide a silicon carbide semiconductor device having improved MOS interface properties and excellent switching properties.

Since the silicon carbide constituting the semiconductor substrate 104 is of hexagonal system with the surface thereof having a carbon face with a substantially (0001) face orientation, the chemical reactivity of the surface is higher than that of the other faces, enabling the process temperature to be lowered and, at the same time, the process time to be shortened. Thus, an inexpensive device can be provided.

Since the epitaxial layer 111a for forming a channel has been formed by epitaxial growth, a high-quality epitaxial layer 111a can be uniformly formed on the side face of the trench 109. The epitaxial layer 111a formed by this method has a feature in that the mobility is not influenced by the impurities of the other layers and, hence, is high. Therefore, the voltage drop of the channel formed in the epitaxial layer 111a can be lowered, enabling a low-loss device to be produced. Further, anisotropic epitaxial growth in a low impurity concentration results in the formation of a channel having high mobility, reducing the drop voltage in the channel portion. Thus, a high blocking voltage and low loss power MOSFET of silicon carbide can be produced, so as to further reduce the loss, in a high yield.

Further, the formation of the trench 109 by dry etching enables the trench 109 to be finely, deeply and substantially perpendicularly formed, and increasing the surface area of the epitaxial layer 111a formed on the side face 109a of the trench 109 can increase the total channel width per unit area and lower the voltage drop of the channel portion. Thus, a device having a further reduced loss can be produced.

Since the gate electrode layer is a polysilicon film, the gate electrode layer can be formed on the inner wall of the trench in a high yield. Thus, a high blocking voltage and low loss device can be produced at a high yield.

Although only silicon carbide of hexagonal system has been described in this example, other crystal systems (for example, a cubic system) also can offer the same effect.

Further, although only the substrate having a p/n/n$^+$ structure has been described in this example, it is needless to say that the same effect can be attained by a structure wherein the n type in the semiconductor type has been replaced with the p type.

Further, as shown in FIG. 50, after the formation of an epitaxial layer 111, an oxide layer is formed by thermal oxidation to leave the epitaxial layer 111 on only the side face of the trench 109 and to dispose the oxide layer, on the inner wall of the trench 109, with the thickness thereof on the side face 109a of the trench 109 being smaller than that on the bottom face 109b. Alternatively, the thermal oxidation may be conducted in two steps, that is, a step of forming a first oxide layer which comprises, after the formation of the epitaxial layer 111, forming an oxide layer, leaving the epitaxial layer 111 on only the side face of the trench 109 and removing the oxide layer, and a step of forming a second oxide layer which comprises, after the formation of the first oxide layer forming an oxide layer on the inner wall of the trench 109 with the thickness thereof on the side face 109a being smaller than that on the bottom face 109b. In the step of forming the first oxide layer, the unnecessary second semiconductor on the surface of the substrate can be removed by single oxidation. Further, in the step of forming the second oxide layer, the oxide layer on the side face can be selectively formed thin by anisotropic thermal oxidation, with the thickness of the field oxide layer on the surface of the substrate and on the bottom face of the trench being large. Thus, a thin oxide layer can be formed only at a site where the channel is created.

The $n^+$ source region 106 may be formed on the surface of the p type silicon carbide semiconductor layer 103, without relying on ion implantation, by introducing, in the course of growth in the formation of the p type silicon carbide semiconductor layer 103, a gas containing an impurity. This enables the formation of a thick source region, and the low-resistance source region can be formed by epitaxial growth to lower the drop voltage in the source region. Thus, a device having a further lowered loss can be produced.

The formation of the source electrode layer 15 on at least the surface of the $n^+$ source region 6 suffices for the object of the present invention.

The epitaxial layer 111 shown in FIG. 86 has been formed by epitaxial growth of 6H-SiC on 6H-SiC. Alternatively, 4H-SiC or 3C-SiC may be epitaxially grown on 6H-SiC.

In the present invention, the carbon face with (000$\bar{1}$) face orientation includes a carbon face with (0001) face orientation which is a crystallographically symmetrical face.

(Fourteenth Embodiment of the Invention)

FIG. 90 shows a cross-sectional view of a power MOSFET of silicon carbide according to the ninth embodiment of the present invention. According to this embodiment, the trench 109 is filled with the gate electrode layer 113 in a single step. Further, a low-resistance p type silicon carbide region 117 for improving the contact with the source electrode layer 115 is formed in a different predetermined region in the surface layer portion of the p type silicon carbide semiconductor layer 103, for example, by ion implantation of aluminum.

Besides the above constructions, for example, the material for the $n^+$ type source region 106 may be different from that for the source electrode layer 115 formed in the low-resistance p type silicon carbide region 117. Further, as shown in FIG. 81, the low-resistance p type silicon carbide region 117 may be omitted. In this case, the source electrode layer 115 may be formed so as to come into contact with the $n^+$ type source region 106 and the p type silicon carbide semiconductor layer 103. The formation of the source electrode layer 115 on at least the surface of the $n^+$ type source region 106 suffices for the object of the present invention.

Further, although the application to an n channel vertical MOSFET has been described above, the replacement of p type and n type with each other in FIG. 81, that is, p channel type vertical MOSFET, also can offer the same effect.

(Fifteenth Embodiment of the Invention)

Figure 91:
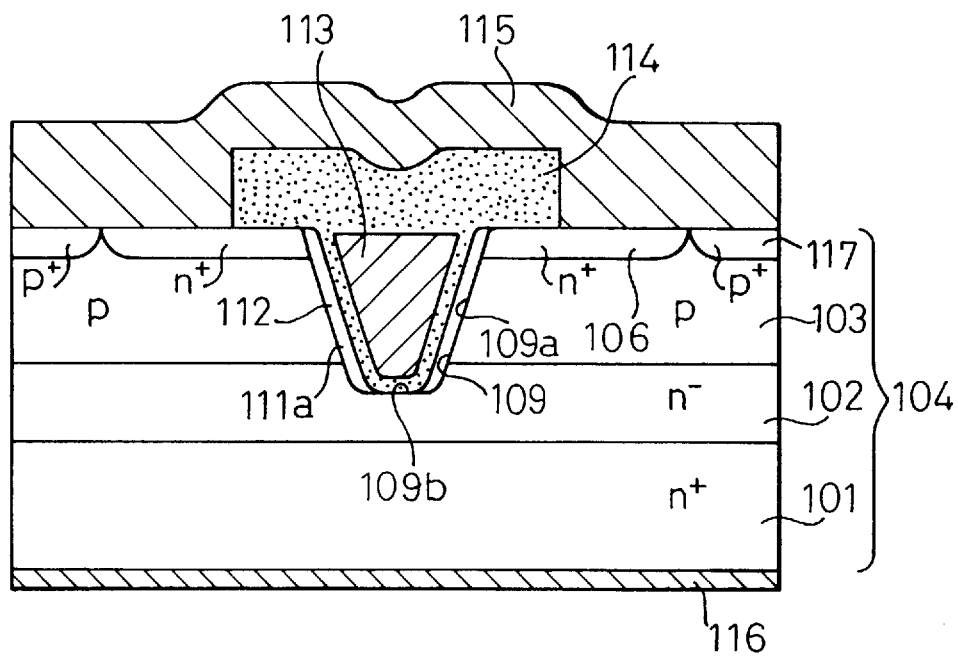
FIG. 91 is a cross-sectional view showing the structure of a silicon carbide semiconductor device according to a fifteenth embodiment of the present invention.

In FIG. 80, the angle of the side face 109a in the trench 109 to the surface of the substrate is 90°. However, as shown in FIG. 91, the angle of the side face 109a in the trench 109 to the surface of the substrate may not be necessarily 90°. Further, the trench 109 may be in a V form having no bottom face.

A better effect can be attained when the angle of the side face of the trench 109 to the surface of the substrate 104 is designed so as to provide high channel mobility.

(Sixteenth Embodiment of the Invention)

Figure 92:
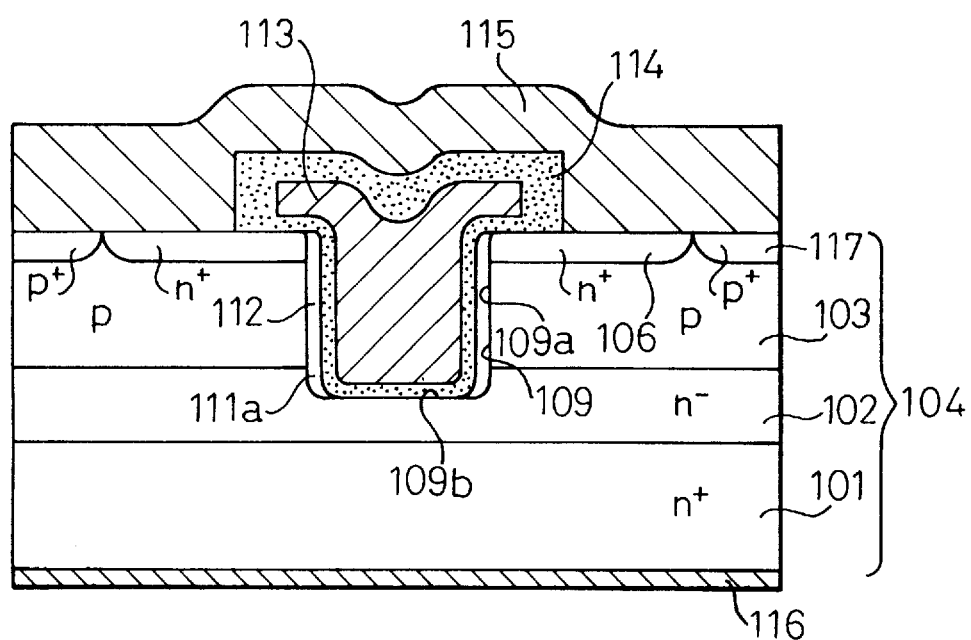
FIG. 92 is a cross-sectional view showing the structure of a silicon carbide semiconductor device according to a sixteenth embodiment of the present invention.

As shown in FIG. 92, the upper portion of the gate electrode layer 113 may be formed so as to extend on the $n^+$ type source region 106. This construction can reduce the connection resistance between the $n^+$ type source region 106 and the channel induced in the thin n type silicon carbide semiconductor layer 111a.

(Seventeenth Embodiment of the Invention)

Figure 93:
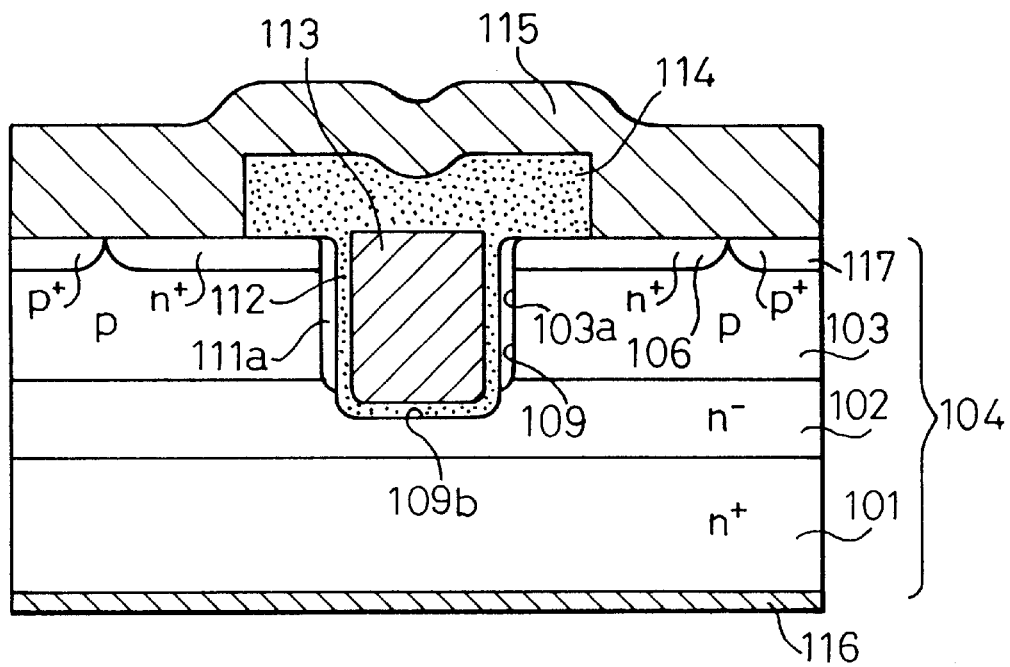
FIG. 93 is a cross-sectional view showing the structure of a silicon carbide semiconductor device according to a seventeenth embodiment of the present invention.

As shown in FIG. 93, the construction of the device may be such that the thickness of the gate insulating layer 112 is substantially identical in the central portion and the lower end of the thin n type silicon carbide semiconductor layer 111a wherein the channel is formed, and the gate electrode layer 113 extends toward a position lower than the lower end of the thin n type silicon carbide semiconductor resistance between the channel induced in the thin n type silicon carbide semiconductor layer 11a and the drain region.

(Eighteenth Embodiment of the Invention)

Figure 94:
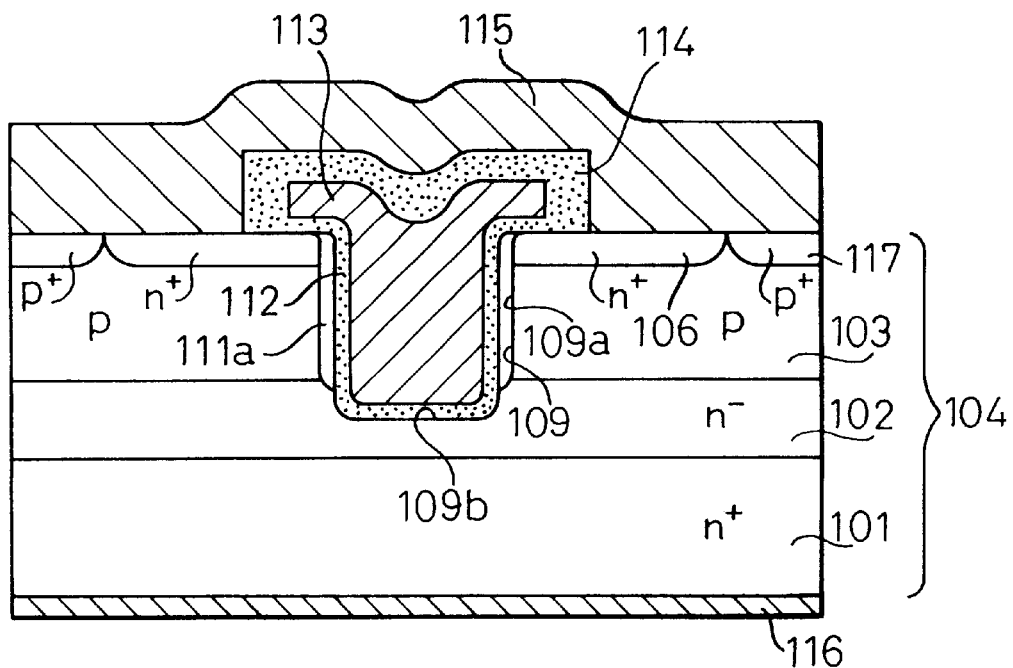
FIG. 94 is a cross-sectional view showing the structure of a silicon carbide semiconductor device according to an eighteenth embodiment of the present invention.

The construction of the device may be as shown in FIG. 94. Specifically, as shown in FIG. 92, the upper part of the gate electrode layer 113 is formed so as to extend on the $n^+$ type source region 106, and, as shown in FIG. 94, the gate electrode layer 113 extends toward a position lower than the lower end of the thin n type silicon carbide semiconductor layer 111a.

Further, the thin n type silicon carbide semiconductor layer 111a and the p type silicon carbide semiconductor layer 103 are different from each other in crystal form. For example, the p type silicon carbide semiconductor layer 103 may be formed of 6H-SiC with the thin n type silicon carbide semiconductor layer 111a being formed of 4H-SiC to increase the mobility of the carrier flow direction, thereby offering a MOSFET having a low current loss.

Further, in the above embodiments, the application to an n channel vertical MOSFET has been described. The replacement of p type and n type with each other in each embodiment that is, p channel vertical MOSFET, offers the same effect.

Modifications and variations, other than those described above fall within the scope of the present invention, unless they deviate from the subject matter of the present invention.

What is claimed is:

1. A semiconductor device comprising:
   a semiconductor substrate (1) of a first conductivity type comprising single crystal silicon carbide,
   a silicon carbide epitaxial layer (2) of the first conductivity type which is formed on the main side of the semiconductor substrate,
   a first semiconductor region (3a, 3b) formed on said silicon carbide epitaxial layer and comprising silicon carbide of a second conductivity type,
   a second semiconductor region (4a, 4b) formed on said first semiconductor region, comprising silicon carbide of the first conductivity type and separated from the silicon carbide epitaxy layer of the first conductivity type by said first semiconductor,
   a third semiconductor region (5a, 5b) formed on said semiconductor region, connected to said silicon region, comprising silicon carbide of the first conductivity type, said third semiconductor region comprising a first section (5a) on said first semiconductor region and a second section (5b) other than the first section on said epitaxial layer, said first section (5a) being of higher resistance than said semiconductor substrate (1), said second section (5b) being of lower resistance than said first section (5a), and
   a gate electrode formed on said third semiconductor region with an insulating layer therebetween, wherein said third semiconductor layer is depleted when no voltage is being applied to said gate electrode so that said semiconductor device has a normally-OFF characteristic.

2. A semiconductor device according to claim 1, wherein the normally-off characteristic of said third semiconductor layer is achieved by mutually connecting a depletion layer which extends from the gate electrode into the said third semiconductor channel layer, and a depletion layer which extends from said second semiconductor region into the said third semiconductor channel layer.

3. A semiconductor device according to claim 1, wherein said gate electrode is a polysilicon gate electrode, and a polysilicon gate electrode has a conductivity type opposite to that of said third semiconductor region.

4. A semiconductor device according to claim 1, wherein
said first semiconductor region is a silicon carbide of the second conductivity type and having a higher resistance than said silicon carbide epitaxy layer or semiconductor substrate,
said first semiconductor region is a base region formed to a predetermined depth on a predetermined region of said silicon carbide epitaxial layer,
said second semiconductor region is a source region formed on a predetermined region of the surface layer of said base region and having a shallower depth than said base region,
said third semiconductor region is a surface channel layer made of silicon carbide of the first conductivity type, having higher resistance than said semiconductor substrate and situated on the surface of said base region so as to connect said source region and said first semiconductor region, said surface channel layer being depleted when no voltage is applied to said gate electrode, to exhibit a normally OFF characteristic, and
said semiconductor device further comprises a gate insulating film formed on said surface channel layer, a gate electrode formed on said gate insulating film, a source electrode formed so as to contact said base region and said source region, and a drain electrode formed on the back side of said semiconductor substrate.

5. A semiconductor device according to claim 4, wherein the section of said surface channel layer which is situated on the surface of said silicon carbide epitaxial layer has lower resistance than said silicon carbide epitaxial layer.

6. A silicon carbide semiconductor device according to claim 1, wherein the main surface of said silicon carbide semiconductor substrate is (0001) Si face or the (1120) a face for low interface state density at the silicon carbide/insulator interface.

7. A silicon carbide semiconductor device according to claim 4, wherein the dopant concentration of said surface channel layer is no greater than the dopant concentrations of said silicon carbide epitaxial layer and said base region.

8. A silicon carbide semiconductor device according to claim 4, wherein said gate electrode has a first work function potential, said base region has a second work function potential, said surface channel layer has a third work function potential, and the first, second and third work function potentials are set so that the carrier of the first conductivity type is depleted in said surface channel layer.

9. A silicon carbide semiconductor device according to claim 8, wherein said first, second and third work function potentials are set so that the carrier of the first conductivity type is depleted in said surface channel layer when said gate electrode is at zero potential with respect to the drain region.

10. A silicon carbide semiconductor device according to claim 4, wherein said surface channel layer is formed by epitaxial growth or ion implantation.

11. A silicon carbide semiconductor device according to claim 4, wherein said surface channel layer is formed by epitaxial growth, and the crystal system/polymorph of the silicon carbide constituting said semiconductor substrate, silicon carbide epitaxial layer, base region and source region is different from that of the silicon carbide of said surface channel layer.

12. A silicon carbide semiconductor device according to claim 11, wherein the silicon carbide constituting said semiconductor substrate, silicon carbide epitaxial layer, base region and source region is of hexagonal system, while the silicon carbide of said surface channel layer is of cubic system.

13. A silicon carbide semiconductor device according to claim 4, wherein said surface channel layer is formed by epitaxial growth, and the silicon carbide constituting said semiconductor substrate, silicon carbide epitaxial layer, base region and source region is 6H-SiC while the silicon carbide of said surface channel layer is 3C-SiC.

14. A silicon carbide semiconductor device according to claim 4, wherein said surface channel layer is formed by epitaxial growth, and the silicon carbide constituting said semiconductor substrate, silicon carbide epitaxial layer, base region and source region is 6H while the silicon carbide of said surface channel layer is 3C.

15. A silicon carbide semiconductor device according to claim 4, wherein a portion of said base region is made thicker.

16. A silicon carbide semiconductor device according to claim 15, wherein the impurity concentration of the thickened section of said base region is made higher than the impurity concentration of the thinner sections.

17. A silicon carbide semiconductor device according to claim 15, wherein the thickened section of said base region is formed under said source region.

18. A silicon carbide semiconductor device according to claim 15, wherein the thickened section of said base region is formed at a location not overlapping said source region.

19. A silicon carbide semiconductor device according to claim 4, wherein said surface channel layer is overlapping a portion of said source region.

20. A silicon carbide semiconductor device according to claim 1, wherein said third semiconductor region has a concentration distribution of said second conductivity-type impurity which is lower at the top surface of said third semiconductor region close to said gate electrode than inside of said third semiconductor region.

21. A silicon carbide semiconductor device according to claim 20, wherein said concentration of said second conductivity-type impurity in said third semiconductor region gradually decreases in the depth direction toward said top surface.

22. A silicon carbide semiconductor device according to claim 21, wherein said second conductivity-type impurity is boron.

23. A silicon carbide semiconductor device according to claim 22, wherein said third semiconductor region is a surface channel layer where a first conductivity-type impurity is ion implanted.

24. A silicon carbide semiconductor device according to claim 4, wherein said base region has a recess in a portion of the top surface thereof and has a portion deeper than the other portion thereof which portion resides below said recess and extends closer to said semiconductor substrate.

25. A silicon carbide semiconductor device according to claim 24, wherein said recess is formed in contact with said source region and penetrating said source region.

26. A silicon carbide semiconductor device according to claim 24, wherein said recess has a tapered side and said deeper portions has a tapered side corresponding thereto.

27. A semiconductor device comprising:
a semiconductor substrate made of silicon carbide of a first conductivity type,
a silicon carbide epitaxial layer of the first conductivity type which is formed on the main side of the semiconductor substrate,
a first semiconductor region formed on said silicon carbide substrate and made of silicon carbide of a second conductivity type,
a second semiconductor region formed on said first semiconductor region and made of silicon carbide of the first conductivity type,
a third semiconductor region formed on said first semiconductor region, connecting said silicon carbide epitaxy layer and said second semiconductor region, made of silicon carbide of the first conductivity type said third semiconductor region comprising a fist section (5a) on said first semiconductor region and second section (5b) other than the first section on said epitaxial layer, said first section (5a) having a lower concentration than said semiconductor substrate (1), said second section (5b) being of lower resistance than said first section (5a), and
a gate electrode formed on said third semiconductor region via an insulating layer, wherein the thickness of said third semiconductor layer is a thickness (order of sub microns) such that depletion occurs when no voltage is being applied to said gate electrode.

28. A semiconductor device comprising:
a semiconductor substrate made of silicon carbide of a first conductivity type,
a silicon carbide epitaxial layer of the first conductivity type which is formed on the main side of the semiconductor substrate,
a first semiconductor region formed on said silicon carbide substrate and made of silicon carbide of a second conductivity type,
a second semiconductor region formed on said first semiconductor region and made of silicon carbide of the first conductivity type,
a third semiconductor region formed on said first semiconductor region, connecting said silicon carbide epitaxy layer and said second semiconductor region, made of silicon carbide of the first conductivity type, the third semiconductor region comprises a first section (5a) on said first semiconductor region and a second section (5b) other than the first section on said epitaxial layer, said first section (5a) having a lower concentration than said semiconductor substrate (1), said second section (5b) being of lower resistance than said first section (5a), and
a gate electrode formed on said third semiconductor region via an insulating layer, wherein the impurity concentration of the section of the surface channel layer situated on the surface section of the epitaxial layer is higher than that of the remaining section of the surface channel epilayer and silicon carbide epitaxial layer, thus lowering the ON resistance of the MOSFET.

29. A semiconductor device comprising:
a semiconductor substrate of a first conductivity type comprising single crystal silicon carbide,
a silicon carbide epitaxial layer of the first conductivity type which is formed on the main side of the semiconductor substrate,
a first semiconductor region formed on said silicon carbide epitaxial layer and comprising silicon carbide of a second conductivity type,
a second semiconductor region formed on said first semiconductor region, comprising silicon carbide of the first conductivity type and separated from the silicon carbide epitaxy layer of the first conductivity type by said first semiconductor,
a third semiconductor region formed on said semiconductor region, connected to said silicon region, comprising silicon carbide of the first conductivity type, and of higher resistance than said semiconductor substrate,
the third semiconductor region comprising a first section (5a) on said first semiconductor region and second section (5b) other than the first section on said epitaxial layer, said first section (5a) being of higher resistance than said semiconductor substrate, said second section (5b) being of lower resistance than said first section (5a), and
a gate electrode formed on said third semiconductor region with an insulating layer therebetween, wherein said third semiconductor layer is depleted when no voltage is being applied to said gate electrode so that said semiconductor device has a normally-OFF characteristic, and wherein said third semiconductor region has a impurity concentration of about $1 \times 10^{15}$ $cm^{-3}$, said third semiconductor region has a thickness of greater than zero and thinner than 0.7 $\mu$m; and said gate electrode comprises a doped polysilicon.

30. A semiconductor device comprising:
a semiconductor substrate of a first conductivity type comprising singe crystal silicon carbide
a silicon carbide epitaxial layer of the first conductivity type which is formed on the main side of the semiconductor substrate,
a first semiconductor region formed on said silicon carbide epitaxial layer and comprising silicon carbide of a second conductivity type,
a second semiconductor region formed on said first semiconductor region, comprising silicon carbide of the first conductivity type and separated from the silicon carbide epitaxy layer of the first conductivity type by said first semiconductor,
a third semiconductor region formed on said semiconductor region, connected to said silicon region, comprising silicon carbide of the first conductivity type, and of higher resistance than said semiconductor substrate,
the third semiconductor region comprising a first section (5a) on said first semiconductor region and a second section (5b) other than the first section on said epitaxial layer, said first section (5a) being of higher resistance than said semiconductor substrate, said second section (5b) being of lower resistance than said first section (5a), and
a gate electrode formed on said third semiconductor region with an insulating layer therebetween, wherein said third semiconductor layer is depleted when no voltage is being applied to said gate electrode so that said semiconductor device has normally-OFF characteristic, and wherein said third semiconductor region has an impurity concentration of about $1 \times 10^{16}$ $cm^{-3}$, said third semiconductor region has a thickness of greater than zero and thinner than 0.5 $\mu$m; and said gate electrode comprises a doped polysilicon.

31. A semiconductor device comprising:
a semiconductor substrate of a first conductivity type comprising single crystal silicon carbide
a silicon carbide epitaxial layer of the first conductivity type which is formed on the main side of the semiconductor substrate, a first semiconductor region formed on said silicon carbide epitaxial layer and comprising silicon carbide of a second conductivity type, a second semiconductor region formed on said first semiconductor region, comprising silicon carbide of the first conductivity type and separated from the silicon carbide epitaxy layer of the first conductivity type by said first semiconductor, a third semiconductor region formed on said semiconductor region, connected to said silicon region, comprising silicon carbide of the first conductivity type, and of higher resistance than said semiconductor substrate, the third semiconductor region comprising a first section (5a) on said first semiconductor region and a second section (5b) other than the first section on said epitaxial layer, said first section (5a) being of higher resistance than said semiconductor substrate, said second section (5b) being of lower resistance than said first section (5a), and a gate electrode formed on said third semiconductor region with an insulating layer therebetween, wherein said third semiconductor layer is depleted when no voltage is being applied to said gate electrode so that said semiconductor device has a normally-OFF characteristic, and wherein said third semiconductor region has an impurity concentration of about $1 \times 10^{17}$ cm$^{-3}$; said third semiconductor region has a thickness of greater than zero and thinner than 0.2 $\mu$m; and said gate electrode comprises a doped polysilicon.

32. A semiconductor device according to claim 29, 30, or 31, wherein said doped polysilicon is p-type polysilicon.

* * * * *